(12) United States Patent
Hatakeyama et al.

(10) Patent No.: US 8,192,921 B2
(45) Date of Patent: Jun. 5, 2012

(54) PATTERNING PROCESS

(75) Inventors: Jun Hatakeyama, Joetsu (JP); Takao Yoshihara, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 228 days.

(21) Appl. No.: 12/686,836

(22) Filed: Jan. 13, 2010

(65) Prior Publication Data

US 2010/0178618 A1 Jul. 15, 2010

(30) Foreign Application Priority Data

Jan. 15, 2009 (JP) ................. 2009-006574

(51) Int. Cl.
G03F 7/00 (2006.01)
G03F 7/16 (2006.01)
G03F 7/20 (2006.01)
G03F 7/40 (2006.01)

(52) U.S. Cl. ........ 430/323; 430/314; 430/325; 430/326; 430/330

(58) Field of Classification Search .................. 430/314, 430/323, 325, 326, 330
See application file for complete search history.

(56) References Cited

U.S. PATENT DOCUMENTS

| | | | |
|---|---|---|---|
| 4,775,609 A | 10/1988 | McFarland | |
| 5,399,456 A | 3/1995 | Spak et al. | |
| 6,448,420 B1 | 9/2002 | Kinsho et al. | |
| 7,163,778 B2 | 1/2007 | Hatakeyama et al. | |
| 7,202,013 B2 | 4/2007 | Ogihara et al. | |
| 7,214,743 B2 | 5/2007 | Hatakeyama et al. | |
| 7,303,785 B2 | 12/2007 | Ogihara et al. | |
| 7,303,855 B2 | 12/2007 | Hatakeyama et al. | |
| 7,358,025 B2 | 4/2008 | Hatakeyama | |
| 7,416,833 B2 | 8/2008 | Hatakeyama et al. | |
| 7,476,485 B2 | 1/2009 | Hatakeyama et al. | |
| 7,510,820 B2 | 3/2009 | Hatakeyama et al. | |
| 7,537,880 B2 | 5/2009 | Harada et al. | |
| 7,541,134 B2 | 6/2009 | Iwabuchi et al. | |
| 7,585,613 B2 | 9/2009 | Ogihara et al. | |
| 7,632,624 B2 | 12/2009 | Hatakeyama et al. | |
| 2004/0265745 A1 | 12/2004 | Sho et al. | |

(Continued)

FOREIGN PATENT DOCUMENTS

EP 0361907 A2 4/1990

(Continued)

OTHER PUBLICATIONS

B.J.Lin, "Semiconductor Foundry, Lithography and Partners", Proceedings of SPIE vol. 4690, pp. xxix.

(Continued)

*Primary Examiner* — Shean Wu
(74) *Attorney, Agent, or Firm* — Westerman, Hattori, Daniels & Adrian, LLP

(57) ABSTRACT

A pattern is formed by coating a chemically amplified positive resist composition comprising a resin comprising acid labile group-containing recurring units and a photoacid generator onto a substrate, drying to form a resist film, exposing the resist film to high-energy radiation through a phase shift mask having a lattice-like array of shifters, PEB, developing to form a positive pattern, illuminating or heating the positive pattern to eliminate acid labile groups for increasing alkaline solubility and to induce crosslinking for imparting solvent resistance, coating a reversal film, and dissolving away the positive pattern in an alkaline wet etchant to form a pattern by way of positive/negative reversal.

29 Claims, 16 Drawing Sheets

ETCHING OF PROCESSABLE SUBSTRATE

U.S. PATENT DOCUMENTS

| | | | |
|---|---|---|---|
| 2007/0134916 A1 | 6/2007 | Iwabuchi et al. | |
| 2008/0090172 A1 | 4/2008 | Hatakeyama et al. | |
| 2009/0081595 A1* | 3/2009 | Hatakeyama et al. | 430/323 |
| 2009/0286188 A1* | 11/2009 | Hatakeyama et al. | 430/323 |
| 2010/0178617 A1* | 7/2010 | Hatakeyama et al. | 430/323 |
| 2010/0203457 A1* | 8/2010 | Hatakeyama | 430/326 |
| 2011/0177462 A1* | 7/2011 | Hatakeyama et al. | 430/325 |

FOREIGN PATENT DOCUMENTS

| | | |
|---|---|---|
| JP | 64-7525 A | 1/1989 |
| JP | 1-092741 A | 4/1989 |
| JP | 1-191423 A | 8/1989 |
| JP | 2-154266 A | 6/1990 |
| JP | 6-27654 A | 2/1994 |
| JP | 2000-327633 A | 11/2000 |
| JP | 2001-092154 A | 4/2001 |
| JP | 2004-205658 A | 7/2004 |
| JP | 2004-205676 A | 7/2004 |
| JP | 2004-205685 A | 7/2004 |
| JP | 2004-310019 A | 11/2004 |
| JP | 2004-354554 A | 12/2004 |
| JP | 2005-10431 A | 1/2005 |
| JP | 2005-015779 A | 1/2005 |
| JP | 2005-018054 A | 1/2005 |
| JP | 2005-043420 A | 2/2005 |
| JP | 2005-128509 A | 5/2005 |
| JP | 2005-250434 A | 9/2005 |
| JP | 2005-352104 A | 12/2005 |
| JP | 2006-053543 A | 2/2006 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2006-293298 A | 10/2006 |
| JP | 2007-65161 A | 3/2007 |
| JP | 2007-163846 A | 6/2007 |
| JP | 2007-171895 A | 7/2007 |
| JP | 2007-199653 A | 8/2007 |
| JP | 2007-226170 A | 9/2007 |
| JP | 2007-226204 A | 9/2007 |
| JP | 2007-316282 A | 12/2007 |
| JP | 2008-026600 A | 2/2008 |
| JP | 2008-096684 A | 4/2008 |
| JP | 2008-111103 A | 5/2008 |
| JP | 2008-122932 A | 5/2008 |

OTHER PUBLICATIONS

M. Maenhoudt et al. "Double Patterning Scheme for sub-0.25 k1 Single Damascene Structures at NA=.75, λ=193nm", Optical Microlithography XVII, Proceedings of SPIE vol. 5754, 2005, p. 1508.

Hiroko Nakamura et al. "Contact Hole Formation by Multiple Exposure Technique in Ultra-low k1 Lithography", Optical Microlithography XVII, Proceedings of SPIE vol. 5377, 2004, p. 255.

Shuji Nakao et al. "0.12μm Hole Pattern Formation by KrF Lithography for Giga Bit DRAM" IEE, IEDM Tech, Digest 61, 1996, pp. 3.2.1-3.2.4.

Shuji Nakao et al. "Zero MEF Hole Formation with Atten-PSM and Modified Illumination", Optical Microlithography XVI, Proceedings of SPIE vol. 5040, 2003, pp. 1258-1268.

Soichi Owa et al. "Immersion Lithography; Its Potential Performance and Issues" Optical Microlithography XVI, Proceedings of SPIE vol. 5040, 2003, p. 724.

D.C. Owe-Yang et al. "Double Exposure for the Contact Layer of the 65-nm Node", Advances in Resist Technology and Processing XXII, Proceedings of SPIE, vol. 5753, 2005, pp. 171-180.

S. Pau et al. "High Density Lithography Using Attenuated Phase Shift Mask and Negative Resist", Optical Microlithography XVIII, Proceedings of SPIE, vol. 4000, 2000, pp. 266-270.

Masato Shibuya et al. "Performance of Resolution Enhancement Technique Using Both Multiple Exposure and Nonlinear Resist", Japan Journal of Applied Physics, 1994, vol. 33, pp. 6874-6877.

Robert Socha et al. "Extending KrF to 100nm Imaging with High-NA and Chromeless Phase Lithography Technology", Optical Microlithography XV, Proceedings SPIE, vol. 4691, 2002, pp. 446-458.

Kenny K. H. Toh et al. "Chromeless Phase-Shifted Masks: A New Approach to Phase-Shifting Masks", SPIE, vol. 1496, 10th Annual Symposium on Microlithography, 1990, pp. 27-53.

* cited by examiner

FORMATION OF PHOTORESIST FILM

EXPOSURE AND DEVELOPMENT OF PHOTORESIST FILM

ETCHING OF PROCESSABLE SUBSTRATE

FORMATION OF PHOTORESIST FILM

EXPOSURE AND HEATING OF PHOTORESIST FILM

FLOOD EXPOSURE

PATTERN REVERSAL BY DEVELOPMENT

ETCHING OF PROCESSABLE SUBSTRATE

FORMATION OF PHOTORESIST FILM

EXPOSURE AND DEVELOPMENT OF PHOTORESIST FILM

CROSSLINKING OF PHOTORESIST FILM

COATING OF SOG FILM

LIGHT ETCHING WITH CMP OR CF GAS

PATTERN REVERSAL BY OXYGEN/HYDROGEN GAS ETCHING

ETCHING OF PROCESSABLE SUBSTRATE

COATING OF
POSITIVE RESIST
MATERIAL

EXPOSURE AND
DEVELOPMENT
OF RESIST FILM

DEPROTECTION
AND CROSSLINKING
OF PATTERN

COATING OF PATTERN
REVERSAL FILM

PATTERN REVERSAL
BY DEVELOPMENT

ETCHING OF
PROCESSABLE
SUBSTRATE

40nm X+Y Image NA1.3 S-polarization
Dipole 6%HT-PSM
20J/cm²

Hole Image NA1.3 C-Cross Pole 6%HT-PSM
Using 45nm+20nm Bias Hole Mask
40J/cm$^2$ Dot Image NA1.3 C-Cross Pole 6%HT-PSM
Using 45nm+20nm Bias Hole Mask
100J/cm$^2$ Dot Image NA1.3 C-Cross Pole 6%HT-PSM
Using 40nm+10nm Bias Dot Mask
25J/cm²

Dot Image NA1.3 C-Cross Pole 6%HT-PSM
Using 40nm+10nm Bias Hole Mask
90J/cm²

Dot Image NA1.3 C-Cross Pole 6%HT-PSM
Using 39nm+10nm Bias Hole Mask
100J/cm²

PATTERNING PROCESS

CROSS-REFERENCE TO RELATED APPLICATION

This non-provisional application claims priority under 35 U.S.C. §119(a) on Patent Application No. 2009-006574 filed in Japan on Jan. 15, 2009, the entire contents of which are hereby incorporated by reference.

TECHNICAL FIELD

This invention relates to a process for forming a pattern by way of positive/negative reversal involving the steps of exposure through a lattice-like pattern mask and development to form a positive dot pattern, acid-generating and heating treatment for converting the positive pattern to be alkali soluble, coating thereon a reversal film which is slightly alkali soluble, and effecting alkaline development to dissolve away a surface portion of the reversal film and the positive pattern to form a negative pattern. More particularly, it relates to a process for forming a ultra-dense hole pattern.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690, xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of 1/100° C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE Vol. 5040, 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-width roughness (LWR) of resist coating, defect-free MoSi laminate mask, reduced aberration of reflection mirror, and the like.

The water immersion lithography using a NA 1.35 lens achieves an ultimate resolution of 40 to 38 nm as the half-pitch of a line pattern at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater and resist and protective films with a refractive index of 1.8 or greater are necessary. Among the materials with a refractive index of 1.8 or greater, the high refractive index liquid seems least available. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. Since hafnium oxide particles have high transparency and a refractive index in excess of 2 at 193 nm, it is under study to form a high refractive index liquid by dispersing the particles in water or alkane solvents. However, to increase the refractive index up to 1.8, hafnium oxide must be dispersed in water in an amount of at least 30 wt %. The resulting mixture has a very high viscosity which is incompatible with high-speed scanning. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern features. See Proc. SPIE Vol. 5754, 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 3 or more carbon atoms, in which the positive resist material is not dissolvable, in a second exposure. However, these methods using negative resist materials with low resolution entail degradation of resolution.

A method which does not involve PEB and development between first and second exposures is the simplest method with high throughput. This method involves first exposure, replacement by a mask having a shifted pattern drawn, second exposure, PEB, development and dry etching. However, the optical energy of second exposure offsets the optical energy of first exposure so that the contrast becomes zero, leading to a failure of pattern formation. If an acid generator capable of two photon absorption or a contrast enhancement layer (CEL) is used to provide nonlinear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994.

The critical issue associated with double patterning is an overlay accuracy between first and second patterns. Since the magnitude of misregistration is reflected by a variation of line size, an attempt to form 32-nm lines at an accuracy of 10%, for example, simply requires an overlay accuracy within 3.2 nm. The advanced ArF immersion lithography scanner has an overlay accuracy of the order of 8 to 6 nm for every wafer on a common exposure tool. The term "every wafer" means that the exposure tool carries out alignment relative to a resist alignment pattern which has been formed by exposure and development. Herein a significant improvement in accuracy is necessary. If first and second exposures are carried out without demounting the wafer from the chuck, the positional shift associated with chuck remounting is cancelled and the alignment accuracy is improved to the order of 5 to 4 nm. In the case of double patterning, the process of carrying out plural exposures without demounting the wafer from the chuck becomes an exposure process which can be implemented on account of the improvement in alignment accuracy. In the exposure process intended to reduce the pitch to half by utilizing a nonlinear energy distribution such as the two-photon absorption resist, continuous exposure is carried out while shifting the exposure position by ¼ of the pitch and without demounting the wafer from the chuck. The nonlinear resist or CEL which is sensitive to radiation of 193 nm wavelength has not been reported. If such a resist were developed, the double exposure process with the minimum alignment error would become practical.

In addition to the double patterning technique, the technology for forming a fine space pattern or hole pattern includes use of negative resist material, thermal flow, and RELACS as mentioned above. The negative resist material suffers from the problems that the resist material itself has a low resolution and bridges form in a fine hole pattern because the negative resist material relies on the crosslinking system. The thermal flow and RELACS methods suffer from a likelihood of variation during dimensional shrinkage by heat.

FIG. 1 illustrates a process for forming a hole pattern using a positive photoresist material. In FIG. 4A, a photoresist material is coated onto a processable substrate 101 on a substrate 100 to form a photoresist film 102. In FIG. 4B, the photoresist film 102 is exposed to light through a photomask having the desired pattern and developed to form a photoresist pattern 102a. In FIG. 4C, the processable substrate 101 is etched while using the photoresist pattern 102a as a mask.

The method of forming a negative pattern by reversal of a positive pattern is well known from the past. For example, JP-A 2-154266 and JP-A 6-27654 disclose naphthoquinone resists capable of pattern reversal. JP-A 64-7525 describes exposure of selected portions of a film to focused ion beam (FIB) for curing and flood exposure whereby the cured portions are left behind. JP-A 1-191423 and JP-A 1-92741 describe exposure of a photosensitive agent of naphthoquinone diazide to form an indene carboxylic acid, heat treatment in the presence of a base into an indene which is alkali insoluble, and flood exposure to effect positive/negative reversal. FIG. 2 illustrates this positive/negative reversal method. In FIG. 2A, a photoresist material is coated onto a processable substrate 101 on a substrate 100 to form a photoresist film 102. In FIG. 2B, the photoresist film 102 is exposed to light through a photomask having the desired pattern and heated. In FIG. 2C, the photoresist film 102 is subjected to flood exposure. FIG. 2D illustrates pattern reversal by development to form a reversed pattern film 103. In FIG. 2E, the processable substrate 101 is etched while using the reversed pattern film 103 as a mask.

As to the positive/negative reversal method including exchange of developers, attempts were made to form negative patterns by development in an organic solvent of hydroxystyrene partially protected with tert-butoxycarbonyl (t-BOC) groups, and by development with super-critical carbon dioxide.

As to the positive/negative reversal method utilizing silicon-containing materials, it is proposed to form a fine hole pattern by covering a space portion of a positive resist pattern with a silicon-containing film, effecting oxygen gas etching for etching away the positive pattern portion, thus achieving positive/negative reversal to leave a silicon-containing film pattern. See JP-A 2001-92154 and JP-A 2005-43420. FIG. 3 illustrates this positive/negative reversal method. In FIG. 3A, a photoresist material is coated onto an underlayer film 104 on a processable substrate 101 on a substrate 100 to form a photoresist film 102. In FIG. 3B, the photoresist film 102 is exposed to light through a photomask having the desired pattern and developed to form a photoresist pattern 102a. In FIG. 3C, the photoresist pattern 102a is crosslinked. In FIG. 3D, a SOG film 105 is formed on the underlayer film 104 and so as to cover the crosslinked photoresist pattern 102a. FIG. 3E illustrates light etching with CMP or CF gas until the crosslinked photoresist pattern 102a is exposed. FIG. 3F illustrates pattern reversal by oxygen or hydrogen gas etching. In FIG. 3G, the processable substrate 101 is etched while using the patterned SOG film 105a as a mask.

As compared with the line pattern, the hole pattern is difficult to reduce the feature size. In order for the prior art method to form fine holes, an attempt is made to form fine holes by under-exposure of a positive resist film combined with a hole pattern mask, resulting in the exposure margin being extremely narrowed. It is then proposed to form holes of greater size, followed by thermal flow or RELACS method to shrink the holes as developed. However, there is a problem that control accuracy becomes lower as the pattern size after development and the size after shrinkage are greater and the quantity of shrinkage is greater. It is then proposed in Proc. SPIE, Vol. 5377, 255 (2004) that a pattern of X direction lines is formed using a positive resist film and dipole illumination, the resist pattern is cured, another resist material is coated thereon again, and a pattern of Y direction lines is formed in the other resist using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in IEEE IEDM Tech. Digest 61 (1996) to form a hole pattern by exposure of a negative resist film through a Levenson phase shift mask of X direction lines combined with a Levenson phase shift mask of Y direction lines. Since the maximum resolution of ultrafine holes is determined by the bridge margin, the crosslinking negative resist film has the drawback that the threshold size is large as compared with the positive resist film.

As compared with white spots, a pattern of black spots can be formed to a fine size. As the hole size is reduced using a phase shift mask, white spots are reversed into black spots at a certain size, below which very small black spots with a high contrast are formed. It is reported in Proc. SPIE Vol. 4000, 266 (2000) to form dense fine holes by combining this concept with a negative resist film. The contrast is further improved using a halftone phase shift mask having a high transmittance of 20%, and this, combined likewise with a negative resist film, provides a mask error enhancement factor (MEEF) of 0 (see Proc. SPIE Vol. 5040, 1258 (2003)).

It is reported in Proc. SPIE Vol. 1496, 27 (1990) that a chromeless phase lithography (CPL) mask is more effective in increasing contrast than the halftone phase shift mask. The results of applications of CPL to contact hole, line-and-space, major axis dot, and two-dimensional gate pattern are reported in Proc. SPIE Vo. 4691, 446 (2002).

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the proximity bias is exaggerated. In particular, an increase of proximity bias in a hole pattern poses a serious problem. One common approach taken to suppress the proximity bias is by biasing the size of a mask pattern. Since the proximity bias varies with properties of a photoresist material, specifically dissolution contrast and acid diffusion, the proximity bias of a mask varies with the type of photoresist material. For a particular type of photoresist material, a mask having a different proximity bias must be used. This adds to the burden of mask manufacturing. Then the pack and unpack (PAU) method is proposed in Proc. SPIE Vol. 5753, 171 (2005), which involves strong super-resolution illumination of a first positive resist to resolve a dense hole pattern, coating on the first positive resist pattern a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

| Citation List | |
|---|---|
| Patent Document 1: | JP-A H02-154266 |
| Patent Document 2: | JP-A H06-027654 |
| Patent Document 3: | JP-A S64-7525 |
| Patent Document 4: | JP-A H01-191423 |
| Patent Document 5: | JP-A H01-092741 |
| Patent Document 6: | JP-A 2001-092154 |
| Patent Document 7: | JP-A 2005-043420 |
| Patent Document 8: | JP-A 2007-171895 |

-continued

Citation List

| | |
|---|---|
| Patent Document 9: | JP-A 2006-293298 |
| Non-Patent Document 1: | Proc. SPIE Vol. 4690, xxix |
| Non-Patent Document 2: | Proc. SPIE Vol. 5040, 724 |
| Non-Patent Document 3: | Proc. SPIE Vol. 5754, 1508 (2005) |
| Non-Patent Document 4: | Jpn. J. App. Phys. Vol. 33 (1994), 6874-6877, Part 1, No. 12B, December 1994 |
| Non-Patent Document 5: | Proc. SPIE Vol. 5377, 255 (2004) |
| Non-Patent Document 6: | IEEE IEDM Tech. Digest 61 (1996) |
| Non-Patent Document 7: | Proc. SPIE Vol. 4000, 266 (2000) |
| Non-Patent Document 8: | Proc. SPIE Vol. 5040, 1258 (2003) |
| Non-Patent Document 9: | Proc. SPIE Vol. 1496, 27 (1990) |
| Non-Patent Document 10: | Proc. SPIE Vol. 4691, 446 (2002) |
| Non-Patent Document 11: | Proc. SPIE Vol. 5753, 171 (2005) |

DISCLOSURE OF THE INVENTION

When it is desired to form a very fine hole pattern, the double dipole lithography using a negative resist film and masks of X and Y direction line patterns suffers from the problems that the fine pattern cannot be formed due to low resolution as compared with a positive resist film, and the throughput is reduced by two exposures involved. If a positive pattern once formed with a high resolution can be reversed into a negative pattern, the problems associated with the use of a negative resist film are overcome. If the exposure process capable of achieving through a single exposure a high resolution equivalent to the double dipole lithography is applicable, the problem of reduced throughput is overcome.

As discussed above, a variety of methods were reported for reversal into a negative pattern of a positive image obtained from a positive resist film featuring a high resolution capability. In particular, the above-cited JP-A 2005-43420 refers to an organic solvent-based composition as the silicone-based burying material for positive/negative reversal. The previous method using a water-soluble silicon resin as the reversal film-forming material has the problem that if an organic solvent-based reversal film-forming material composition is coated onto a substrate having a positive pattern formed thereon, the positive pattern can be disrupted by the organic solvent used for coating. If the resist pattern-forming resin is insolubilized against organic solvent by curing the resist resin with EB or the like to induce crosslinking between molecules of the resist resin, then an organic solvent-based reversal film-forming material composition may be utilized, enabling a choice from a wider range of materials. Where this treatment is done, however, the removal of the resist pattern at the final stage for reversal cannot resort to removal by dissolution because the positive pattern has been insolubilized. The state-of-the-art technology relies on no other means than removal by reactive dry etching. Then a selectively dry etchable material containing silicon, titanium or the like must be selected as the reversal film-forming material.

In one process, a silicon resin coated on a resist pattern is etched back with an etching gas such as fluorocarbon gas to expose the surface of the resist pattern, after which dry etching with oxygen and hydrogen gases is carried out for image reversal. For image reversal, two etching steps including etching back and etching and concomitant gas exchange are necessary. With this process, throughput is reduced.

On the other hand, JP-A 2001-92154 discloses advantageous removal of a positive pattern by wet etching. In the disclosed method, once a positive pattern is provided, an organic solvent solution of an organosilicon compound is directly (without any special treatment) coated to form a reversal film of organosilicon. The patent does not refer to the damage to the positive pattern by intermixing. The patent describes that for the preparation of an organosilicon composition, high polarity solvents (e.g., hydroxyl-bearing compounds such as propylene glycol monomethyl ether and lactic esters, esters such as PGMEA, and ketones such as acetone) may be utilized as well as low polarity solvents (e.g., toluene and cumene), although only toluene and cumene are used in Examples. The inventors made a follow-up test by using a solvent containing a high polarity solvent such as PGMEA, ethyl lactate, propylene glycol monomethyl ether or cyclohexanone as the solvent for reversal film, and coating an organosilicon solution in such a solvent onto a positive pattern which had been subjected to no particular treatment. Then the pattern became dissolved in the coating solvent, and the test failed to achieve positive/negative reversal at the required accuracy level. It was demonstrated that this method can adopt only a reversal film-forming material exhibiting a high solubility in low polarity solvents, but not reversal film-forming materials having a high concentration of polar groups featuring substrate adhesion, such as novolac resins, polyhydroxystyrene polymers, and alicyclic polymers having a high content of hydroxy groups or lactone.

When a negative resist material is used in the double dipole lithography utilizing dense X direction lines and intersecting dense Y direction lines, a highly dense hole pattern approximately equivalent to the maximum resolution of lines is obtainable. The double dipole lithography, in the case of full-field exposure, requires two exposures while exchanging two masks. When it is desired to form a logic device pattern where dense pattern regions are combined with isolated pattern regions, two double dipole illumination exposures of dense pattern and one exposure of unnecessary pattern region are necessary, totaling to three exposures. A significant loss of throughput is unavoidable.

The state-of-the-art exposure system has one mask stage and is not constructed such that exposures are effected on a single wafer while exchanging three masks. Alignment is necessary whenever the mask is exchanged. The process time includes the times of three exposures plus the times of mask exchange and concomitant alignment, leading to a significant loss of throughput.

An object of the invention, which is made to achieve an improvement under the above-described circumstances, is to provide a process for forming a pattern including using a positive resist film, single exposure to form a dense dot pattern, and positive/negative reversal of the dot pattern into a hole pattern.

The inventors have found that if a resist film of a chemically amplified positive resist composition is once exposed through a phase shift mask having a lattice-like array of shifters to form a ultra-dense dot pattern as a positive resist pattern, and the resin in the positive resist pattern is subjected to partial crosslinking treatment, then crosslinking takes place to such an extent to provide necessary organic solvent resistance while maintaining a solubility in alkaline wet etchant, and that if the foregoing steps are incorporated in the negative pattern forming process relying on positive/negative reversal, then not only conventional silicon base materials, but also organic non-silicone resins such as aromatic resins and alicyclic resins are applicable as the reversal film-forming material.

If some dot pattern regions are unnecessary, a dot pattern having dense pattern regions mixed with isolated pattern regions is obtainable by carrying out continuous exposure using a mask for shielding necessary dot pattern regions and subsequent development. Since the continuous exposure is carried out without demounting the wafer from the chuck, a dense/isolated dot pattern can be formed with minimal alignment errors. By baking at high temperature the substrate having the positive dot pattern formed thereon such that the pattern is endowed with resistance to an organic solvent to be used in the reversal film-forming composition while it maintains a solubility in an alkaline etchant, there is provided a process for forming a hole pattern by way of positive/negative reversal wherein the step of finally forming a negative image is carried out by wet etching with an alkaline etchant. Then not only silicon base materials, but also organic non-silicone resins such as aromatic resins and alicyclic resins are applicable as the reversal film-forming composition. In addition, hydroxy-bearing solvents and highly polar solvents such as esters and ketones may be used as the solvent to formulate the reversal film-forming composition. There is provided a process for forming a pattern by way of positive/negative reversal that can form a hole pattern including both dense holes and isolated holes with a wide margin.

[1] A process for forming a pattern by way of positive/negative reversal, comprising the steps of:

coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the unnecessary solvent and to form a resist film, exposing the resist film to high-energy radiation through a phase shift mask having a lattice-like array of shifters, post-exposure baking so that the acid generated by the acid generator upon exposure may act on acid labile groups in the resin for thereby effecting elimination reaction of acid labile groups in the resin in exposed areas, developing the exposed resist film with an alkaline developer to form a positive pattern, illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin may not lose a solubility in an alkaline wet etchant, for thereby endowing the positive pattern with resistance to an organic solvent used in a reversal film-forming composition, coating a reversal film-forming composition on the positive pattern-bearing substrate to form a reversal film, and dissolving away the crosslinked positive pattern using an alkaline wet etchant.

[2] The process of [1] wherein the step of developing the exposed resist film is to form a pattern of dots at intersections of the lattice-like shifter array.

[3] The process of [1] or [2] wherein the phase shift mask having a lattice-like array of shifters is a halftone phase shift mask having a transmittance of 3 to 15%.

[4] The process of any one of [1] to [3] wherein the step of exposing the resist film to high-energy radiation includes exposure of a dense pattern through a phase shift mask having a lattice-like array of shifters, and exposure for removing an unnecessary portion of the dense pattern.

[5] The process of any one of [1] to [4] wherein the exposure of a dense pattern through a phase shift mask having a lattice-like array of shifters and the exposure for removing an unnecessary portion of the dense pattern are continuously carried out on a common exposure stage without removing the substrate from the stage.

[6] The process of any one of [1] to [5] wherein in the step of illuminating or heating the positive pattern for increasing the alkaline solubility of the resin and for endowing the positive pattern with resistance to an organic solvent used in a reversal film-forming composition, the dissolution rate of the crosslinked positive pattern in an alkaline wet etchant is such that the crosslinked positive pattern exhibits an etching rate in excess of 2 nm/sec when etched with 2.38 wt % TMAH aqueous solution, the organic solvent used in the reversal film-forming composition is selected from the group consisting of propylene glycol monomethyl ether acetate, cyclohexanone, ethyl lactate, propylene glycol monomethyl ether, and heptanone, and mixtures of two or more of the foregoing, the resistance to organic solvent of the crosslinked positive pattern is such that the crosslinked positive pattern experiences a film slimming of up to 10 nm when contacted with the organic solvent for 30 seconds.

[7] The process of any one of [1] to [6] wherein said reversal film-forming composition comprises a resin comprising monomeric units of aromatic or alicyclic structure.

[8] The process of any one of [1] to [7], further comprising, between the step of coating a reversal film-forming composition on the positive pattern-bearing substrate to form a reversal film and the step of dissolving away the crosslinked positive pattern using an alkaline wet etchant, the step of removing the reversal film deposited on the crosslinked positive pattern until the positive pattern is exposed.

[9] The process of [8] wherein the step of removing the reversal film deposited on the crosslinked positive pattern includes wet etching.

[10] The process of [9] wherein the reversal film is soluble in an alkaline wet etchant, but has a dissolution rate which is slower than that of the crosslinked positive pattern after the step of endowing the positive pattern with resistance to organic solvent, the wet etching uses an alkaline wet etchant, and the step of removing the reversal film deposited on the crosslinked positive pattern and the step of dissolving away the crosslinked positive pattern are concurrently carried out.

[11] The process of [10] wherein the reversal film has a dissolution rate of 0.02 nm/sec to 2 nm/sec when etched with 2.38 wt % TMAH aqueous solution.

[12] The process of any one of [1] to [11] wherein said chemically amplified positive resist composition comprises a component capable of generating an acid in the step of heating for endowing the positive pattern with organic solvent resistance.

[13] The process of [12] wherein the component capable of generating an acid is a thermal acid generator which is added to the resist composition in addition to the photoacid generator.

[14] The process of [13] wherein the thermal acid generator has the general formula (P1a-2):

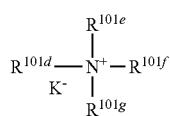

(P1a-2)

wherein K⁻ is a sulfonate having at least one α-position fluorinated, perfluoroalkylimidate or perfluoroalkylmethidate; $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

[15] The process of any one of [1] to [14] wherein in said chemically amplified positive resist composition, the resin comprises recurring units having a lactone ring and recurring units having an acid labile group which is eliminatable with acid.

[16] The process of any one of [1] to [15] wherein in said chemically amplified positive resist composition, the resin comprises an electrophilic partial structure such as an ester group or cyclic ether which will form crosslinks in the resin of the positive resist pattern.

[17] The process of [16] wherein in said chemically amplified positive resist composition, the resin comprises recurring units having a 7-oxanorbornane ring and recurring units having an acid labile group which is eliminatable with acid, and heat is applied in the step of illuminating the positive pattern to generate an acid whereby elimination of acid labile groups and crosslinking of the resin take place simultaneously in the positive pattern.

[18] The process of [17] wherein the recurring units having a 7-oxanorbornane ring are recurring units (a) having the general formula (1):

(1)

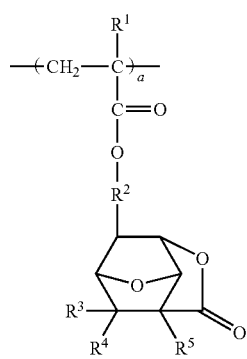

(a)

wherein $R^1$ is hydrogen or methyl, $R^2$ is a single bond or a straight, branched or cyclic $C_1$-$C_6$ alkylene group which may have an ether or ester radical, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: 0<a<1.0.

[19] The process of any one of [15] to [18] wherein the recurring units having an acid labile group which is eliminatable with acid are recurring units (b) having the general formula (2):

(2)

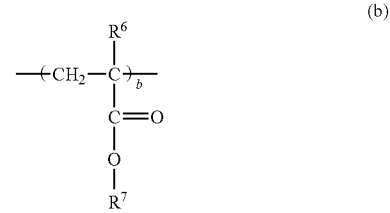

(b)

wherein $R^6$ is hydrogen or methyl, $R^7$ is an acid labile group, and b is a number in the range: 0<b≦0.8.

[20] The process of [19] wherein the acid labile group of $R^7$ is an acid labile group of alicyclic structure which is eliminatable with acid.

[21] The process of any one of [1] to [20] wherein the positive pattern comprises a dot pattern, and the pattern resulting from positive/negative reversal comprises a hole pattern.

[22] The process of any one of [1] to [21] wherein the positive pattern comprises both a dense dot pattern and an isolated dot pattern, and the pattern resulting from positive/negative reversal comprises both a dense hole pattern and an isolated hole pattern.

[23] The process of [22] wherein a dense dot pattern and an isolated dot pattern are formed as the positive pattern by exposure to a dense dot pattern and subsequent exposure to an unnecessary portion of the dot pattern, and a dense hole pattern and an isolated hole pattern are formed by positive/negative reversal therefrom.

[24] A process for forming a pattern by way of positive/negative reversal according to [1], comprising the steps of, comprising the steps of:

coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, heating to remove the unnecessary solvent to form a resist film, coating a protective film-forming composition onto the resist film and drying to form a protective film, exposing the resist film to high-energy radiation in a repeating dense pattern from a projection lens, by immersion lithography with water or a transparent liquid having a refractive index of at least 1 intervening between the resist film and the projection lens, further exposing an unnecessary region of the dense pattern or unexposed area by immersion lithography, post-exposure baking for causing the acid generated by the acid generator upon exposure to act on the acid labile groups on the resin whereby the acid labile groups on the resin in the exposed area undergo elimination reaction, and developing the exposed resist film with an alkaline developer to form a positive pattern, treating the positive pattern so as to eliminate the acid labile groups on the resin in the positive pattern resulting from the previous step, and to induce crosslinking in the resin to such an extent that the resin may not lose a solubility in an alkaline wet etchant, for thereby endowing the positive pattern with resistance to an organic solvent to be used in a reversal film-forming composition, coating a reversal film-forming composition thereon to form a reversal film, and dissolving away the positive pattern using an alkaline wet etchant.

[25] The process of [24] wherein said protective film-forming composition is based on a copolymer comprising amino-containing recurring units.

[26] The process of [24] or [25] wherein said protective film-forming composition further comprises an amine compound.

[27] The process of any one of [1] to [26], further comprising the steps of forming a carbon film having a carbon content of at least 75% by weight on the processable substrate, forming a silicon-containing intermediate film thereon, and coating a resist composition for positive/negative reversal thereon, the reversal film being formed of a hydrocarbon-based material.

[28] The process of any one of [1] to [26], further comprising the steps of forming a carbon film having a carbon content of at least 75% by weight on the processable substrate, and coating a resist composition for positive/negative reversal thereon, the reversal film being formed of a silicon-containing material.

[29] The process of [28], further comprising the steps of forming a carbon film having a carbon content of at least 75% by weight on the processable substrate, forming an organic antireflection film thereon, and coating a resist composition for positive/negative reversal thereon, the reversal film being formed of a silicon-containing material.

FIG. 5 illustrates an optical image of Y-direction lines having a pitch of 80 nm and a line size of 40 nm printed using ArF excimer laser of 193 nm wavelength, NA 1.3 lens, dipole illumination, 6% halftone phase shift mask, and s-polarization. FIG. 6 illustrates an optical image of X-direction lines having a pitch of 80 nm and a line size of 40 nm printed using ArF excimer laser of 193 nm wavelength, NA 1.3 lens, dipole illumination, 6% halftone phase shift mask, and s-polarization. A black area corresponds to a light-shielded region and a white area corresponds to an intense light region. FIG. 7 is a contrast image obtained by overlaying the optical image of X-direction lines on that of Y-direction lines. Against the expectation that a combination of X and Y lines may form a lattice-like image, weak light areas draw circular figures. As the size of a circle increases, the figure approaches to rhombus, tending to merge with adjacent figures. As the size of a circle becomes smaller, circularity is improved.

FIG. 8 illustrates a simulation of a pattern profile of a resist film on the basis of the optical image of FIG. 7. Herein, Z direction is the negative of logarithm of a dissolution rate of the resist film, reflecting the pattern profile of the resist film. It is shown that a 80-nm pitch dot pattern of the positive resist film can be formed using the double dipole lithography including two exposures of X and Y lines.

FIG. 9 is a resist profile simulation in an optical image of 45-nm half-pitch holes printed using ArF excimer laser of 193 nm wavelength, NA 1.3 lens, cross-pole illumination, 6% halftone phase shift mask, and azimuthally polarized illumination, with the mask having a mask pattern of the layout of FIG. 18 having a pitch of 90 nm and a hole size bias of +20 nm as on-wafer size. In this case, the contrast between holes is low, indicating that image formation is difficult or the margin is narrow even when an image can be formed. The hole-defining mask has a lattice-like layout wherein light is substantially shielded at intersections between gratings, which become fine black spots. FIG. 10 illustrates that when the dose of exposure through this mask is increased, black spots are formed as fine dots with a high contrast.

When dots are formed by the prior art method, a mask having a dot pattern of the layout of FIG. 17 is used. FIG. 11 illustrates an optical image using a mask of a 40 nm half-pitch dot pattern having a pitch of 80 nm and a dot size bias of +10 nm. As the pitch becomes narrower, the light-shielded rate of dots is reduced by the influence of leak light. FIG. 12 is a simulated resist pattern wherein the resist top is triangular as compared with FIGS. 8 and 10, indicating film slimming.

On use of the mask having a pattern of holes arrayed in the layout of FIG. 18 wherein fine black spots are present at intersections between gratings as shown in FIG. 13, a dot pattern with a minimized film slimming can be formed as shown in FIG. 14. The black stripes between which holes are arrayed as shown in FIG. 18 define a halftone lattice-like pattern of shifters. In a combination of cross-pole illumination capable of improving the contrast between vertical and horizontal lines with X-Y polarized illumination, intersections of the lattice where lines cross each other become black spots having a very high light-shielding capability.

In the prior art, a mask having a transparent hole pattern at the position where holes are to be opened is used. In the positive/negative reversal technology of the invention, dots are formed at intersections between lines, and a hole pattern is formed by reversal of the dot pattern. In comparing the mask for forming a hole pattern in the prior art and the method of forming dots and reversing them into holes according to the invention, the pattern of masks used is of the same lattice shape, but the position of finally formed holes is different. It is then necessary to design a mask pattern for forming a dot pattern that is completely different from the pattern used in the prior art.

When it is desired to form a hole pattern in which dense pattern regions and isolated pattern regions coexist, a size difference appears between dense holes and isolated holes, which is referred to as proximity bias. If the proximity bias becomes substantial, either one of dense and isolated patterns is no longer formed provided the exposure dose is the same. If oblique incidence illumination such as annular illumination, cross-pole illumination or dipole illumination is used, the resolution of a dense pattern is improved, but the resolution of an isolated pattern is not improved or is rather degraded, giving rise to a problem of increased proximity bias. FIG. 19 illustrates a dense dot pattern printed using the mask of FIG. 18. FIG. 20 illustrates a mask pattern for erasing an unnecessary dot pattern region. FIG. 21 illustrates an overlay of the dot-erasing mask pattern on the dense dot pattern. FIG. 22 illustrates a partially erased dot pattern (or a dot pattern with some dots erased). FIG. 23 illustrates a hole pattern resulting from positive/negative reversal of the dot pattern of FIG. 22. Exposure through the mask of FIG. 18 and exposure through the mask of FIG. 20 may be continuously carried out in a single scanner or in two serially arranged scanners. Alternatively, exposure through the mask of FIG. 18 may be followed by PEB and development to form dots in FIG. 19, after which exposure through the mask of FIG. 20 for erasing some dots and development may be carried out. Exposures through two masks on one stage of a single scanner ensure the highest accuracy of alignment because two exposures are carried out without demounting the wafer from the stage. However, two masks are necessary for exposure of one wafer. In order to carry out continuous exposures while exchanging two masks, the exposure system having two reticle stages previously aligned with the wafer stage is required.

In the process involving exposure of dense dots and exposure for erasing unnecessary dots, dots of the same size are formed by exposure of repeating dot pattern. Thus no proximity bias arises even when a random pitch dot pattern is formed by the dot-erasing exposure.

The pack and unpack (PAU) method involves coating a positive resist film, first exposure to form a dense hole pattern, coating thereon a negative resist film material in water or alcohol solvent which does not dissolve the positive resist pattern, and second exposure for erasing an unnecessary hole pattern portion. Since a dense hole pattern with uniform size is first formed, the PAU method is also devoid of proximity bias. Since the first exposure is exposure of a hole pattern, the PAU method is not improved in resolution over the conventional exposure method and only proximity bias is eliminated. In contrast, the pattern forming process of the invention is significantly improved in resolution over the conventional method of forming holes since a dot pattern is formed using a mask having a high contrast lattice-like line pattern.

ADVANTAGEOUS EFFECTS OF INVENTION

As compared with the method of forming fine holes by combining the double dipole lithography with a negative resist film, the pattern forming process of the invention is capable of forming a hole pattern by using a positive resist film, effecting a single exposure to form a dot pattern at the same level of resolution as the double dipole lithography, and effecting positive/negative reversal to form the hole pattern. Use of a positive resist film which has a higher resolution capability than a negative resist film offers improvements in resolution and process margins such as focus margin and exposure margin. Since positive/negative reversal is carried out by wet etching with a developer, the process achieves a high throughput as compared with the conventional dry development and eliminates a need for an etching system for dry development. Although the double dipole lithography needs two masks, the process uses a single phase shift mask having a lattice-like pattern and achieves a level of resolution equivalent to the double dipole lithography.

BRIEF DESCRIPTION OF DRAWINGS

FIG. 1 schematically illustrates in cross-sectional views a prior art process for forming a hole pattern through exposure of a positive photoresist material.

FIG. 2 schematically illustrates in cross-sectional views a prior art image reversal process using a positive i or g-line resist material based on a quinonediazide-novolac resin.

FIG. 3 schematically illustrates in cross-sectional views a prior art image reversal process involving hardening of a developed resist film and burying of SOG film.

FIG. 4 schematically illustrates in cross-sectional views the pattern forming process of the invention.

FIG. 24 illustrates masks used for dot formation and dot erasing in Example.

DESCRIPTION OF THE PREFERRED EMBODIMENTS

Figure 1A:
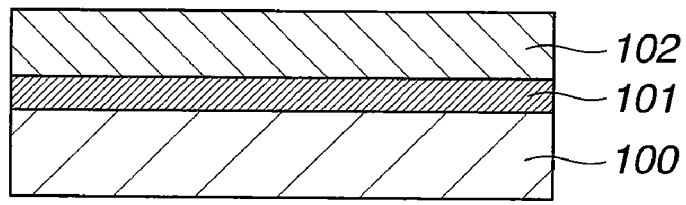
FIG. 1A shows formation of a photoresist film.
Figure 1B:
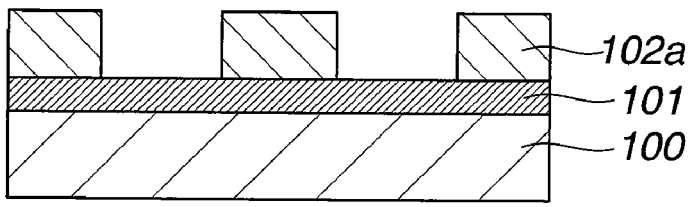
FIG. 1B shows exposure and development of the photoresist film.
Figure 1C:
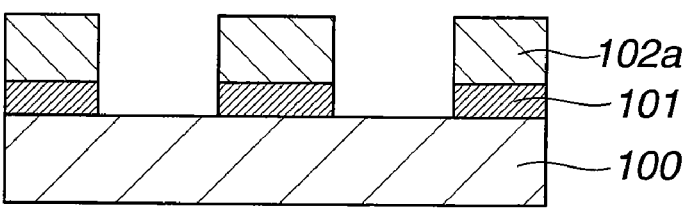
FIG. 1C shows etching of a processable substrate.
Figure 2A:
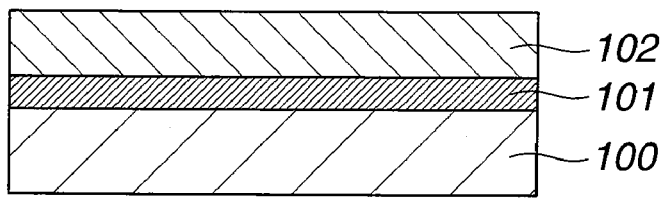
FIG. 2A shows formation of a photoresist film.
Figure 2B:
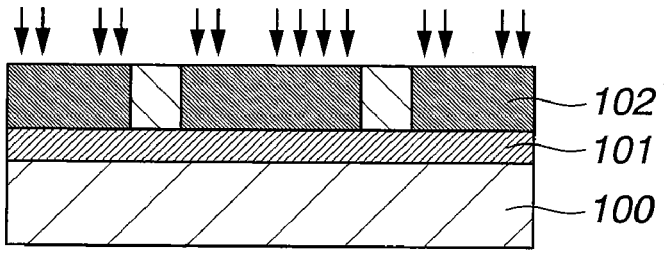
FIG. 2B shows exposure and heating of the photoresist film.
Figure 2C:
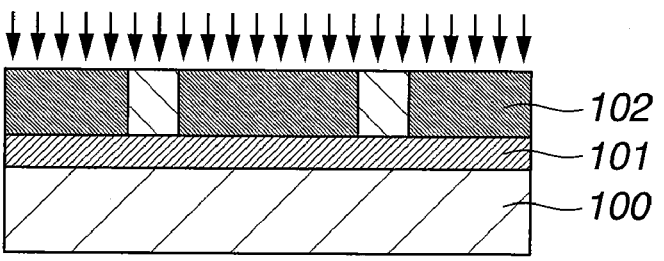
FIG. 2C shows flood exposure.
Figure 2D:
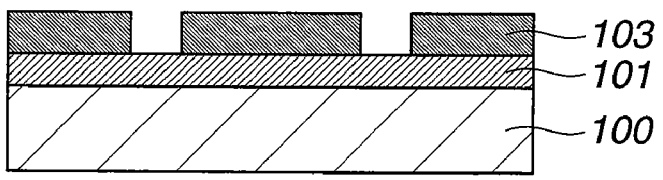
FIG. 2D shows pattern reversal by development.
Figure 2E:
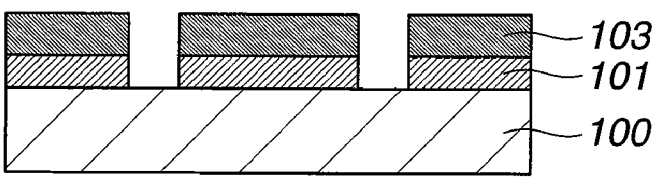
FIG. 2E shows etching of a processable substrate.
Figure 3A:
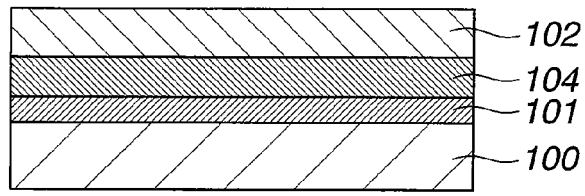
FIG. 3A shows formation of a photoresist film.
Figure 3B:
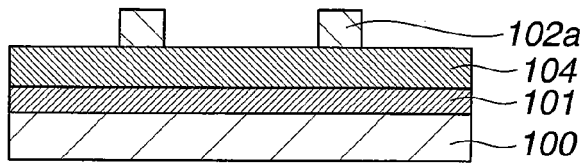
FIG. 3B shows exposure and development of the photoresist film.
Figure 3C:
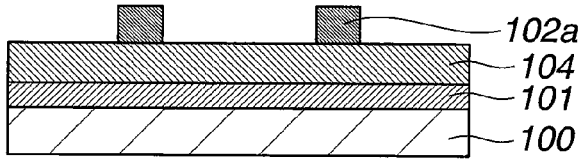
FIG. 3C shows crosslinking of the photoresist film.
Figure 3D:
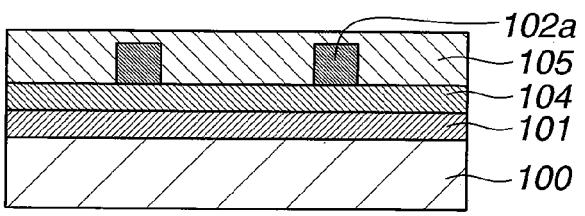
FIG. 3D shows coating of a SOG film.
Figure 3E:
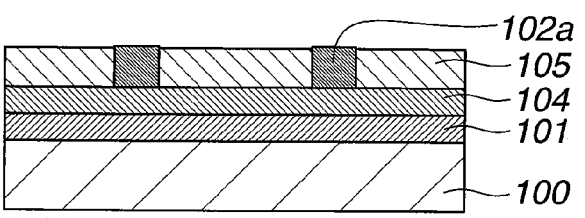
FIG. 3E shows light etching with CMP or CF gas.
Figure 3F:
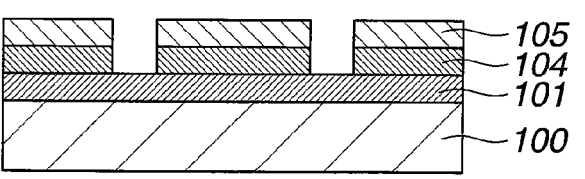
FIG. 3F shows pattern reversal by oxygen/hydrogen gas etching.
Figure 3G:
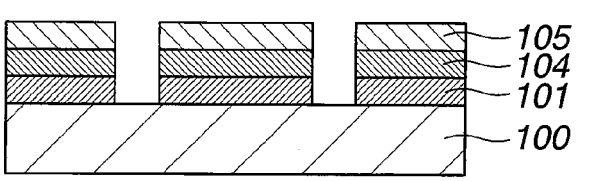
FIG. 3G shows etching of a processable substrate.

The terms "a" and "an" herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
CVD: chemical vapor deposition
SOG: spin on glass
TMAH: tetramethylammonium hydroxide
PGMEA: propylene glycol monomethyl ether acetate The abbreviation "phr" refers to parts by weight per 100 parts by weight of resin or polymer.

The present invention provides a process for forming a pattern by way of positive/negative reversal, comprising the steps of coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the unnecessary solvent and to form a resist film; exposing the resist film to high-energy radiation through a phase shift mask having a lattice-like array of shifters, post-exposure baking so that the acid generated by the acid generator upon exposure may act on acid labile groups in the resin for thereby effecting elimination reaction of acid labile groups in the resin in exposed areas, developing the exposed resist film with an alkaline developer to form a positive pattern; illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin may not lose a solubility in an alkaline wet etchant, for thereby endowing the positive pattern with resistance to an organic solvent used in a reversal film-forming composition; coating a reversal film-forming composition on the positive pattern-bearing substrate to form a reversal film; and dissolving away the crosslinked positive pattern using an alkaline wet etchant.

Preferably, dots in the dot pattern of the resist film as developed are positioned at intersections between gratings of the lattice-like shifter array.

The process includes the step of exposing the resist film to high-energy radiation through a phase shift mask having a lattice-like array of shifters. Specifically, using a mask having a lattice-like halftone shifter pattern, dots are formed at intersections of the lattice. The halftone area has a transmittance of 3 to 15%, preferably 4 to 10%. When the line width of the lattice is narrower than half of the pitch of the lattice, that is, the space of a line-and-space pattern is wider than the line, black spots with higher light-shielding property are formed at intersections. For a lattice with a pitch of 80 nm, a line width of 40 to 20 nm is preferred, and a line width of about 30 nm is most preferred.

Figure 18:
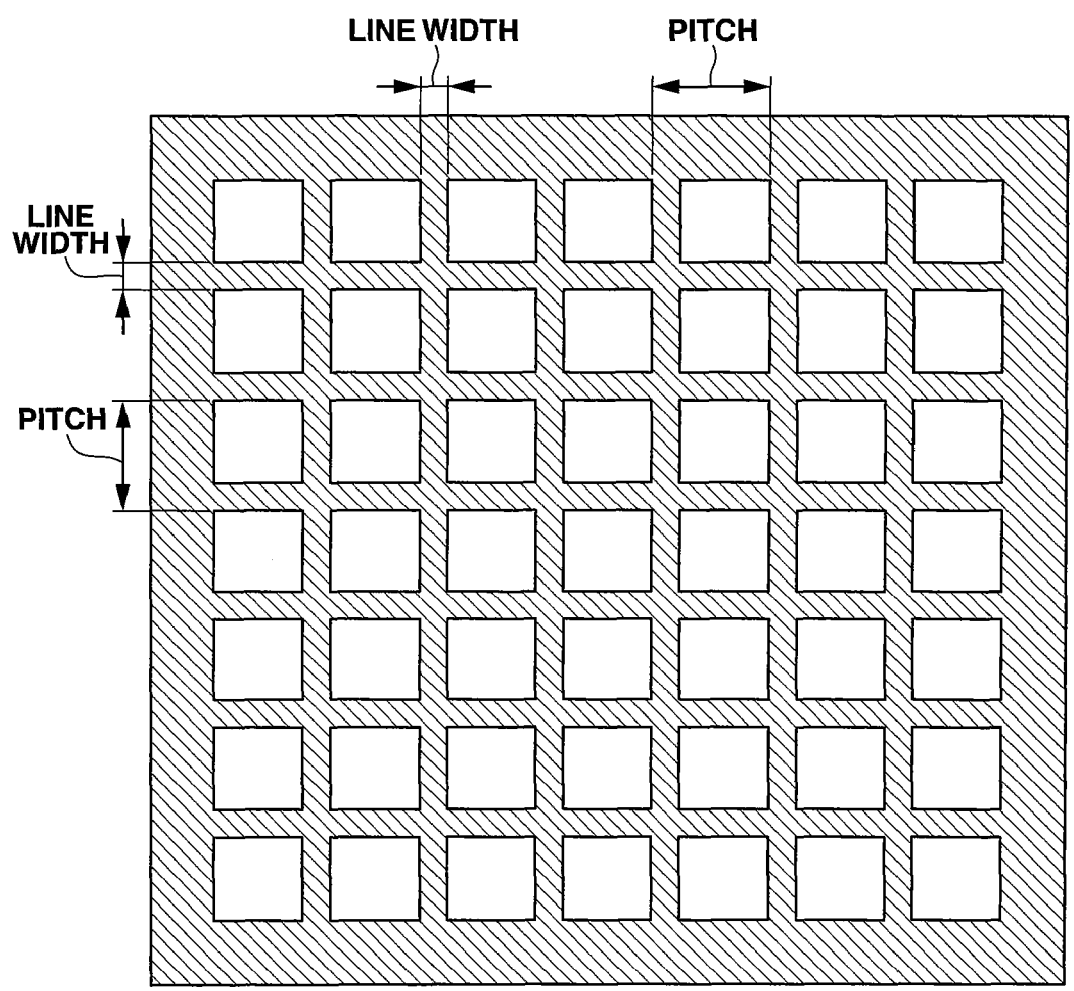
FIG. 18 illustrates a lattice-like mask pattern of the layout having holes distributed.
Figure 19:
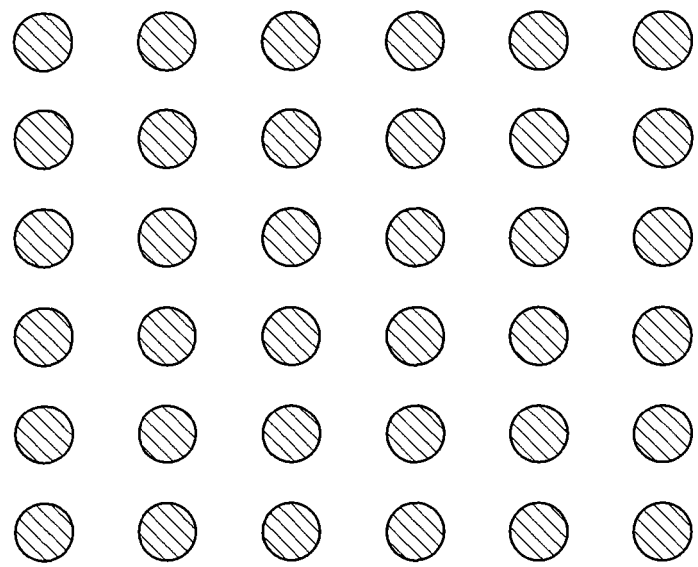
FIG. 19 illustrates a dense dot pattern formed through exposure and development, with black spots being a remaining pattern.
Figure 20:
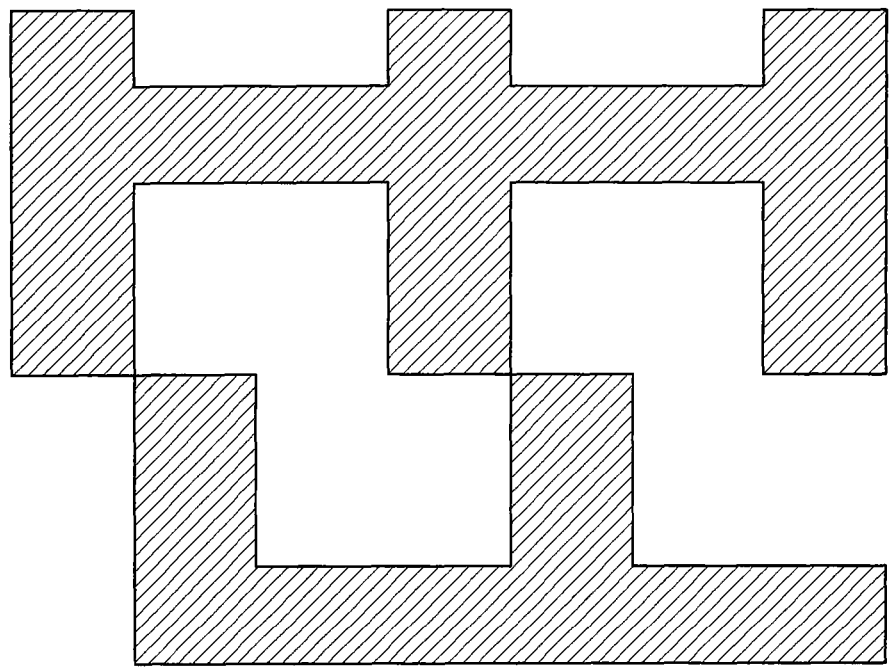
FIG. 20 illustrates a mask pattern for erasing unnecessary dot pattern regions, with black areas being light-shielded regions.
Figure 21:
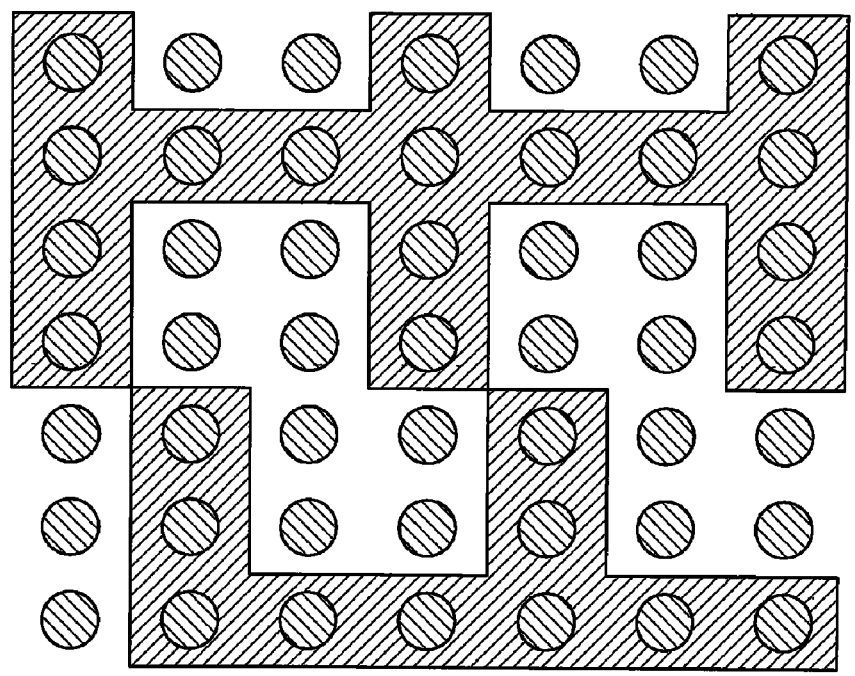
FIG. 21 illustrates an overlay of the dense dots and the dot erasing mask.
Figure 22:
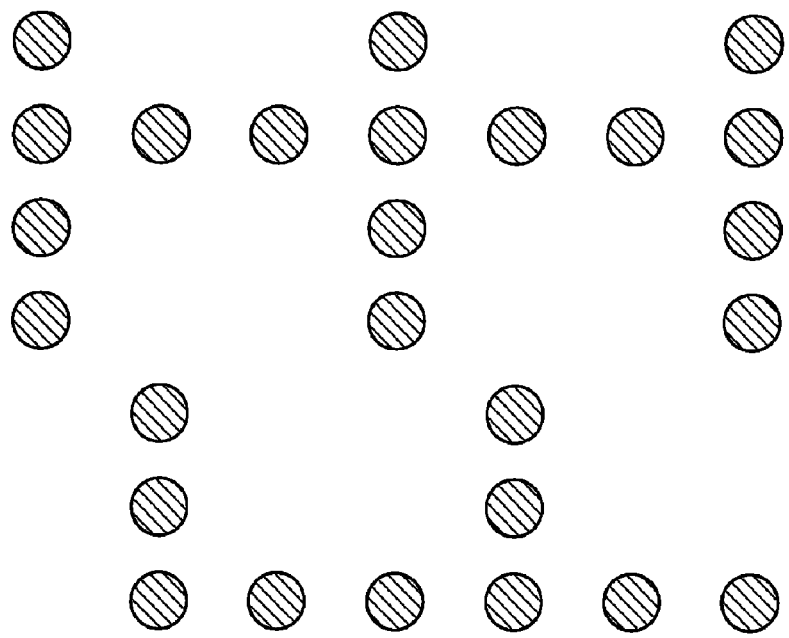
FIG. 22 illustrates a dot pattern including dense and isolated dot pattern regions, after dot erasing exposure and development.
Figure 23:
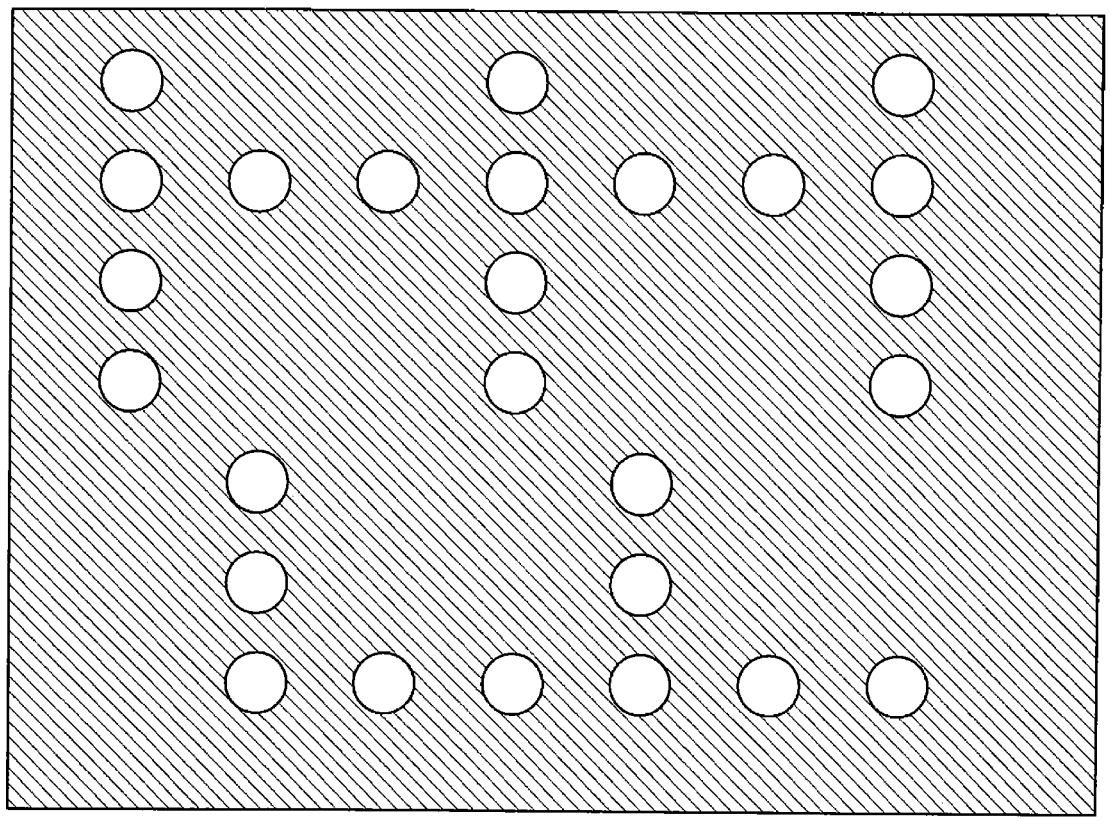
FIG. 23 illustrates a hole pattern including dense and isolated hole pattern regions, after positive/negative reversal.

When expressed by the size of a square white section, the lattice section is a square with one side of about 50 nm. FIG. 18 illustrates a lattice, depicting a line width and a lattice pitch.

On use of a mask of X-Y gratings, the illumination of the exposure tool is most preferably a combination of cross-pole illumination with X-Y polarized illumination. Instead of X-Y polarized illumination, azimuthally polarized illumination may be employed. Although the azimuthally polarized illumination is ring-like polarized illumination, its combination with cross-pole illumination with only the outermost periphery of crisscross in X and Y directions being cut out exerts substantially the same effect as the X-Y polarized illumination.

On use of an oblique 45 degree lattice mask, the illumination is a combination of oblique 45 degree cross-pole illumination with azimuthally polarized illumination. Instead of cross-pole illumination, annular illumination may be used in combination with azimuthally polarized illumination, and hexa-pole or octa-pole illumination may be combined with azimuthally polarized illumination. Alternatively, annular illumination having a small circle or annulus at the center, cross-pole, hexa-pole, or octa-pole illumination may be used. Such illumination makes it possible to form dense and isolated patterns at the same time through a single exposure. Although polarized illumination may not be used, a pattern with a finer pitch can be formed using polarized illumination. A pattern with the finest pitch can be formed from a combination of a X-Y lattice mask, cross-pole illumination (inter alia, the outermost periphery cut out at an angle of up to 35 deg, preferably up to 25 deg) and X-Y polarized illumination. Instead of cross-pole illumination, two exposures by X-Y dipole illumination may be performed. Although the resultant effect is substantially the same as cross-pole illumination, the two dipole exposures is disadvantageous in throughput.

The resolution limit of a line pattern is in principle equal to the wavelength divided by lens' NA and 4. In an example of ArF lithography with 193 nm wavelength and a NA 1.30 lens, the maximum resolution is 37.1 nm. Actually, polarized illumination has a polarization which is not equal to 100%, and the cutout angle of dipole illumination is difficulty reduced below 20%. It is then impossible to form an ideal optical image. A very fine pattern is largely affected by the resolution capability of a resist film. For these reasons, actually the maximum resolution is 38 nm in pinpoint, and the maximum resolution with a certain margin is 39 nm.

Figure 16:
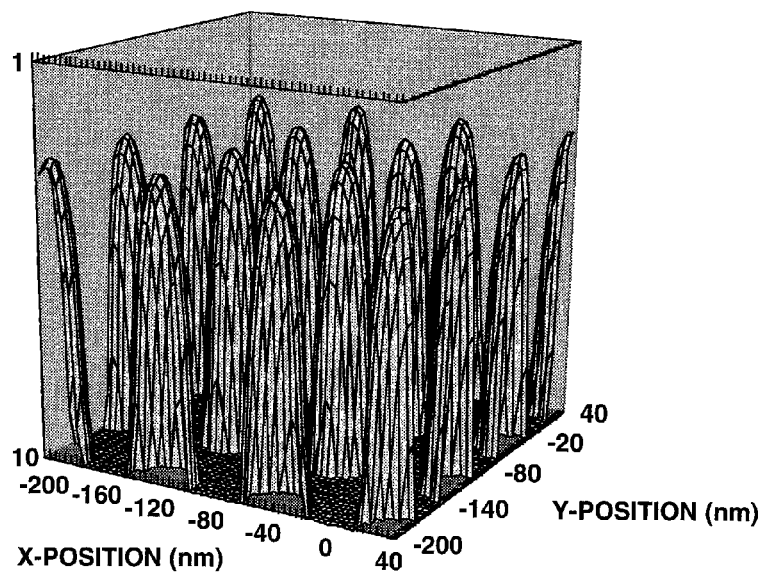
FIG. 16 illustrates a simulation of resist profile in the optical image of FIG. 15.

Using the pattern forming process of the invention, dots with the same half-pitch of 39 nm as lines can be resolved as shown in FIG. 16. As the exposure dose is increased, dots are increased in circularity. Then holes which are narrower than the half-pitch can be formed although the conventional hole forming technology is most difficult to form such narrow holes. The super-resolution technology utilizing light diffraction improves the resolution of a one-dimensional pattern as typified by a straight line pattern, but less effective in improving the resolution of a two-dimensional pattern. It is surprising that the resolutions of a one-dimensional pattern and a two-dimensional pattern are equalized.

As discussed above, several attempts have already been made to form a pattern, which is optically disadvantageous to form from a positive resist material as such, using a positive resist material featuring a high resolution capability and positive/negative reversal. There were many problems to be overcome in the course of development works. In the situation where a reversal film is formed on a once formed positive pattern, how to deposit a new coating without disrupting the underlying pattern is one of such problems. The initial approach addressing this problem is to use an aqueous composition in which the positive pattern is not dissolvable, as the reversal film-forming composition. The reversal film material which can be used is limited to a narrow range of water-soluble materials. Then JP-A 2005-43420 proposes that by EB curing, a positive pattern is crosslinked to be insoluble in solvents and developers, before a reversal film is formed. Another problem is how to selectively remove the positive pattern relative to the reversal film. Selective removal is achieved using SOG and organic silicone materials having resistance to oxygen dry etching as the reversal film as taught in JP-A 2005-43420.

On the other hand, the fact that a resist film as shown in JP-A 2005-43420 is crosslinked and insolubilized upon exposure to high-energy radiation was known at the initial phase of research and development of chemically amplified resist materials as a phenomenon that occurs when a chemically amplified resist film is exposed to radiation of too high energy. That is, it is a phenomenon that when polyhydroxystyrene units of which a chemically amplified resist polymer is composed are exposed to high intensity light, a hydrogen radical is eliminated from the methine to which the phenyl group is bonded, and the resulting radical acts to form crosslinks between resin molecules whereby the resin is insolubilized. It is believed that this radical creation capable of inducing crosslink formation can occur not only on the styrene structure, but also on the polyacrylic acid structure. It is further believed that similar crosslink formation occurs on methylene bonded to a heteroatom. However, the inventors observed that when light exposure is made stepwise, insolubilization of a resist film by crosslink formation does not instantly occur, but past consecutive points of time when the dissolution rate is slightly reduced, and attempted to utilize this phenomenon. More particularly, the initially observed reductions of dissolution rate are results of crosslinks forming within or between molecules within a limited range. As long as crosslinking is within the limited range, there is a possibility that resistance to organic solvents such as the coating solvent is obtainable without completely losing a dissolution rate in alkaline developer. Then, studying to form a pattern having resistance to organic solvents commonly used in film-forming compositions without completely losing a dissolution rate in alkaline developer, the inventors have found that such a pattern is feasible.

If the method of endowing a positive pattern with resistance to organic solvents without completely losing solubility in alkaline developer as mentioned above is incorporated in the process of forming a resist pattern through positive/negative reversal, a pattern forming process involving reversal of a positive pattern to a negative pattern becomes possible as described below. Namely, in accordance with the ordinary positive pattern forming method, first a chemically amplified positive resist composition is coated and prebaked to form a resist film. Then patternwise exposure is performed, and post-exposure heating or baking is performed to eliminate acid labile groups from the resin in the exposed area, for thereby turning the exposed area soluble in alkaline developer. This is followed by development with an alkaline developer, yielding a positive pattern. Next, the resulting positive pattern is subjected to the step of endowing the positive pattern with resistance to an organic solvent to be used in a reversal film-forming composition without completely losing solubility in the alkaline developer. Next, on the substrate having the positive pattern endowed with resistance to an organic solvent to be used in a reversal film-forming composition, the reversal film-forming composition in the form of a solution in that organic solvent is coated to form a reversal film. At this point, the reversal film is coated so as to completely bury or fill spaces in the positive pattern, although the reversal film may be coated so as to form a layer over the positive pattern as well. In such an event, as described in JP-A 2001-92154 and JP-A 2005-43420, after the reversal film is formed, the portion of the reversal film deposited on the positive resist is removed and the positive pattern is then removed using an alkaline wet etchant. Then only the portion of the reversal film where the positive pattern is absent is left behind, that is, a reversal film pattern reflecting positive/negative reversal is obtained. It is noted that the alkaline wet etchant serves to dissolve the positive pattern, and the developer for forming the positive pattern may be used as the etchant while its concentration may be adjusted if necessary.

The resist pattern forming process relying on positive/negative reversal according to the invention achieves significant simplification of operation because the removal of the positive pattern does not need conventional oxygen dry etching. Further, the reversal film which can be used in the process may be any of conventional organic films including antireflective coatings (ARC) of aromatic organic polymers and organic underlayer films used in the multilayer resist process, specifically organic films comprising resins containing a majority of aromatic structure-bearing units well-known in the art, for example, novolac resins (see JP-A 2007-171895), polystyrene resins, vinyl ether or acrylic resins containing anthracene or naphthalene rings, and multi-branched resins (also known as aliphatic polycyclic structure resins) as used in the ArF resist (see JP-A 2006-293298). Of course, these reversal films may be either films which are insolubilized in organic solvents through crosslink formation during deposition like the ARC or films which are not insolubilized in such a manner, as long as a difference in dissolution rate enough to provide an etching selectivity with respect to the alkaline wet etchant is available between the reversal film and the positive pattern. If these organic material films are used, reversal film patterns resulting from reversal can be directly used as the etching mask for processing metallic silicon and silicon oxide substrates, like the conventional organic resist patterns. Furthermore, as is well known in the art, when organic reversal films as described above are used, films and substrates of silicon nitride, silicon oxynitride, titanium oxide, titanium nitride, germanium oxide and hafnium oxide may be processed as well as the metallic silicon and silicon oxide substrates.

Furthermore, if the reversal film used is a film having a scarce alkaline solubility as will be described later, the step of removing the reversal film deposited on the positive resist pattern may resort to the step of dissolving away in an alkaline wet etchant rather than conventional dry etching and organic solvent stripping techniques. When removal is made by this technique, the reversal film deposited on the resist pattern and the resist pattern can be concurrently removed by a single operation, achieving a significant step saving to the overall process.

The positive pattern is endowed with resistance to an organic solvent to be used in the reversal film-forming composition without completely losing solubility in alkaline wet etchant, and then the positive pattern is prevented from being dissolved and hence deformed or disrupted during coating and formation of the reversal film. This can be achieved by illumination of high-energy radiation of an appropriate energy level, as discussed above. Recognizing that the crosslink formation by light or illumination is sometimes difficult to control owing to the tolerance of illumination dose and the uniformity of illumination, the inventors sought for another crosslink forming technique and discovered that a limited degree of crosslinking just to impart the desired organic solvent resistance can be achieved by heat. Particularly when a positive pattern obtained from a resist material having units having a crosslinking capability under strong reaction conditions such as lactone structure is used, the desired control is relatively easily achievable by heat in the presence of acid.

The step of heating the positive pattern for endowing the positive pattern with resistance to an organic solvent to be used in a reversal film-forming composition without losing a solubility in an alkaline wet etchant differs in the amount of acid to be generated and the optimum temperature to be reached by heating depending on a particular resist material used. Nevertheless, the resist pattern forming process of the invention may be readily implemented by setting conditions for this step in accordance with the following measures. Namely, acid is generated within the resist film by illuminating light or high-energy radiation such as electron beam (EB) in an appropriate range to the resist film and then heating, or solely by heating, whereupon the acid is used to eliminate acid labile groups in the resin to impart a solubility in alkaline solution to the resin. At the same time as this treatment, partial crosslinks are formed by light or heat, whereby the resin is endowed with resistance to an organic solvent to be used in a reversal film-forming composition. Preferably, the measure of solubility of the resist film to be achieved by this step is that the resist film has an etching rate in excess of 2 nm/sec when etched with a 2.38 wt % TMAH aqueous solution commonly used in the alkaline development of resist films. Also, the resistance to an organic solvent to be used in a reversal film-forming composition is of such order that the resist pattern after the resistance-endowing (or crosslinking) treatment experiences a thickness reduction of up to 10 nm when contacted with a solvent to be used in a reversal film-forming composition for 30 seconds and more preferably for 60 seconds, and the solvent resistance of such order prevents the occurrence of the problem that the pattern of the positive resist film is fatally damaged when the reversal film-forming composition is coated thereon, and hence, a reversed (negative) pattern of the desired configuration is not obtainable. It is noted that in determining the treatment conditions, if a bulk film is used which has passed the above-described sequence of steps including resist coating, prebaking, and PEB, but excluding only pattern exposure for positive pattern formation, and has further been subjected to a set of conditions constituting a candidate step of endowing the positive pattern with resistance to an organic solvent to be used in a reversal film-forming composition without losing a solubility in an alkaline wet etchant, then the two dissolution rates described above are readily determined.

The organic solvent used in the reversal film-forming composition which allows for advantageous use of the invention may encompass those solvents in which reversal film-forming organic polymers are fully soluble, and which offer good coating properties, for example, the above-described hydroxy-bearing solvents, esters, ketones and the like. Specifically, the solvent is selected from among PGMEA, cyclohexanone, ethyl lactate, propylene glycol monomethyl ether, and heptanone, which may be used alone or in admixture of two or more. To the solvent, $C_3$-$C_{10}$ alcohol, toluene, xylene or anisole may be added. Then as to the measure of endowing resistance to the organic solvent used in the reversal film-forming composition, the resist pattern which has been treated to have such a degree of solvent resistance as to experience a thickness reduction of up to 10 nm when contacted with a single solvent or a mixture of solvents selected from the above-mentioned group for 30 seconds and more preferably for 60 seconds is particularly preferred because of versatile use.

When partial crosslinks are induced by illumination of high-energy radiation, the heating treatment of the positive pattern may be heating to the PEB temperature used in forming the positive pattern or somewhat lower temperature, because the only reaction to be induced by heating is decomposition of acid labile groups. However, when high-energy radiation is not used, or when the main purpose of high-energy radiation is to generate acid, that is, when an energy amount equivalent to that of pattern exposure in the previous step is used and crosslinks are formed mainly by thermally induced reaction, it is preferable to select a higher temperature than the prebaking temperature used in formation of the resist film or the PEB temperature. In the case of a material for which this temperature is set lower than the heating of the previous step, there is a risk of the positive resist film decreasing its resolution.

The positive/negative reversal process is advantageously utilized in the following case. As for the positive pattern, a finer size pattern can be formed with an over-exposure dose. Then, although it is technically quite difficult to form isolated spaces (trench pattern) below the exposure limit, for example, a very fine trench pattern can be formed by utilizing over-dose exposure to form a finer size pattern below the ordinary exposure limit and reversing the resulting pattern in accordance with the inventive process. Moreover, although formation of a fine hole pattern encounters more technical difficulty than the trench pattern, holes of a very small size can be formed by utilizing over-dose exposure to form a fine dot pattern and reversing the resulting pattern in accordance with the inventive process.

Now referring to one typical embodiment of the invention wherein a material having a scarce solubility in an alkaline wet etchant is used as the reversal film, the invention is described in further detail. As used herein, the term "alkaline wet etchant" is substantially equivalent to an alkaline developer used in the development of resist patterns and thus often referred to as "alkaline developer" as well.

In the most preferred embodiment of the invention, the pattern forming process comprises the steps of coating a positive resist composition onto a substrate, said resist composition comprising a polymer (or base resin) comprising recurring units having acid labile groups which are eliminatable with acid, the polymer turning, as a result of elimination of acid labile groups and crosslinking, into a crosslinked polymer having a dissolution rate in excess of 2 nm/sec in an alkaline developer, prebaking the resist composition to form a resist film, exposing a selected portion of the resist film to high-energy radiation, PEB, and developing the exposed resist film with the alkaline developer to form a positive pattern. Thereafter, the positive pattern is treated so as to generate acid and heated, thereby eliminating acid labile groups from the polymer and inducing crosslinking in the polymer in the positive pattern. Then, a reversal film having a dissolution rate of 0.02 nm/sec to 2 nm/sec in the alkaline developer is formed on the substrate to cover the resist pattern. The alkaline developer is then applied thereon to dissolve a surface layer of the reversal film and dissolve away the resist pattern, providing the reversal film with a pattern which is a reversal of the resist pattern.

In this embodiment, a hole pattern can be formed by forming a dot pattern as the resist pattern, followed by reversal.

While the reversal film must have etch resistance, the positive resist film need not have etch resistance because it is finally removed when a hole pattern is formed. From this aspect, an alicyclic structure is not necessarily needed. However, since the positive resist film is to be baked at a high temperature of at least 150° C. when the positive resist pattern is polarity changed to be insoluble in organic solvent and soluble in alkaline developer, the positive resist film must have such heat resistance that the pattern may not undergo thermal flow during baking at 150° C. or above. Incorporation of an alicyclic structure is effective for improving heat resistance and preferred to raise the glass transition temperature of a polymer to or above 150° C.

Preferably crosslink formation is attributed to electrophilic structures such as ester groups and cyclic ethers in the resin. Under the action of acid and heat, crosslinking reaction takes place by reactions such as ester exchange, ring-opening, esterification and etherification of lactone ring, ring-opening, etherification and esterification of cyclic ethers.

Resist Composition

The positive resist composition used in the pattern forming process comprises a base resin. A polymer comprising recurring units having lactone ring, specifically recurring units having 7-oxanorbornane ring, and preferably recurring units having the general formula (1) is useful as the base resin. The polymer having formula (1) is highly reactive in crosslinking reaction because both ester group and cyclic ether are contained in a common recurring unit. Since this unit also serves as an adhesive unit, advantageously the base resin is amenable to the pattern forming process without further incorporating additional units into the resin.

(1)

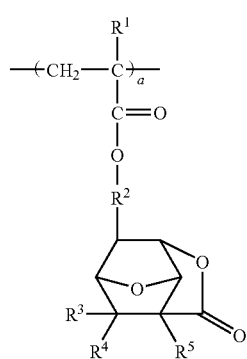

Herein $R^1$ is hydrogen or methyl. $R^2$ is a single bond, or a straight, branched or cyclic. $C_1$-$C_6$ alkylene group which may have an ether or ester radical. When $R^2$ is alkylene, the alkylene has a primary or secondary carbon atom bonded to the ester group in the formula. $R^3$, $R^4$, and $R^5$ are each hydrogen or a straight, branched or cyclic $C_1$-$C_6$ alkyl group. The subscript "a" is a number in the range: $0<a<1.0$.

Exemplary $C_1$-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Exemplary $C_1$-$C_6$ alkyl groups include methyl, ethyl, n-propyl, isopropyl, n-butyl, isobutyl, sec-butyl, n-pentyl, isopentyl, cyclopentyl, n-hexyl, and cyclohexyl.

Those monomers Ma from which recurring units (a) having formula (1) are derived have the following formula wherein $R^1$ to $R^5$ are as defined above.

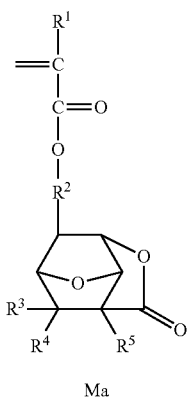

Ma

Examples of monomers Ma are given below.

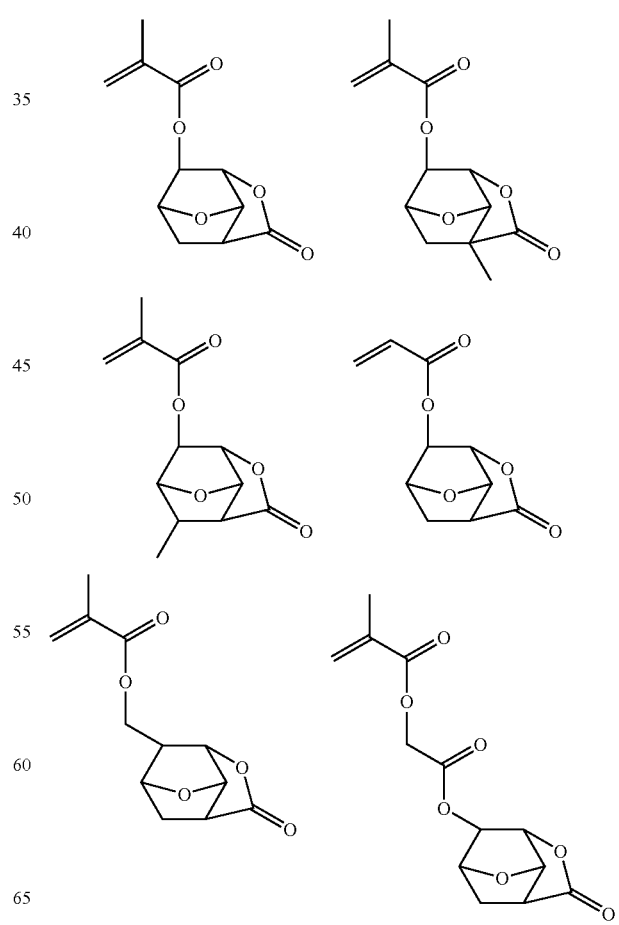

-continued

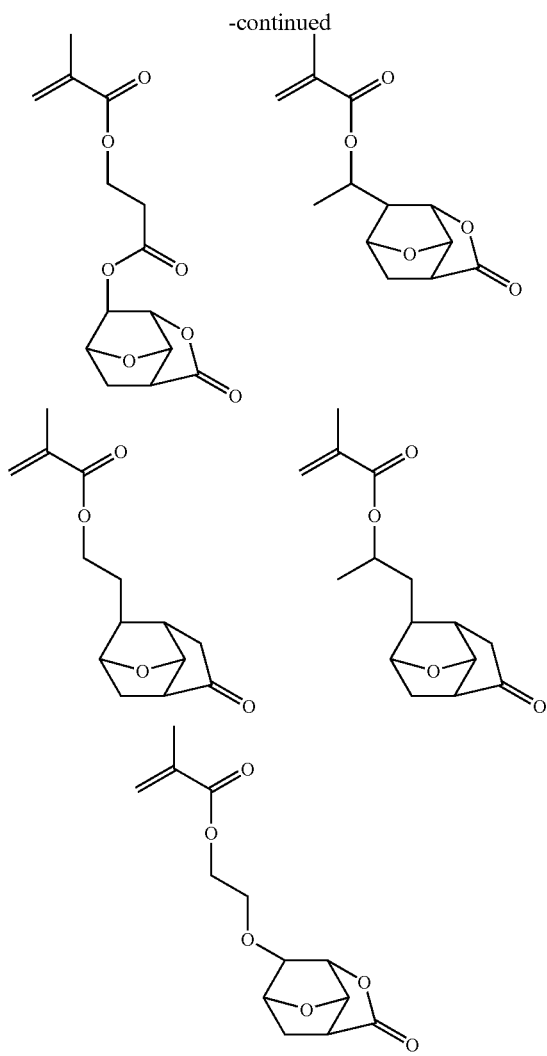

In the inventive process, once the first pattern is formed via exposure and development, deprotection of acid labile groups and crosslinkage are induced by the action of acid and heat. Then a film having an appropriate alkaline solubility (reversal film) is coated thereon and alkaline developed.

Subsequent to illumination and heating, the first pattern turns to a film which is alkaline soluble as a result of deprotection of acid labile groups in the acid labile group-containing recurring units and which is insoluble in a solvent (i.e., solvent in a reversal film-forming composition) as a result of crosslinking of 7-oxanorbornane ring. Thus, when a pattern reversal film-forming composition having a film-forming material dissolved in an organic solvent is coated on the first pattern, intermixing of the first pattern with the pattern reversal film-forming material is avoided.

The reversal film is then treated with an alkaline developer. When a surface portion of the reversal film is dissolved away to the level of the first pattern, dissolution of the first pattern starts. Image reversal occurs in this way.

When a polymer comprising recurring units having oxirane or oxetane is used as the base resin, it does not function as a positive resist composition as desired in the invention because the oxirane or oxetane ring has so high a rate of acid-assisted cleavage reaction that the polymer may undergo crosslinking at resist processing temperatures, for example, at 90 to 130° C. during PEB, and thus become alkali insoluble. In contrast, the 1,4-epoxy bond of 7-oxanorbornane ring is low reactive in acid-assisted cleavage reaction as compared with the oxirane or oxetane ring so that the polymer may not undergo crosslinking in the heating temperature range of PEB. Recurring units having 7-oxanorbornane ring are stable relative to acid in the course from coating to development and exert as a hydrophilic group a function of improving adhesion and alkaline solubility. However, under the impetus of the acid generated by flood exposure or heating of the developed pattern and heating at 170° C. or higher, ring opening of the 1,4-epoxy bond of 7-oxanorbornane ring occurs and crosslinking reaction takes place, leading to insolubility in the solvent. At the same time, deprotection of acid labile groups in the acid labile group-containing recurring units occurs under the impetus of acid and heat, leading to an increased alkaline solubility. For generating acid, a thermal acid generator may be added to the resist composition or the surface of the developed pattern may be subjected to flood exposure to UV having wavelength of less than 400 nm.

In the positive resist composition for use in the pattern forming process, a polymer comprising crosslinkable recurring units (a) having the general formula (1) above and acid labile group-containing recurring units (b) having the general formula (2) below is preferably used as the base resin.

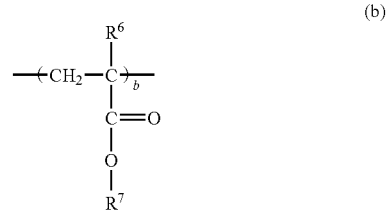

Herein $R^6$ is hydrogen or methyl, $R^7$ is an acid labile group, and b is a number in the range: $0 < b \leq 0.8$.

Those monomers Mb from which recurring units (b) having formula (2) are derived have the following formula wherein $R^6$ and $R^7$ are as defined above.

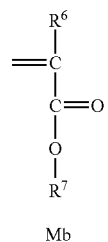

Mb

The acid labile group represented by $R^7$ in formula (2) may be selected from a variety of such groups, specifically groups of the following formulae (AL-10) and (AL-11), tertiary alkyl groups of the following formula (AL-12), and oxoalkyl groups of 4 to 20 carbon atoms, but not limited thereto.

(AL-10)

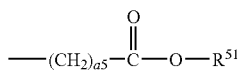

(AL-11)

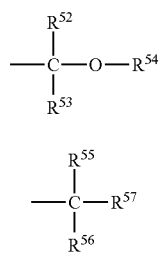

(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

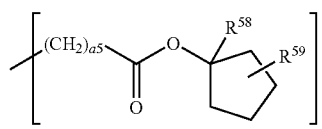
(AL-10)-1

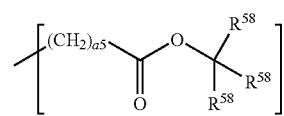
(AL-10)-2

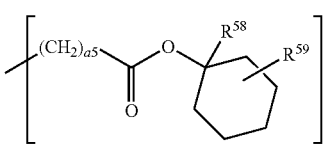
(AL-10)-3

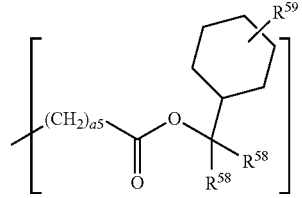
(AL-10)-4

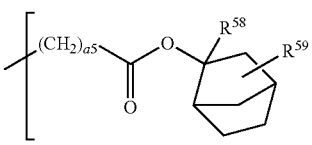
(AL-10)-5

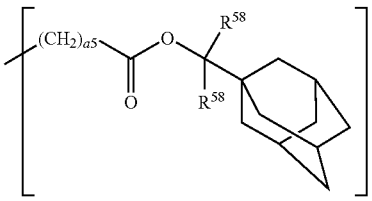
(AL-10)-6

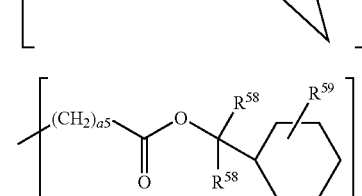
(AL-10)-7

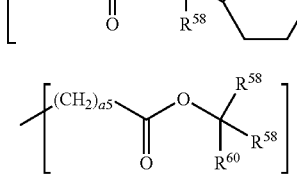
(AL-10)-8

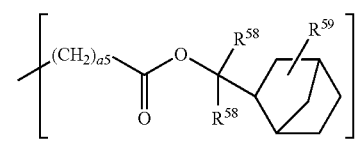
(AL-10)-9

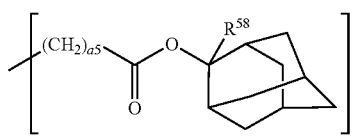
(AL-10)-10

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-34.

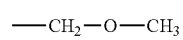
(AL-11)-1

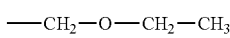
(AL-11)-2

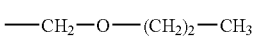
(AL-11)-3

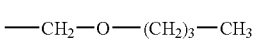
(AL-11)-4

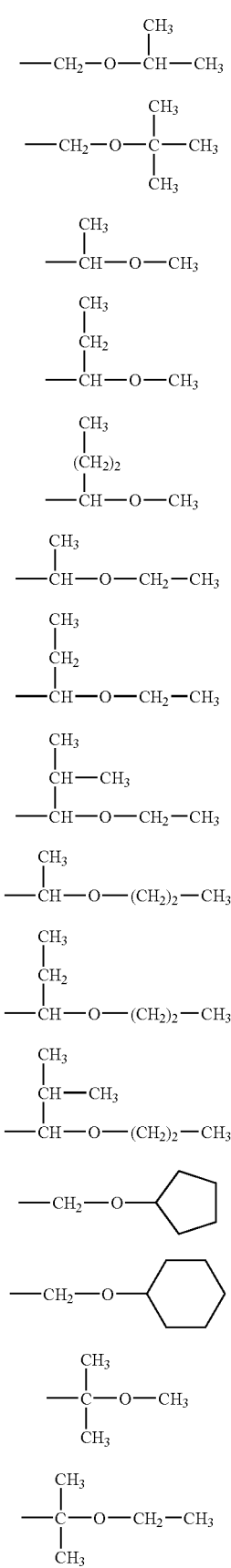
(AL-11)-5
(AL-11)-6
(AL-11)-7
(AL-11)-8
(AL-11)-9
(AL-11)-10
(AL-11)-11
(AL-11)-12
(AL-11)-13
(AL-11)-14
(AL-11)-15
(AL-11)-16
(AL-11)-17
(AL-11)-18
(AL-11)-19
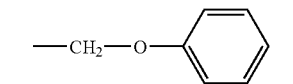
(AL-11)-20
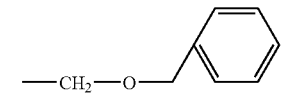
(AL-11)-21
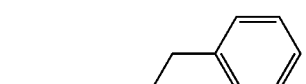
(AL-11)-22
(AL-11)-23
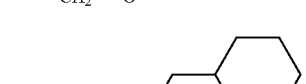
(AL-11)-24
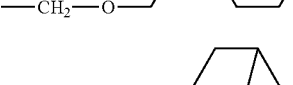
(AL-11)-25
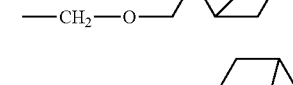
(AL-11)-26
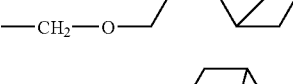
(AL-11)-27
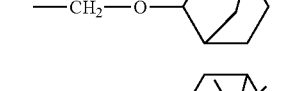
(AL-11)-28
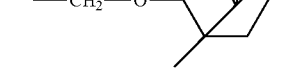
(AL-11)-29
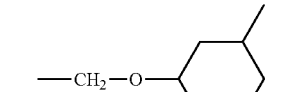
(AL-11)-30
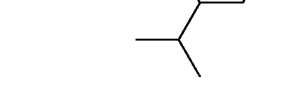
(AL-11)-31
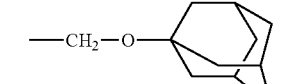
(AL-11)-32

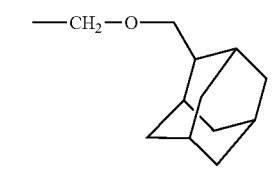 (AL-11)-33

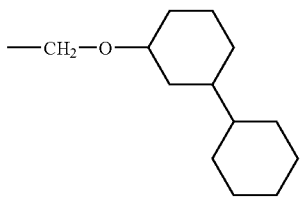 (AL-11)-34

Other examples of acid labile groups include those of the following formula (AL-11a) or (AL-11b) while the polymer may be crosslinked within the molecule or between molecules with these acid labile groups.

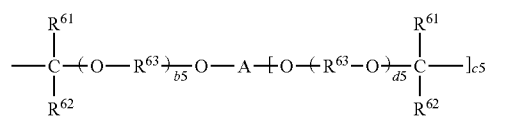 (AL-11a)

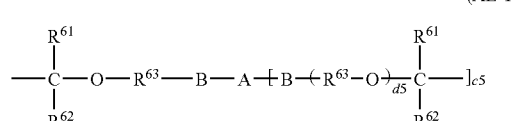 (AL-11b)

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

 (AL-11)-35

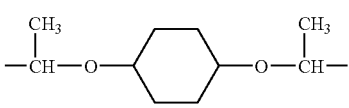 (AL-11)-36

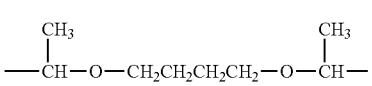 (AL-11)-37

 (AL-11)-38

 (AL-11)-39

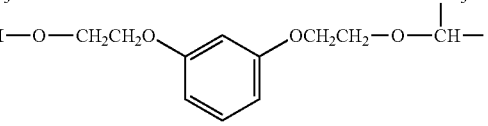 (AL-11)-40

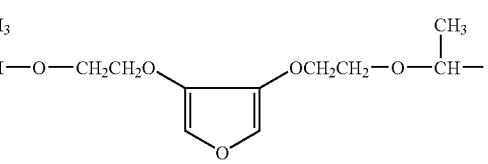 (AL-11)-41

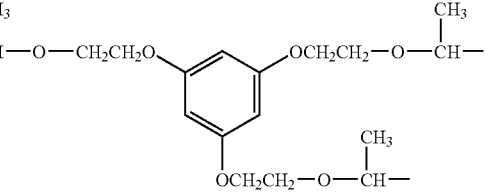

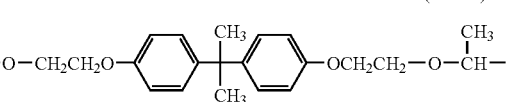 (AL-11)-42

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

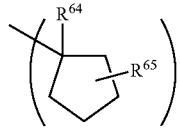 (AL-12)-1

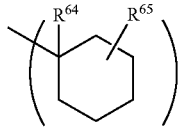 (AL-12)-2

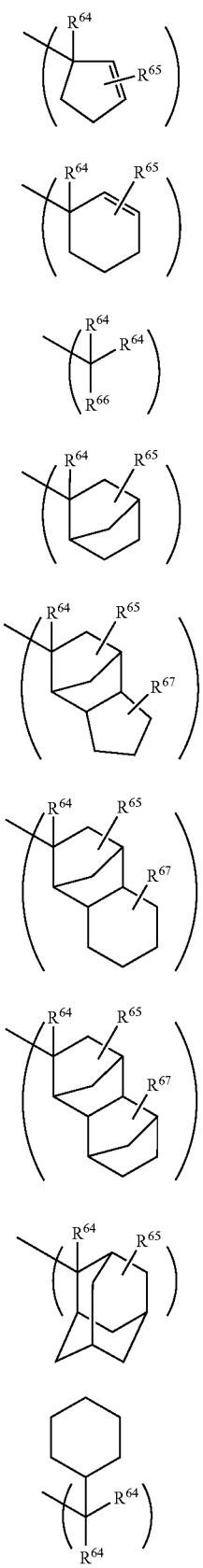
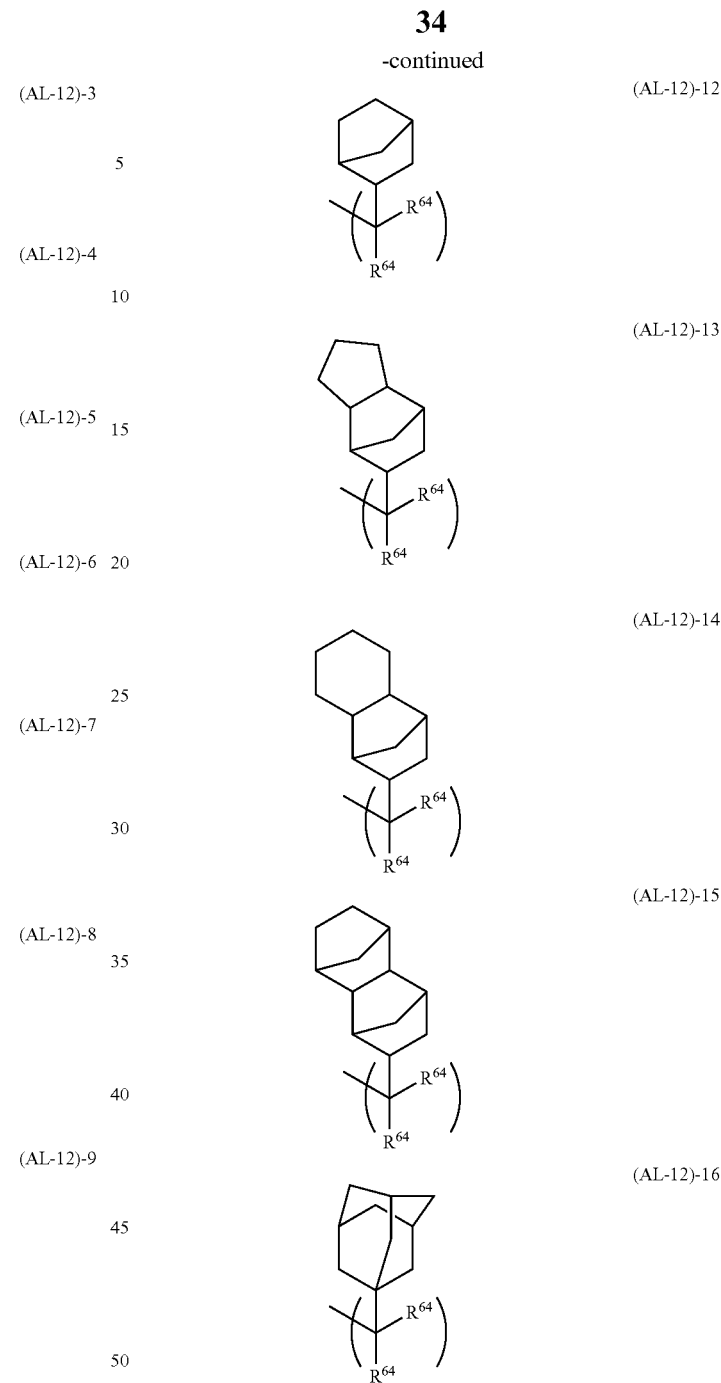

Herein $R^{64}$ is each independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group, which may contain a heteroatom such as oxygen, sulfur or nitrogen; and b6 is an integer of 1 to 3.

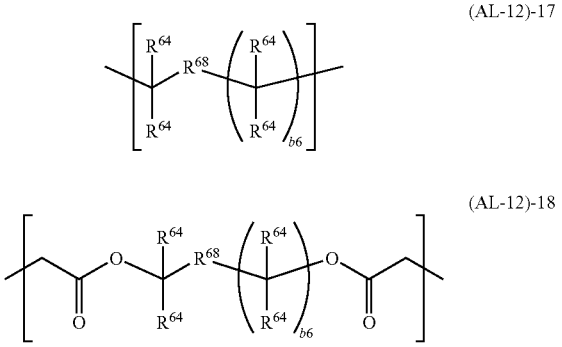

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

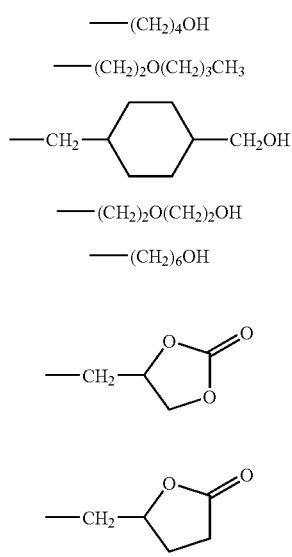

Of the acid labile groups of formula (AL-12), recurring units having an exo-form structure represented by the formula (AL-12)-19 are preferred.

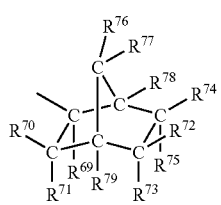

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$, taken together, may form a ring, specifically aliphatic ring, with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633).

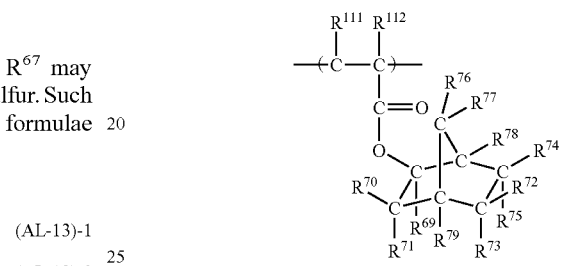

It is noted that $R^{111}$ and $R^{112}$ are each independently hydrogen, methyl, —COOCH$_3$, —CH$_2$COOCH$_3$ or the like. Illustrative non-limiting examples of suitable monomers are given below.

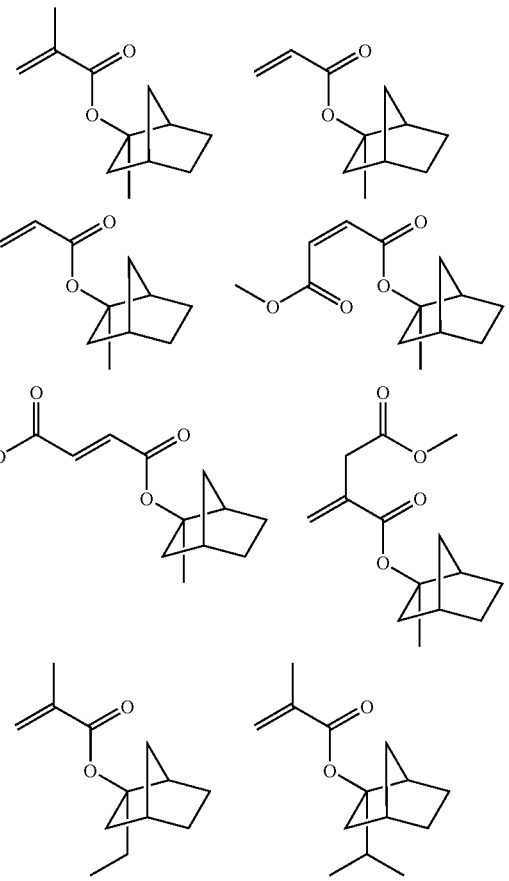

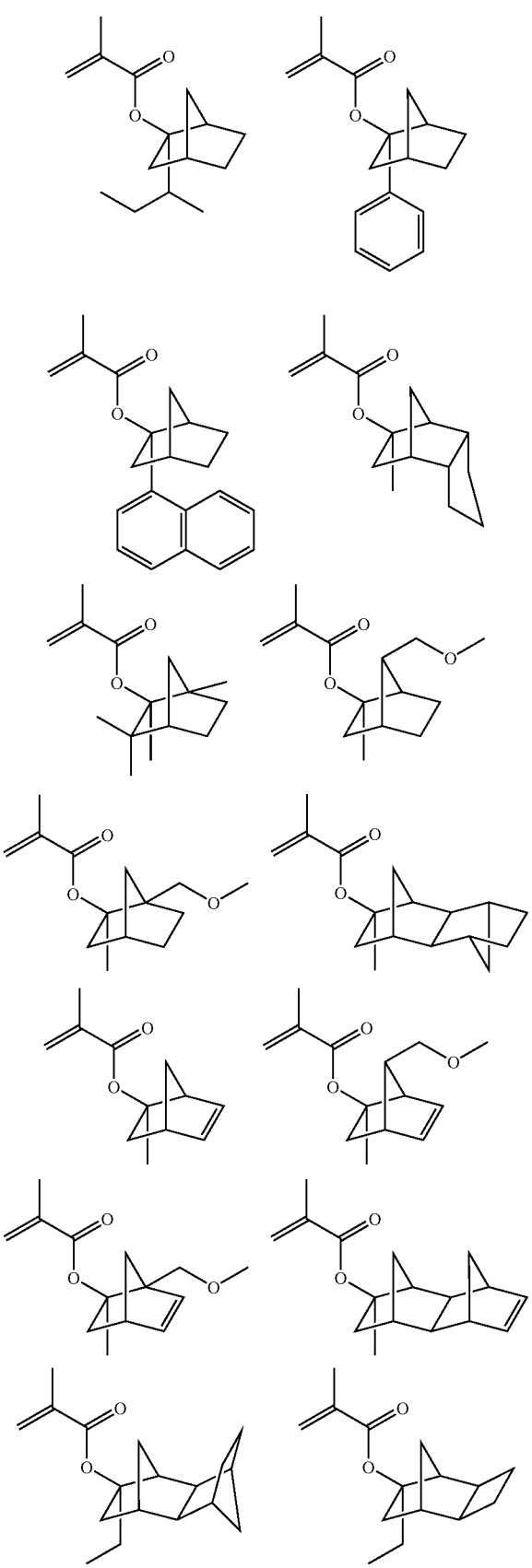

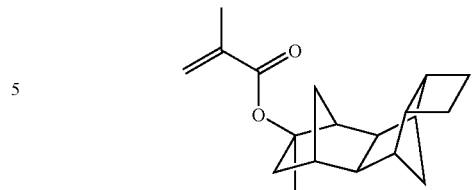

Also included in the acid labile groups of formula (AL-12) are acid labile groups having furandiyl, tetrahydrofurandiyl or oxanorbornanediyl as represented by the following formula (AL-12)-20.

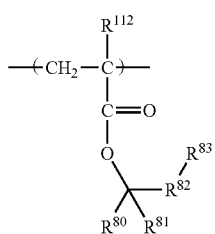

(AL-12)-20

Herein, $R^{80}$ and $R^{81}$ are each independently a monovalent hydrocarbon group, typically a straight, branched or cyclic $C_1$-$C_{10}$ alkyl. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

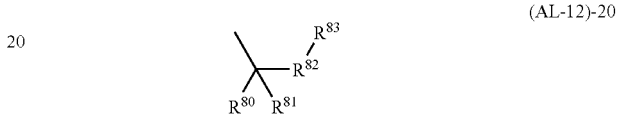

(wherein $R^{80}$ to $R^{83}$, and $R^{112}$ are as defined above) are derived are shown below. Note that Me is methyl and Ac is acetyl.

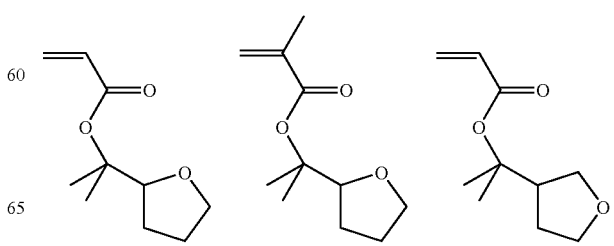

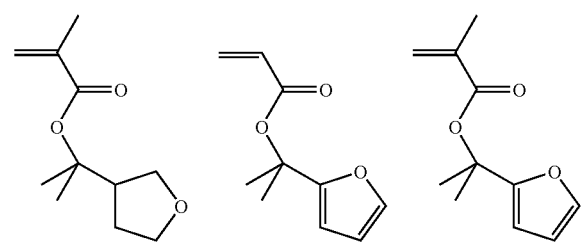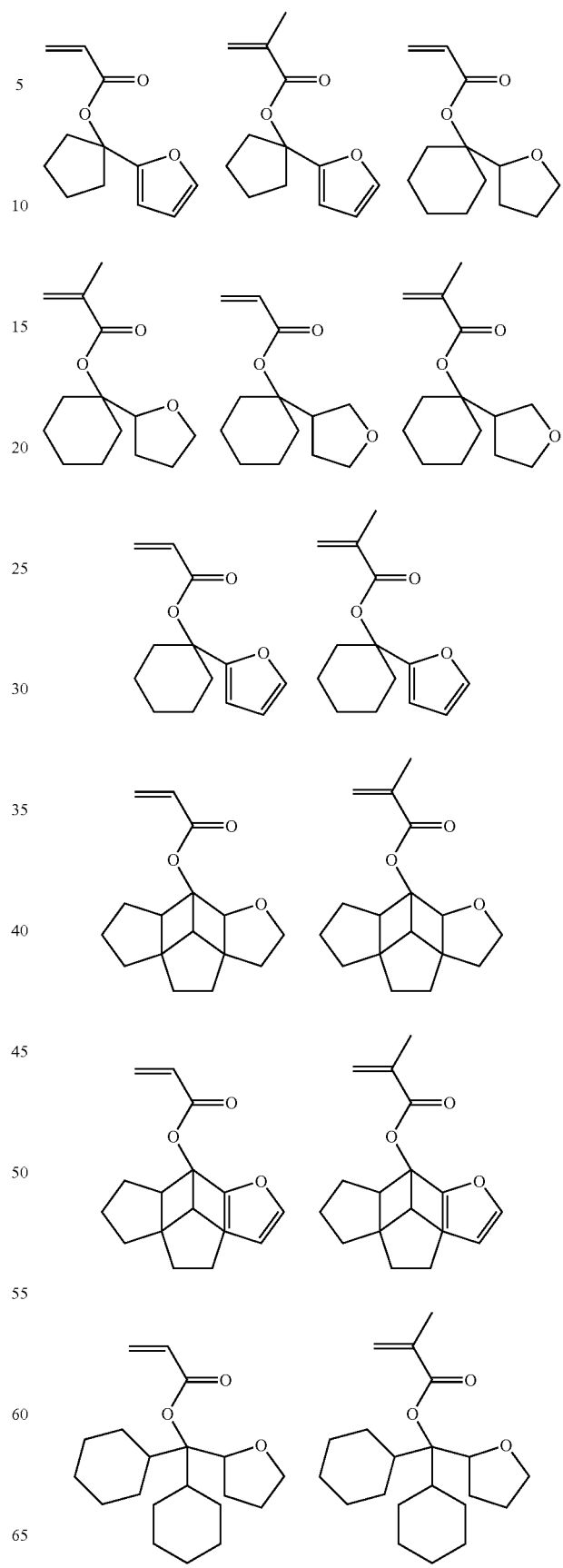

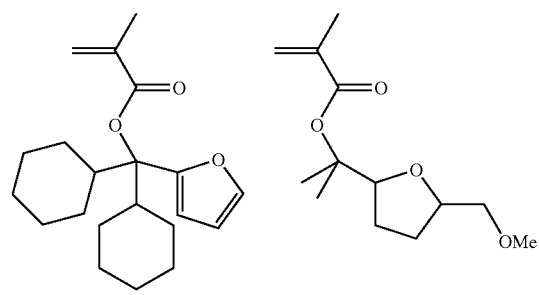
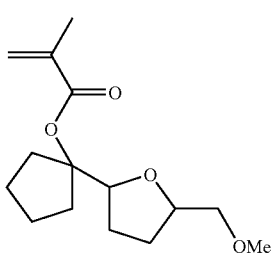
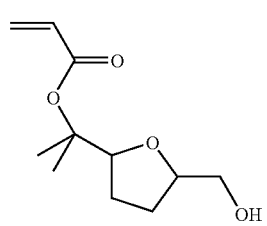
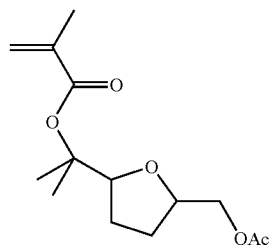
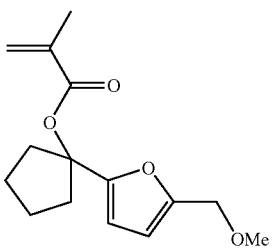
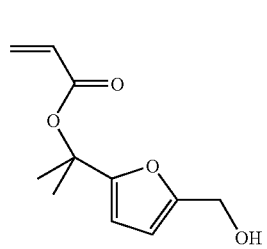

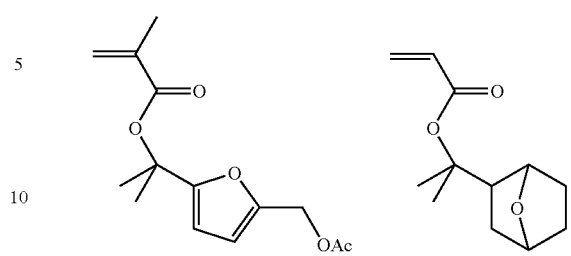
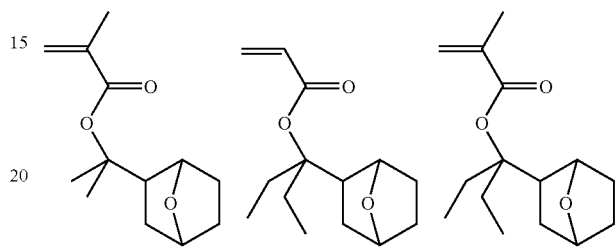
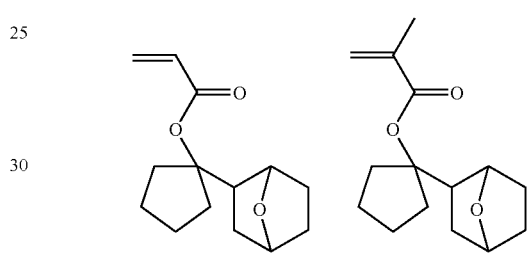
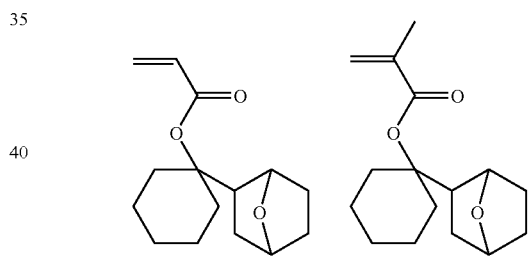

While the polymer used herein preferably includes recurring units (a) of formula (1) and recurring units (b) of formula (2), it may have copolymerized therein recurring units (c) derived from monomers having adhesive groups such as hydroxy, cyano, carbonyl, ester, ether groups, lactone rings, carboxyl groups or carboxylic anhydride groups. Examples of monomers from which recurring units (c) are derived are given below.

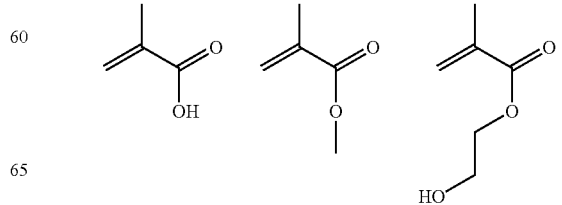

-continued
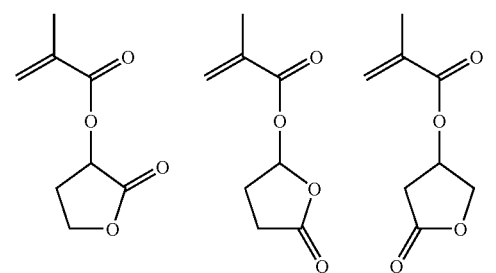
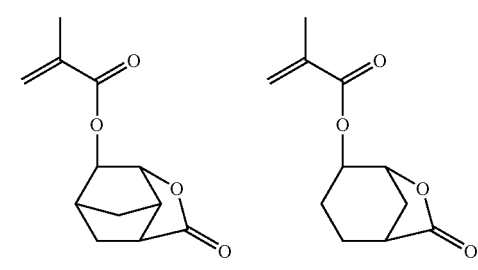
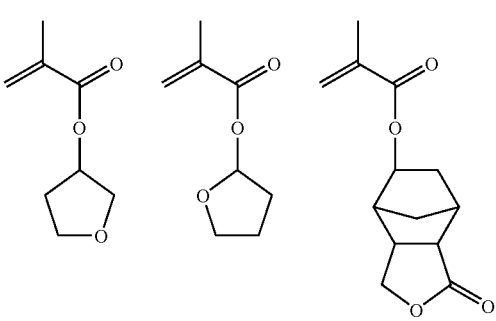
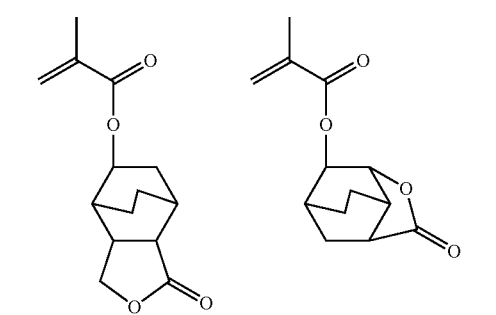
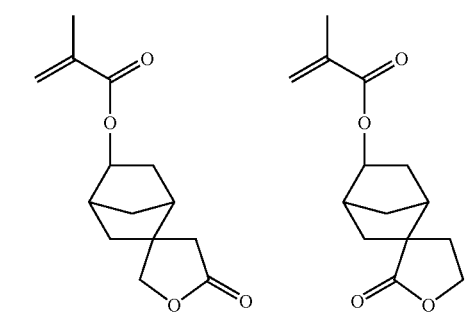
-continued
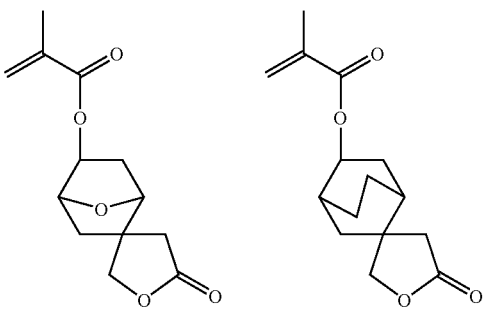
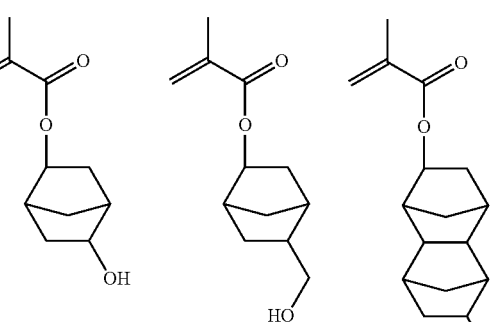
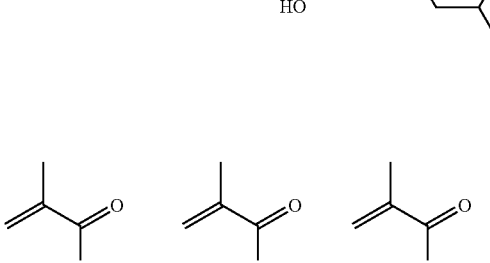
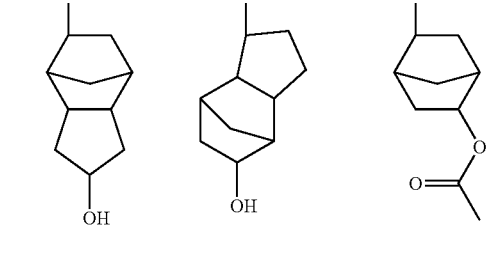
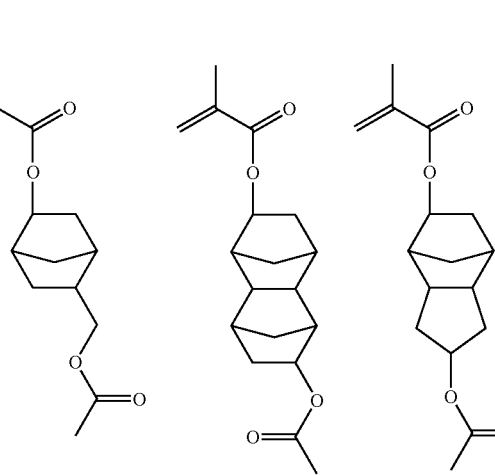

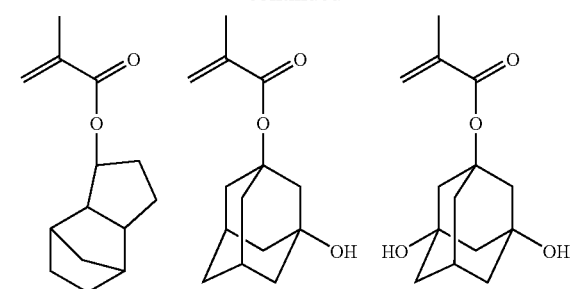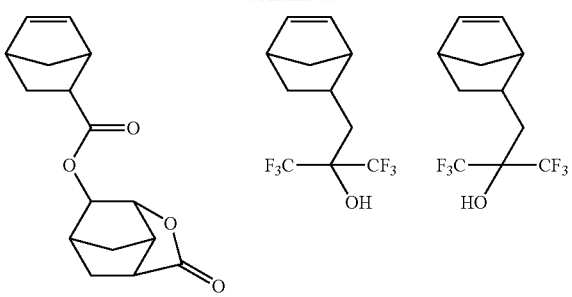

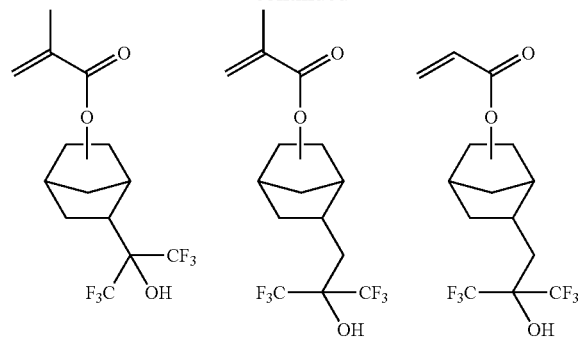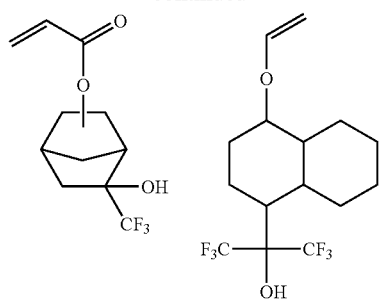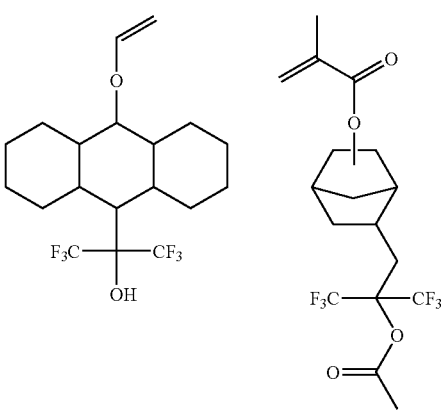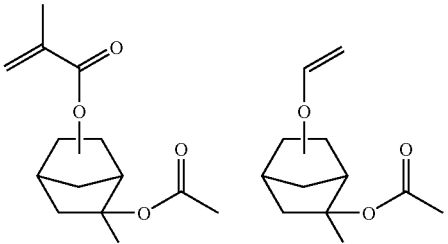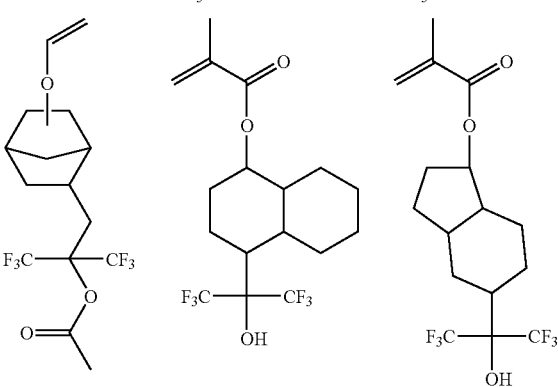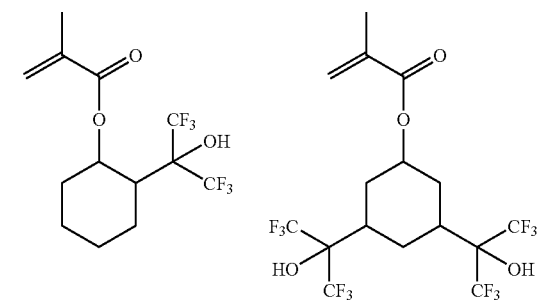

49
-continued
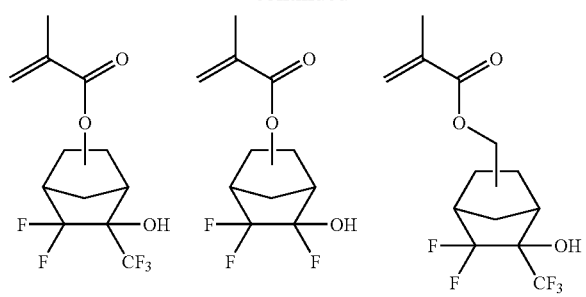
50
-continued
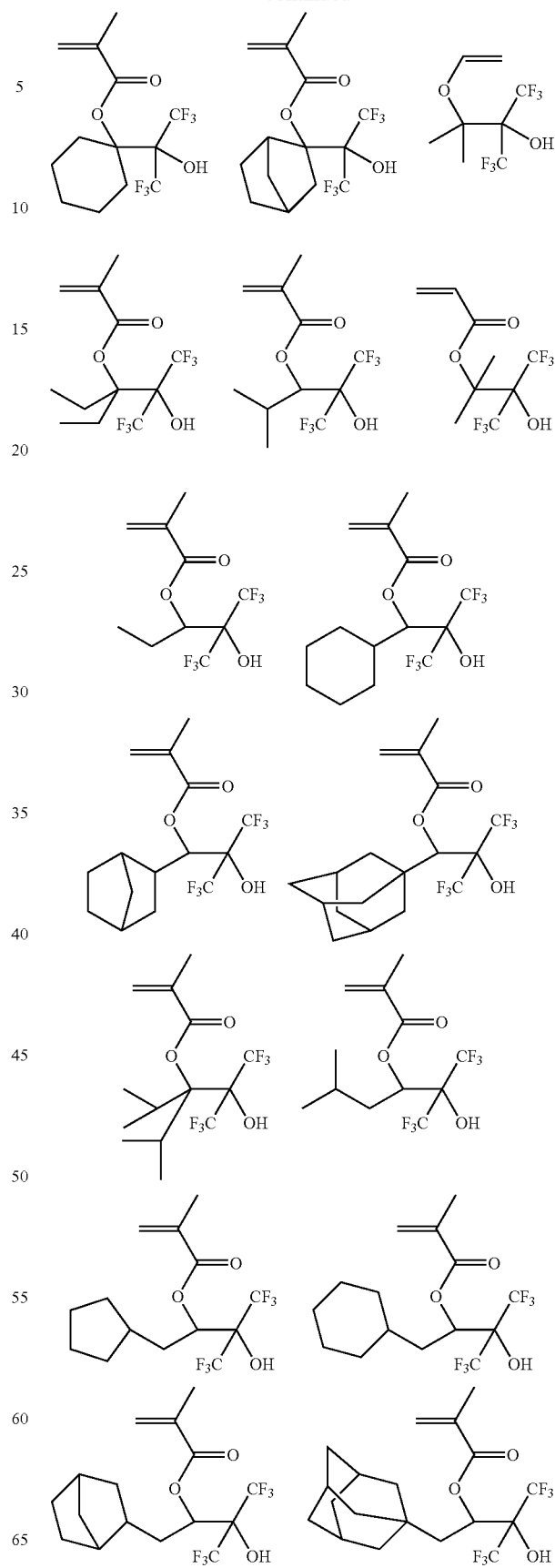

51
-continued
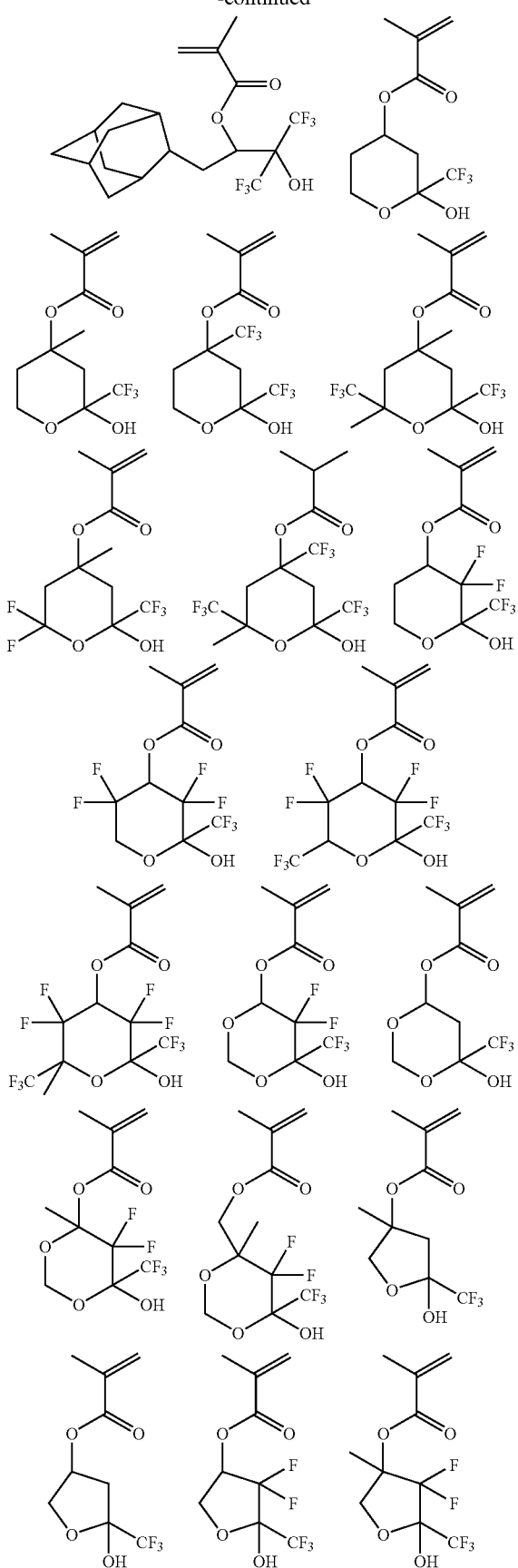
52
-continued
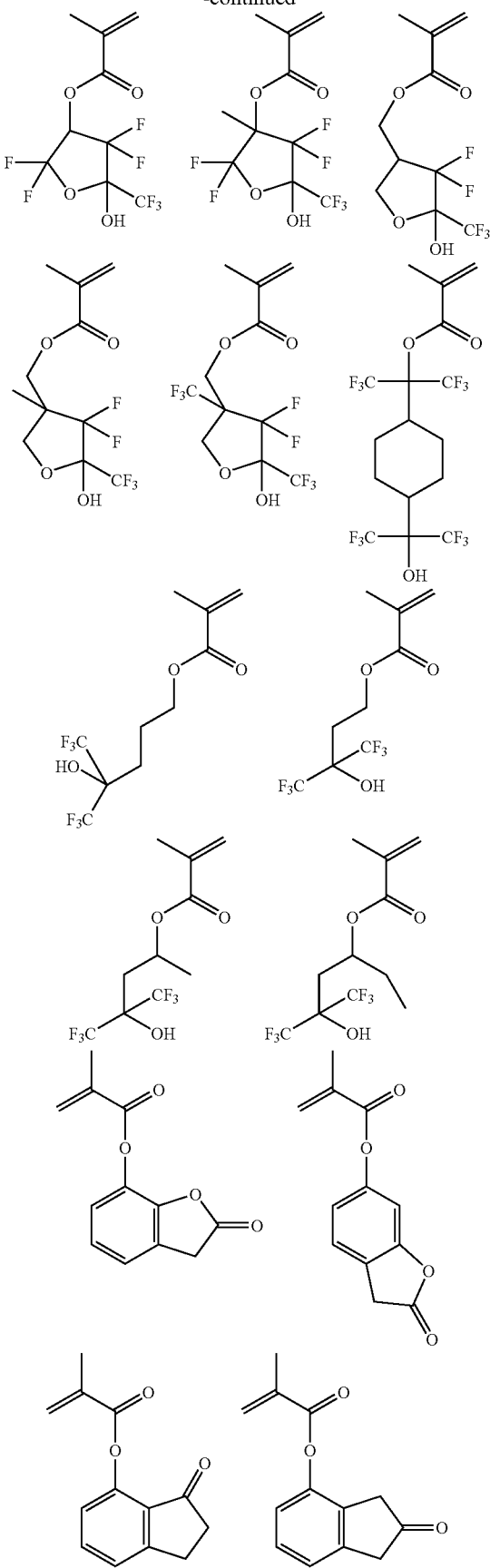

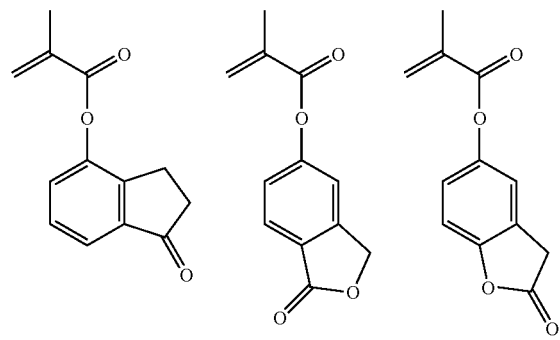
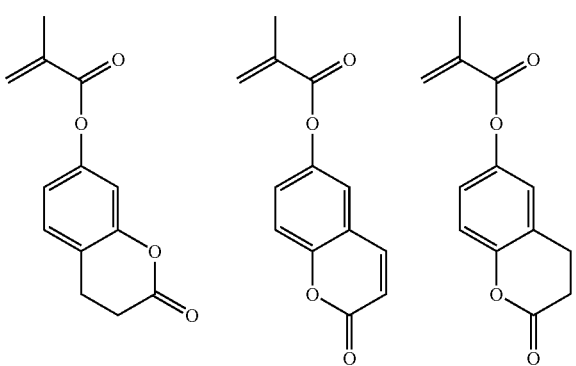
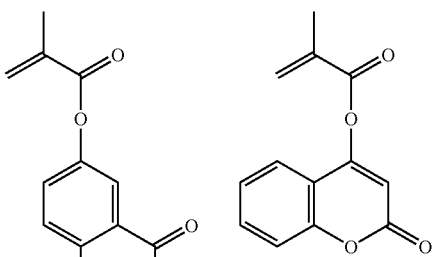
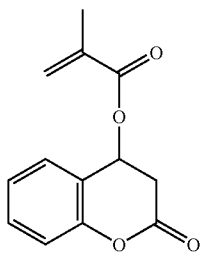
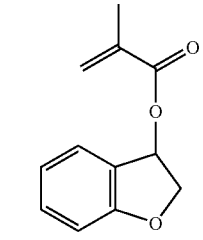
Of the recurring units (c), those having an α-trifluoromethyl alcohol group or carboxyl group are preferably incorporated in copolymers because they improve the alkali dissolution rate of the developed pattern after heating. Examples of recurring units having a carboxyl group are given below.
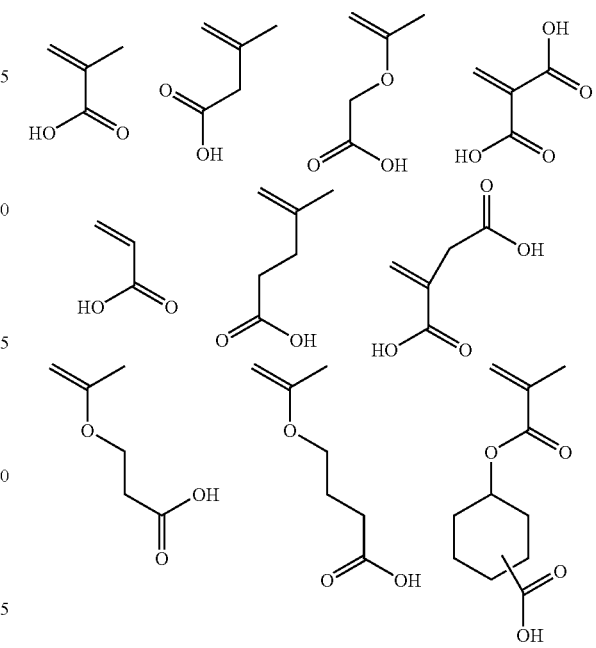

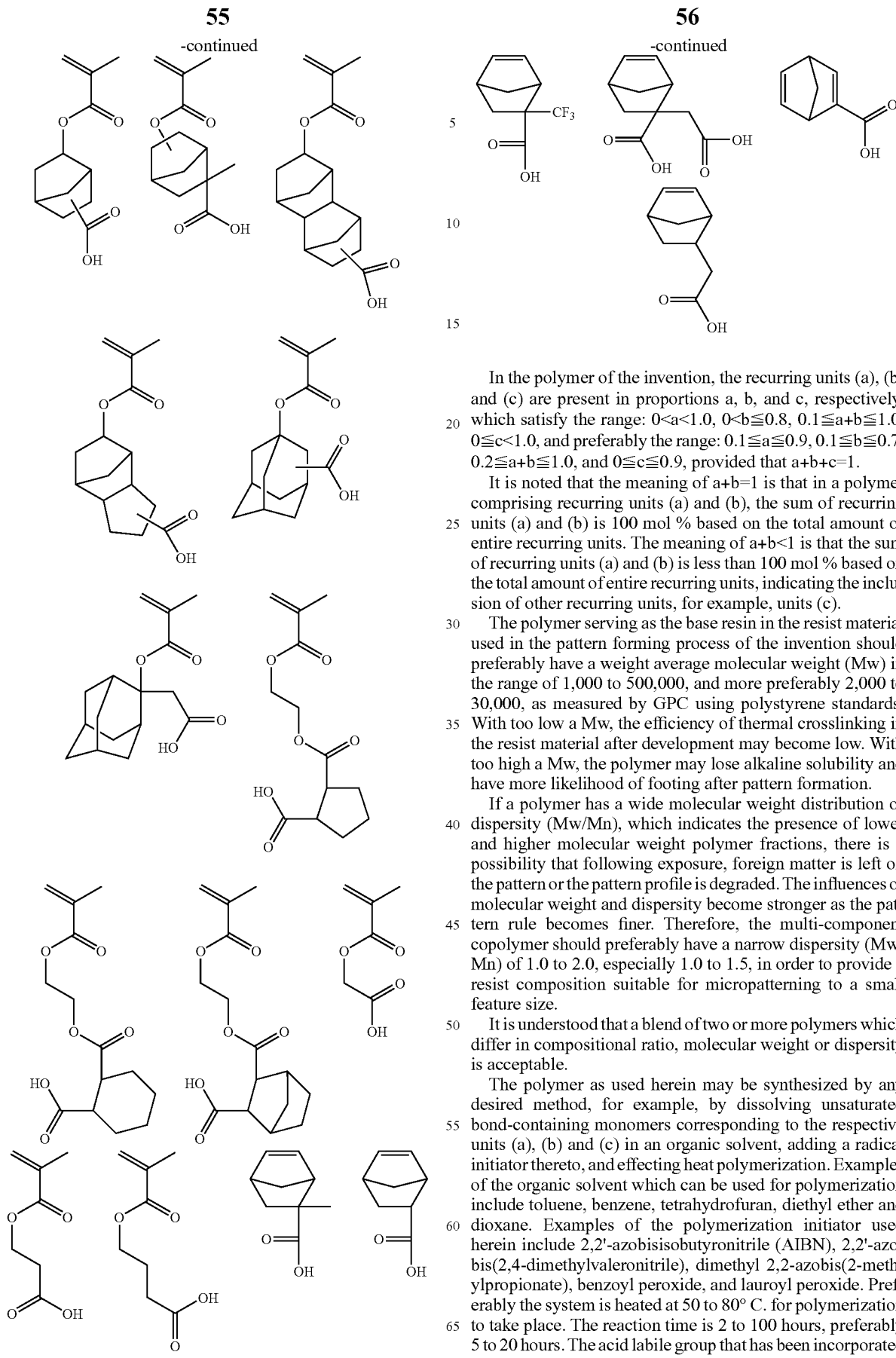

In the polymer of the invention, the recurring units (a), (b) and (c) are present in proportions a, b, and c, respectively, which satisfy the range: $0<a<1.0$, $0<b\leq 0.8$, $0.1\leq a+b\leq 1.0$, $0\leq c<1.0$, and preferably the range: $0.1\leq a\leq 0.9$, $0.1\leq b\leq 0.7$, $0.2\leq a+b\leq 1.0$, and $0\leq c\leq 0.9$, provided that $a+b+c=1$.

It is noted that the meaning of $a+b=1$ is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (c).

The polymer serving as the base resin in the resist material used in the pattern forming process of the invention should preferably have a weight average molecular weight (Mw) in the range of 1,000 to 500,000, and more preferably 2,000 to 30,000, as measured by GPC using polystyrene standards. With too low a Mw, the efficiency of thermal crosslinking in the resist material after development may become low. With too high a Mw, the polymer may lose alkaline solubility and have more likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a), (b) and (c) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once eliminated with an acid catalyst and thereafter protected or partially protected.

As described previously, the pattern forming process of the invention comprises the steps of coating the positive resist composition described above onto a substrate, prebaking the resist composition to form a resist film, exposing a selected area of the resist film to high-energy radiation, post-exposure baking, and developing the resist film with an alkaline developer to dissolve the exposed area thereof to form a resist pattern such as a dot pattern. The subsequent step is to treat the resist pattern (area unexposed to high-energy radiation) so as to generate an acid, thereby eliminating acid labile groups on the polymer (i.e., deprotection) and inducing crosslinking to the polymer in the resist pattern. In this deprotected and crosslinked state, the polymer has a dissolution rate in excess of 2 nm/sec, preferably of 3 to 5,000 nm/sec, and more preferably 4 to 4,000 nm/sec in an alkaline developer. It is preferred in attaining the objects of the invention that the dissolution rate of the polymer is higher than the dissolution rate of the reversal film (to be described later) in the same alkaline developer by a factor of 2 to 250,000, and especially 5 to 10,000.

In order that the polymer have a desired, dissolution rate in the deprotected and crosslinked state, the polymer formulation is preferably designed such that the acid labile group-bearing recurring units of formula (2) account for 10 mol % to 90 mol %, and more preferably 12 mol % to 80 mol % of the entire recurring units.

The resist composition used in the pattern forming process of the invention may further comprise an organic solvent, a compound capable of generating an acid in response to high-energy radiation (known as "acid generator"), and optionally, a dissolution regulator, a basic compound, a surfactant, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

The resist composition may further comprise one or more of an organic solvent, basic compound, dissolution regulator, surfactant, and acetylene alcohol. Their examples are described in JP-A 2008-111103. Specifically, exemplary organic solvents are described in paragraphs [0144] to [0145], exemplary basic compounds in paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. The organic solvent may be added in an amount of 100 to 10,000 parts, and specifically 300 to 8,000 parts by weight per 100 parts by weight of the base resin. The basic compound may be added in an amount of 0.0001 to 30 parts, and specifically 0.001 to 20 parts by weight per 100 parts by weight of the base resin.

In an embodiment wherein a thermal acid generator in the form of an ammonium salt is added to the photoresist composition in an amount of 0.001 to 20 parts, preferably 0.01 to 10 parts by weight per 100 parts by weight of the base resin, an acid can be generated by heating. In this embodiment, acid generation, crosslinking reaction and deprotection reaction of acid labile groups proceed simultaneously. The preferred heating conditions include a temperature of 100 to 300° C., and especially 130 to 250° C., and a time of 10 to 300 seconds. This results in a resist film which meets the necessary properties for positive/negative reversal including alkaline solubility and solvent insolubility and has an increased mechanical strength sufficient to prevent deformation of the pattern by heating.

Suitable ammonium salts serving as the thermal acid generator include compounds of the formula (P1a-2).

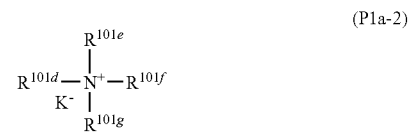

(P1a-2)

Herein $K^-$ is a sulfonate having at least one fluorine substituted at α-position, or perfluoroalkylimidate or perfluoroalkylmethidate. $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups. Alternatively, $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

Examples of $K^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

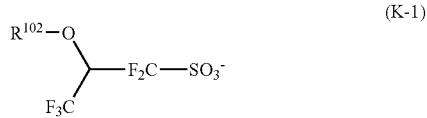

(K-1)

(K-2)

In formula (K-1), $R^{102}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl radical or lactone ring and in which some or all hydrogen atoms may be substituted by fluorine atoms. In formula (K-2), $R^{103}$ is hydrogen, a straight, branched or cyclic $C_1$-$C_{20}$ alkyl group, $C_2$-$C_{20}$ alkenyl group or $C_6$-$C_{20}$ aryl group.

In a further embodiment, a polymeric additive comprising recurring units having amino and fluoroalkyl groups may be added to the resist composition. The polymeric additive may be added in an amount of 0.01 to 20 parts, preferably 0.1 to 15 parts by weight per 100 parts by weight of the base resin. The polymeric additive segregates toward the resist film surface after coating for eventually preventing a resist pattern as developed from slimming and enhancing the rectangularity thereof. If a dot pattern as developed is slimmed or thinned, such slimming may interfere with image reversal. Addition of a polymer as shown below is effective for preventing the pattern film from slimming.

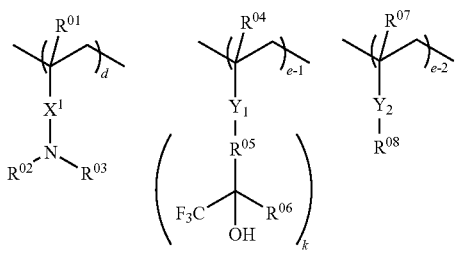

Herein, $R^{01}$, $R^{04}$, and $R^{07}$ are each independently hydrogen or methyl. $X_1$, $Y_1$ and $Y_2$ are each independently a single bond, —O—$R^{09}$—, —C(=O)—O—$R^{09}$— or —C(=O)—NH—$R^{09}$—, straight or branched $C_1$-$C_4$ alkylene, or phenylene group. $R^{09}$ is a straight, branched or cyclic $C_1$-$C_{10}$ alkyl group, which may contain an ester (—COO—) or ether (—O—) radical. The subscript k is 1 or 2. In case of k=1, $Y_1$ is a single bond, —O—$R^{09}$—, —C(=O)—O—$R^{09}$— or —C(=O)—NH—$R^{09}$—, straight or branched $C_1$-$C_4$ alkylene, or phenylene group, wherein $R^{09}$ is as defined above. In case of k=2, $Y_1$ is —O—$R^{101}$=, —C(=O)—O—$R^{101}$= or —C(=O)—NH—$R^{101}$=, straight or branched $C_1$-$C_4$ alkylene group with one hydrogen eliminated, or phenylene group with one hydrogen eliminated, wherein $R^{101}$ is a straight, branched or cyclic $C_1$-$C_{10}$ alkylene group with one hydrogen atom eliminated, which may contain an ester or ether radical. $R^{02}$ and $R^{03}$ are each independently hydrogen, a straight, branched or cyclic $C_1$-$C_{20}$ alkyl group or $C_2$-$C_{20}$ alkenyl group which may contain a hydroxyl, ether, ester, cyano, amino radical, double bond, or halogen atom, or a $C_6$-$C_{10}$ aryl group. $R^{02}$ and $R^{03}$ may bond together to form a $C_3$-$C_{20}$ ring with the nitrogen atom to which they are attached. $R^{05}$ is a straight, branched or cyclic $C_1$-$C_{12}$ alkylene group. $R^{06}$ is hydrogen, fluorine, methyl, trifluoromethyl or difluoromethyl, or $R^{06}$ may bond with $R^{05}$ to form a $C_2$-$C_{12}$ aliphatic ring with the carbon atom to which they are attached, which ring may contain an ether radical, fluorinated alkylene or trifluoromethyl radical. $R^{08}$ is a straight, branched or cyclic $C_1$-$C_{20}$ alkyl group which is substituted with at least one fluorine atom and which may contain an ether, ester or sulfonamide radical. The subscripts d, e-1, and e-2 are numbers in the range: 0<d<1.0, 0≦(e-1)<1.0, 0≦(e-2)<1.0, 0<(e-1)+(e-2)<1.0, and 0.5≦d+(e-1)+(e-2)≦1.0.

Reversal Film

On the other hand, the reversal film used has a dissolution rate of 0.02 nm/sec to 2 nm/sec, preferably 0.05 nm/sec to 1 nm/sec in an alkaline developer used in the reversal step of the inventive process. A dissolution rate of less than 0.02 nm/sec suggests that the reversal film may not be dissolved to the top level of the first resist pattern, resulting in a failure of pattern reversal or a surface layer of the reversed pattern becoming bulged. A dissolution rate of more than 2 nm/sec may lead to the disadvantage that the remaining reversal film is lessened or the hole size of the reversal pattern is enlarged.

In order that the film surface be adequately dissolved during development to form a trench pattern, the alkaline dissolution rate is controlled to a range of 0.05 nm/sec to 1 nm/sec. Outside the range, a faster dissolution rate may lead to a greater film slimming during development. At a slower dissolution rate, the film surface may not be dissolved, failing to configure a trench pattern. For the purpose of tailoring to an appropriate dissolution rate, units providing an alkaline dissolution rate of at least 1 nm/sec and units providing an alkaline dissolution rate of up to 0.05 nm/sec are copolymerized. Optimizing the copolymerization ratio leads to a material having an optimum dissolution rate.

The film (reversal film) used in the pattern forming process and having a dissolution rate of 0.02 nm/sec to 2 nm/sec in the alkaline developer may be formed of hydrocarbon base materials or silicon-containing materials. Preferably used are materials comprising polymers having phenolic hydroxyl, α-trifluoromethylhydroxyl and carboxyl groups as the base polymer. The preferred silicon-containing materials are those having silanol groups as well as the foregoing alkali soluble groups. Examples of the polymers having phenolic hydroxyl groups include cresol novolac resins, phenol oligomers, bisphenol oligomers, bisphenol novolac resins, bisnaphthol oligomers, bisnaphthol novolac resins, calixarene, calix resorcinol, polyhydroxystyrene, polyhydroxyvinylnaphthalene, polyhydroxyindene and copolymers thereof, carboxystyrene polymers, carboxyvinylnaphthalene and copolymers thereof, α-trifluoromethylhydroxy-containing styrene polymers and copolymers, methacrylic acid and carboxyl-containing (meth)acrylate polymers and copolymers, α-trifluoromethylhydroxy-containing (meth)acrylate polymers and copolymers.

Since most polymers consisting of recurring units having phenolic hydroxyl, α-trifluoromethylhydroxyl and carboxyl groups have an alkaline dissolution rate of at least 1 nm/sec, they are copolymerized with units providing an alkaline dissolution rate of up to 0.05 nm. Examples of suitable units providing an alkaline dissolution rate of up to 0.05 nm include those in which the hydrogen atom of phenolic hydroxyl, α-trifluoromethylhydroxyl or hydroxyl moiety of carboxyl group is replaced by a $C_1$-$C_{20}$ alkyl, $C_3$-$C_{20}$ alkenyl, $C_6$-$C_{20}$ aryl or acid labile group. Also included are styrene, indene, indole, chromone, coumarone, acenaphthylene, norbornadiene, norbornene, vinylnaphthalene, vinylanthracene, vinylcarbazole, vinyl ether derivatives, lactone-containing (meth) acrylates, and hydroxy-containing (meth)acrylates.

More specifically, reactants from which the polymer for use in the reversal film is prepared should have alkali soluble groups such as phenolic hydroxyl, α-trifluoromethylhydroxyl and carboxyl groups. Partial protection of alkali soluble groups or combination thereof with substantially alkali insoluble groups is sometimes necessary to tailor the alkaline dissolution rate.

Suitable polymers having a phenolic hydroxyl group include those novolac resins obtained by reaction of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, or the like, in the presence of aldehydes. Polymers of polymerizable olefin compounds having a phenolic hydroxyl group include polymers of hydroxystyrene, hydroxyvinylnaphthalene, hydroxyvinylanthracene, hydroxyindene, hydroxyacenaphthylene, and the monomers shown below.
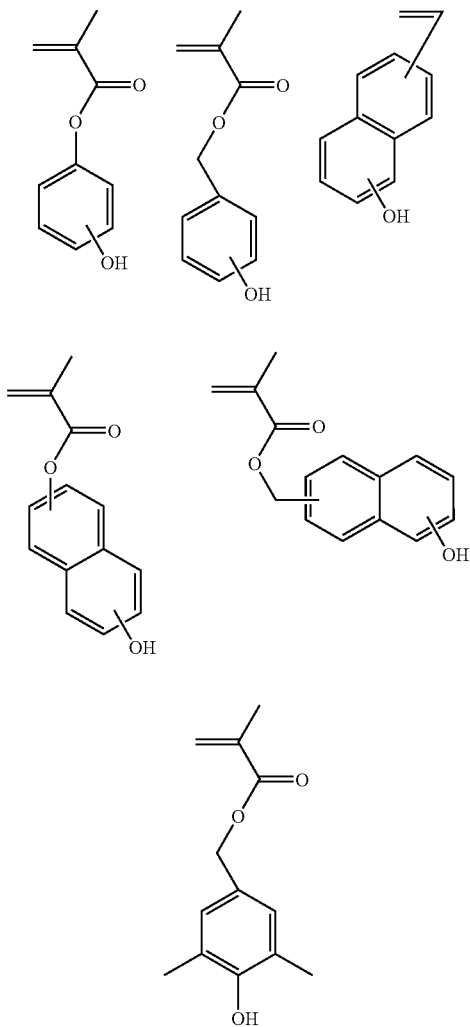
Polymers of monomers from which carboxyl-bearing recurring units are derived may also be used as the material for forming the reversal film. Examples of the monomers are shown below.
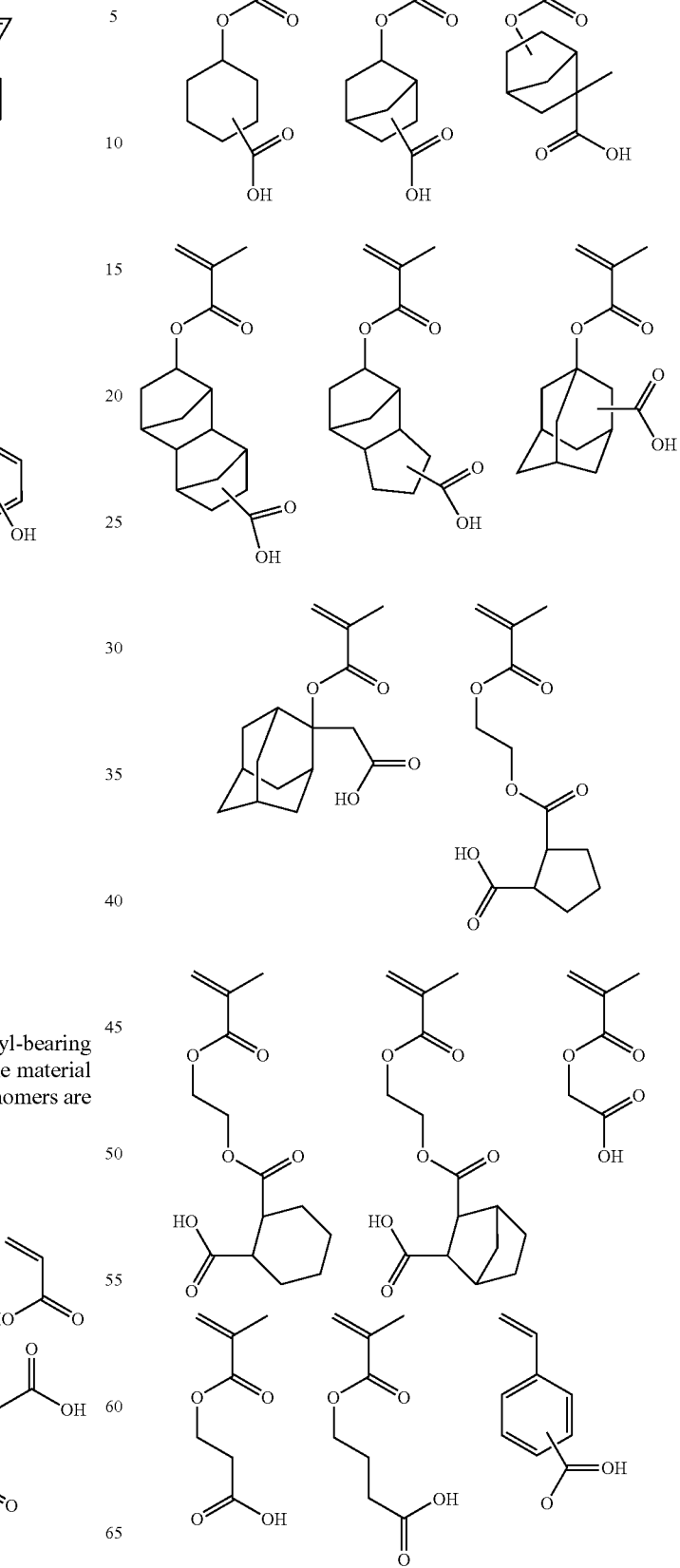
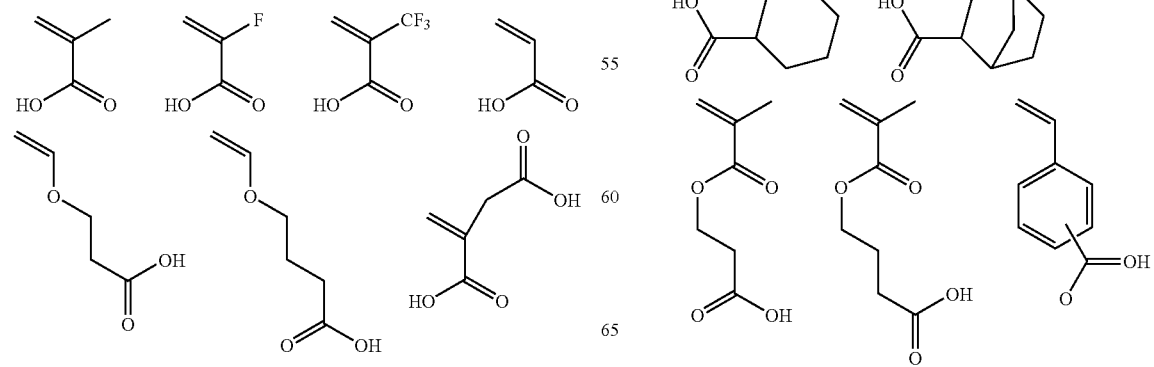

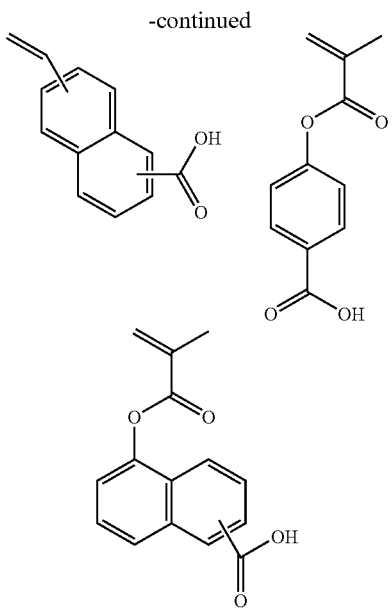

For partial protection of phenolic hydroxyl or carboxyl groups for the purpose of tailoring the alkaline dissolution rate, the hydrogen atom of the hydroxyl group or hydroxyl moiety of the carboxyl group is preferably replaced by a $C_1$-$C_{20}$ alkyl, $C_2$-$C_{20}$ alkenyl, $C_6$-$C_{20}$ aryl, acetyl, pivaloyl or acid labile group. The acid labile group used herein may be the same as described above.

For the purpose of tailoring the alkaline dissolution rate, substantially alkali insoluble recurring units may also be copolymerized. Examples of the substantially alkali insoluble recurring units include recurring units derived from alkyl or aryl(meth)acrylates, hydroxyl or lactone-bearing (meth)acrylates, styrene, vinylnaphthalene, vinylanthracene, vinylpyrene, vinylcarbazole, indene, acenaphthylene, norbornenes, norbornadienes, tricyclodecenes, and tetracyclododecenes.

The preferred base polymers from which the reversal film is formed are hydrocarbon polymers, especially polymers comprising aromatic group-bearing hydrocarbons.

As the silicon-containing material for use in the reversal film-forming composition, silicon polymers based on silsesquioxane are preferred from the standpoint of etch resistance.

The base polymer should preferably have a weight average molecular weight (Mw) of 1,000 to 200,000, and more preferably 1,500 to 100,000, as measured by GPC versus polystyrene standards. Also it should preferably have a dispersity (Mw/Mn) of 1.0 to 7.0, and more preferably 1.02 to 5.0.

In addition to the base polymer described above, the reversal film-forming composition may comprise a scarcely alkali soluble material for pattern reversal, an alkali soluble surfactant for enhancing a surface alkali dissolution rate, an alkali soluble etching resistance improver, a basic quencher, an organic solvent and the like.

Examples of the scarcely alkali soluble material for pattern reversal include fullerenes having phenol group or malonic acid substituted thereon and oligomeric phenol compounds. These materials have a high carbon density and the function of improving etching resistance as well. Pattern reversal materials may be used alone or in a blend of two or more.

Examples of suitable materials include the phenolic compounds described in JP-A 2006-259249, JP-A 2006-259482, JP-A 2006-285095, and JP-A 2006-293298, the bisnaphthol compounds described in JP-A 2007-199653, and fluorene compounds having a phenol group, including 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, tetrahydrospirobiindene compounds, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, tritylphenol, etc. These materials may be used as the alkali soluble etching resistance improver.

The above material is preferably added in an amount of 0 to 200 parts, and more preferably 0 to 100 parts by weight per 100 parts by weight of the base polymer. When added, the amount of the material is at least 1 phr, and more preferably at least 5 phr.

Enhancing the alkali solubility of only a surface layer of the pattern reversal film is advantageous for smoothing dissolution of the pattern reversal film building up over the positive resist pattern which has been altered to be alkali soluble, and for enhancing the dimensional control of a trench pattern or hole pattern converted from the positive pattern. To enhance the surface alkali solubility, an alkali soluble surfactant, especially fluorochemical surfactant may be added. The preferred fluorochemical surfactants are those comprising either one or both of recurring units (s-1) and (s-2) represented by the general formula (3).

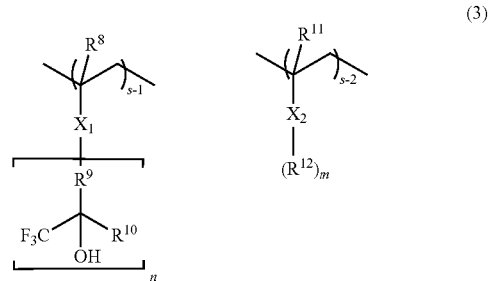

Herein, $R^8$ and $R^{11}$ are each independently hydrogen or methyl. The letter n is equal to 1 or 2. In case of n=1, $X_1$ is a phenylene group, —O—, —C(=O)—O—$R^{14}$—, or —C(=O)—NH—$R^{14}$— wherein $R^{14}$ is a single bond or a straight or branched $C_1$-$C_4$ alkylene group which may have an ester or ether radical. In case of n=2, $X_1$ is a phenylene group with one hydrogen atom eliminated (represented by —$C_6H_3$—), or —C(=O)—O—$R^{81}$= or —C(=O)—NH—$R^{81}$= wherein $R^{81}$ is a straight, branched or cyclic $C_1$-$C_{10}$ alkylene group with one hydrogen atom eliminated, which may have an ester or ether radical. $R^9$ is a single bond or a straight, branched or cyclic $C_1$-$C_{12}$ alkylene group. $R^{10}$ is hydrogen, fluorine, methyl, trifluoromethyl or difluoromethyl, or $R^{10}$ and $R^9$ may bond together to form a ring of 3 to 10 carbon atoms (exclusive of aromatic ring) with the carbon atom to which they are attached, which ring may have an ether, fluorinated alkylene or trifluoromethyl radical. $X_2$ is a phenylene group, —O—, —C(=O)—O—$R^{13}$—, or —C(=O)—NH—$R^{13}$— wherein $R^{13}$ is a single bond or a straight or branched $C_1$-$C_4$ alkylene group which may have an ester or ether radical. $R^{12}$ is fluorine or a straight, branched or cyclic $C_1$-$C_{20}$ alkyl group which is substituted with at least one fluorine atom and which may have an ether, ester or sulfonamide radical. The letter m is an integer of 1 to 5 when $X_2$ is phenylene, and m is 1 when $X_2$ is otherwise.

Examples of the monomers from which units (s-1) are derived are illustrated below.

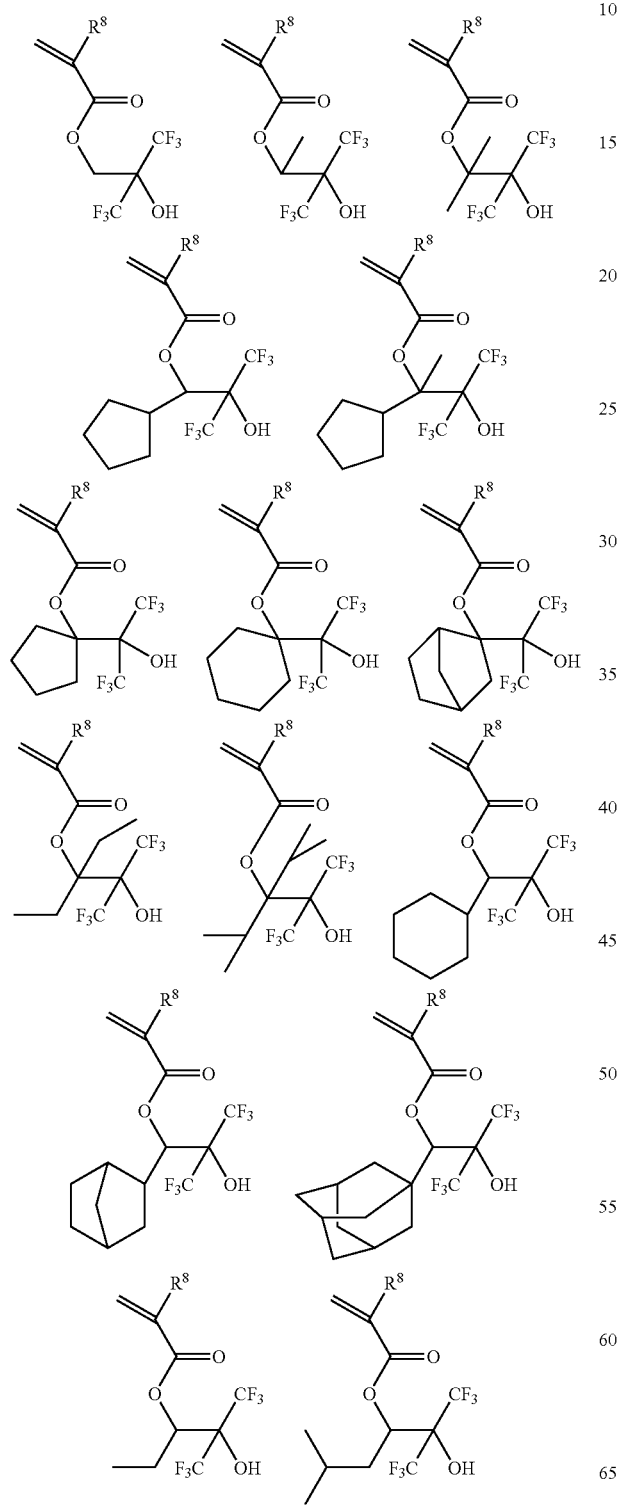

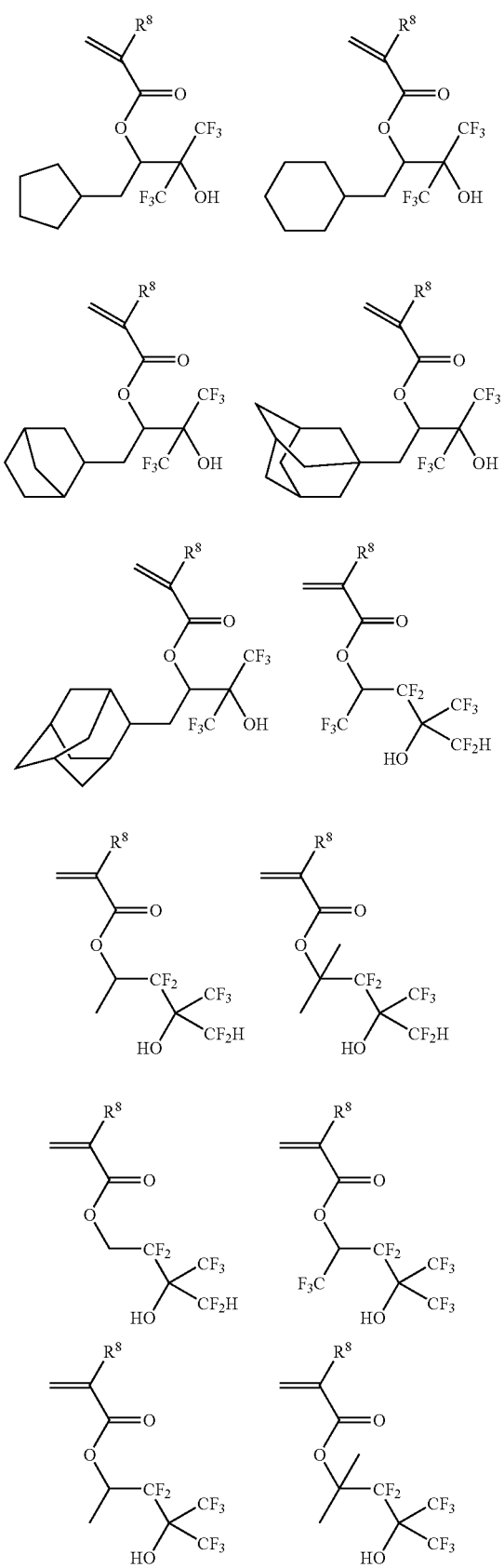

-continued

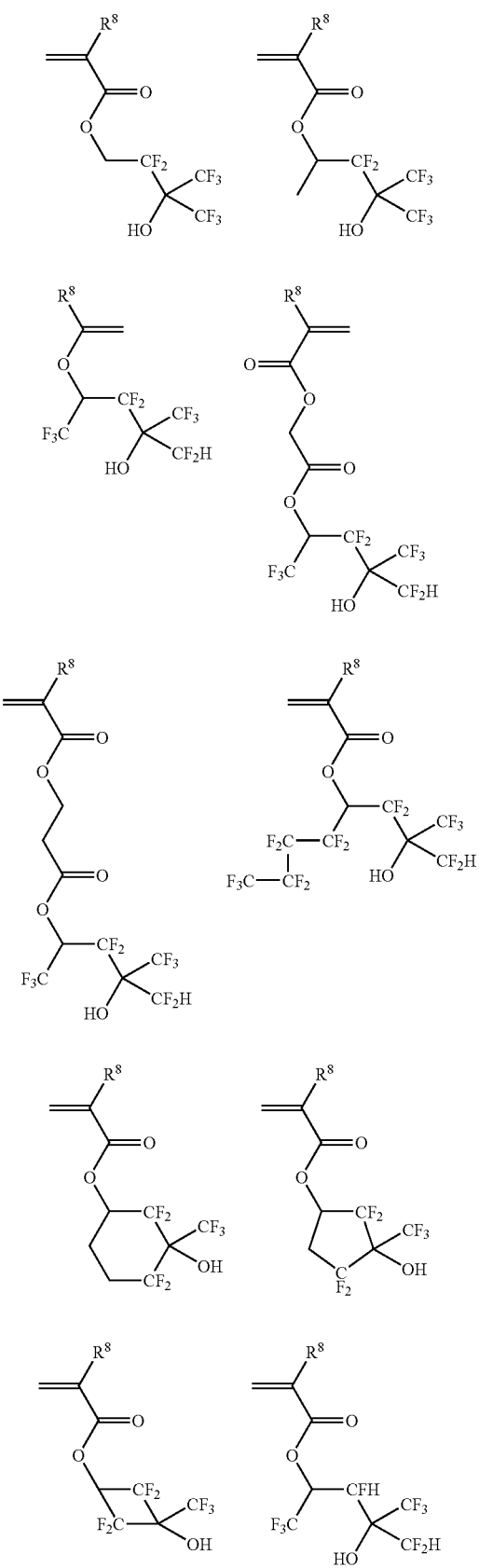
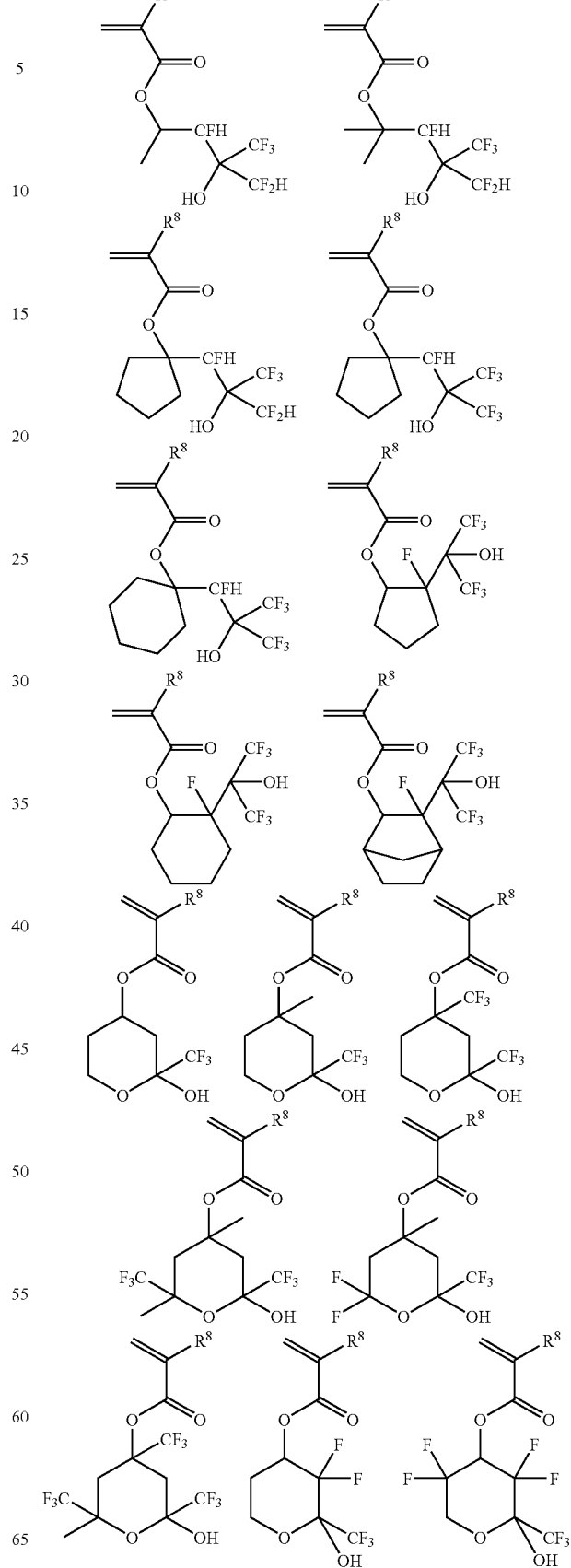

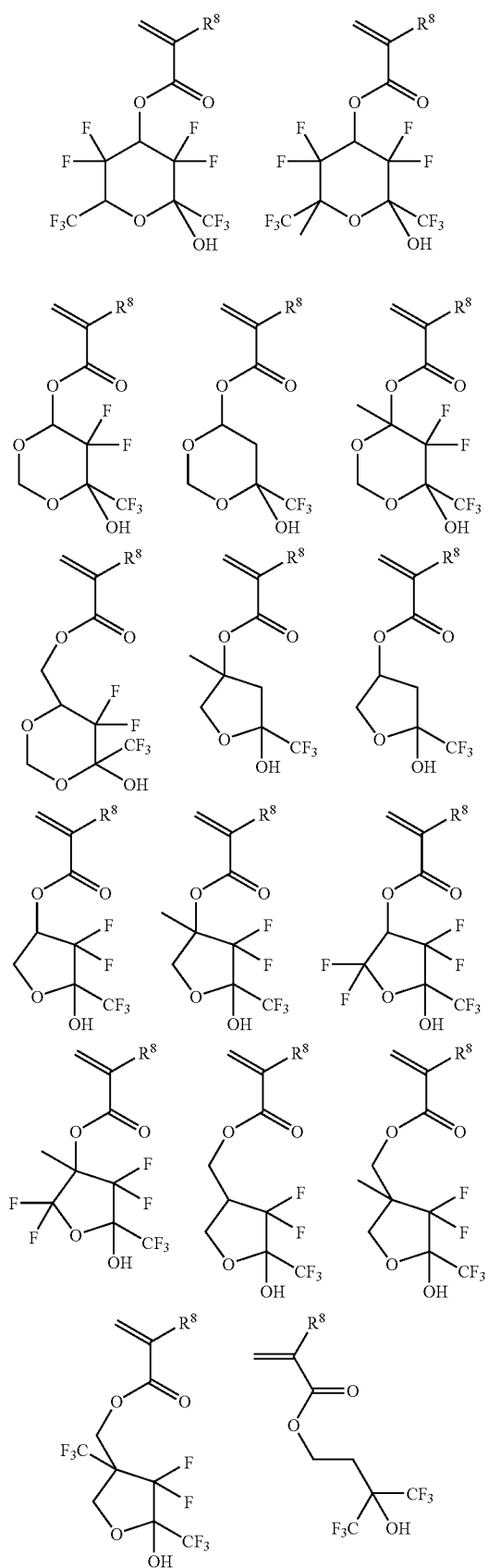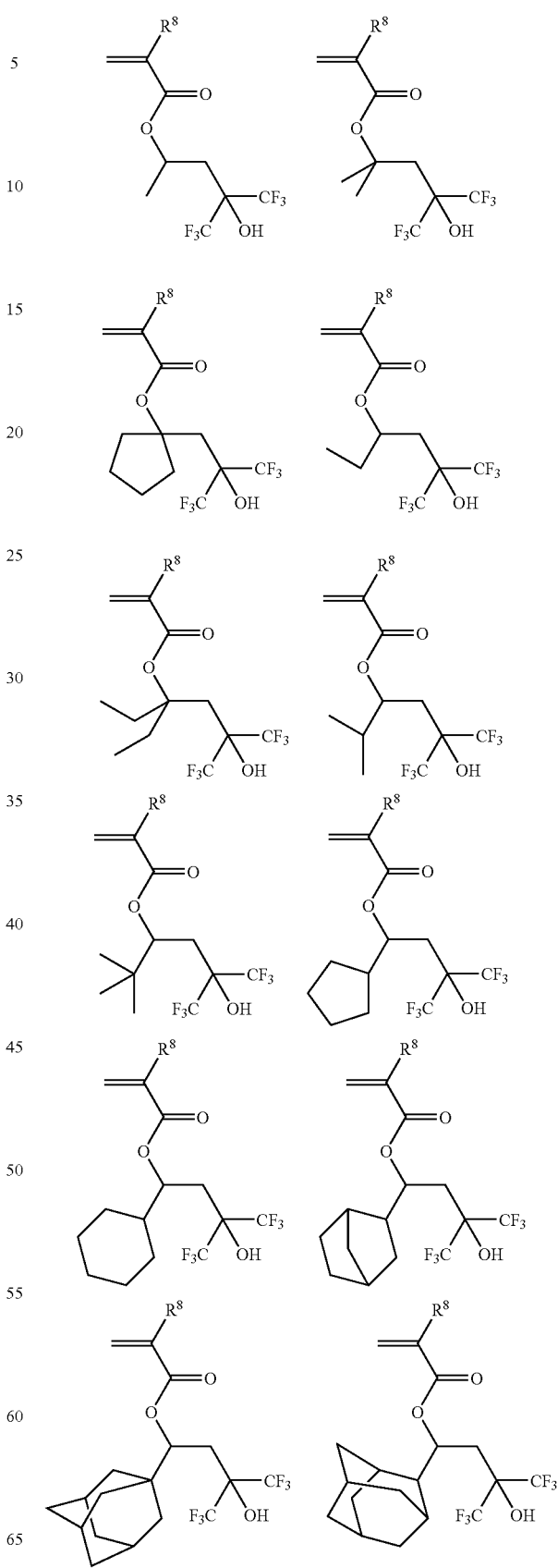

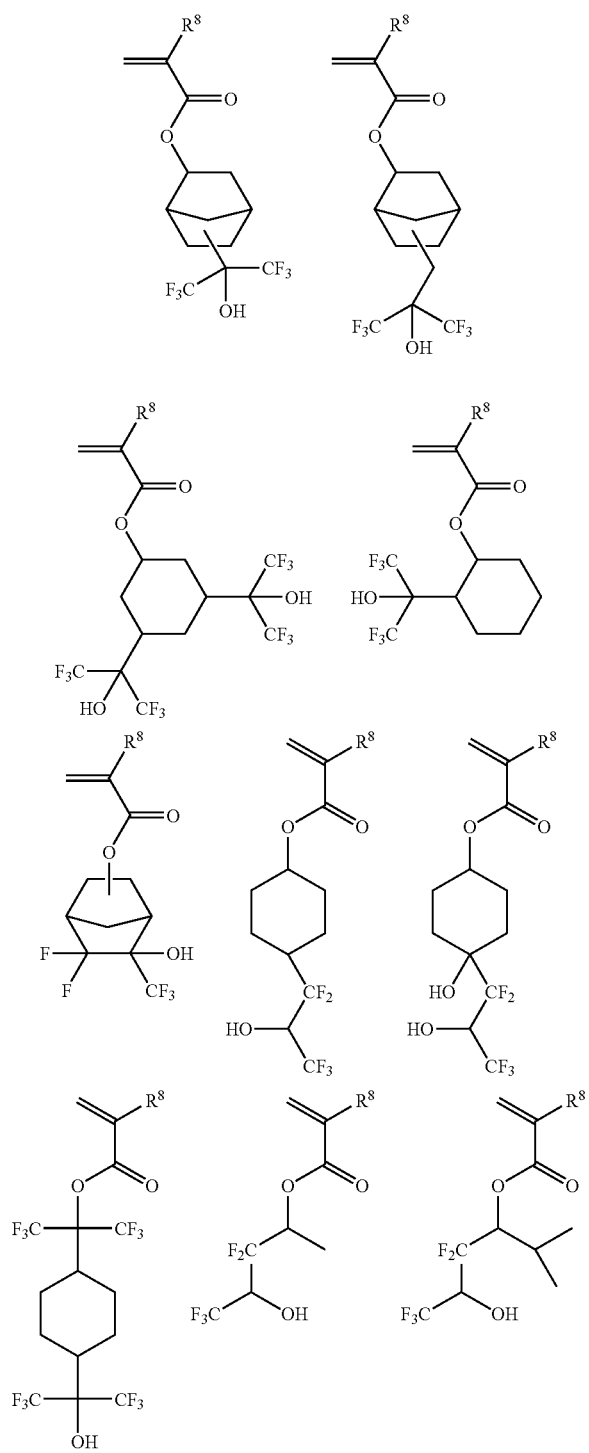
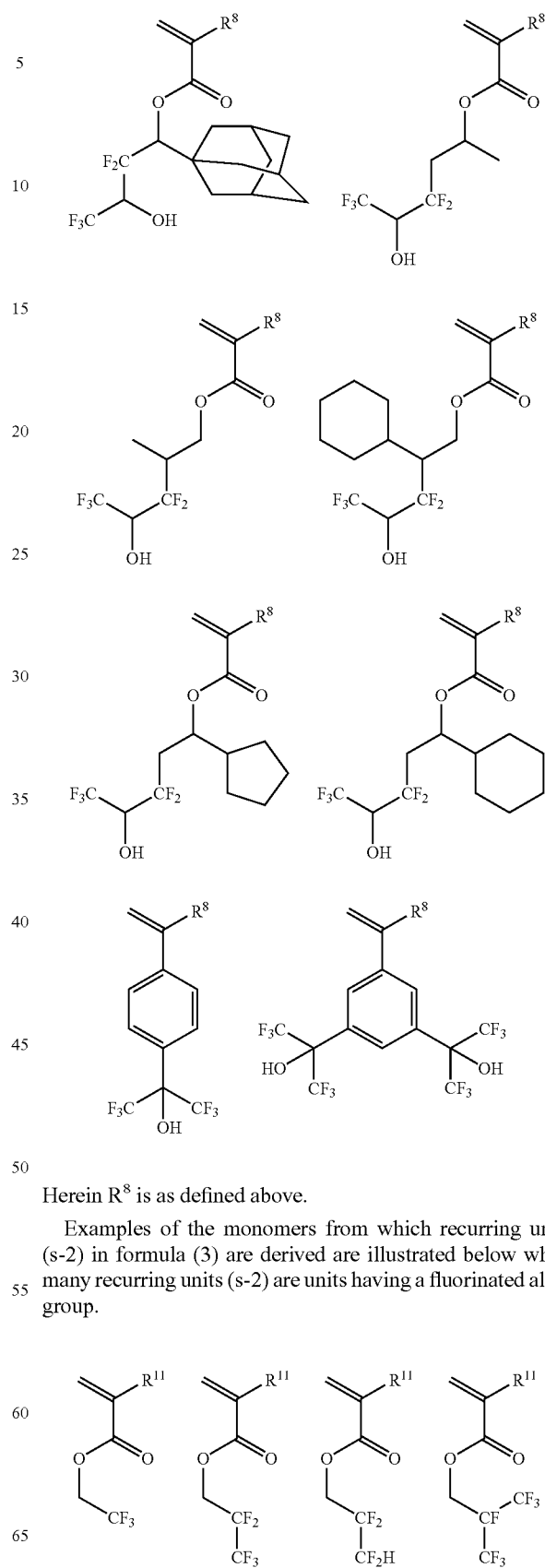
Herein R⁸ is as defined above.
Examples of the monomers from which recurring units (s-2) in formula (3) are derived are illustrated below while many recurring units (s-2) are units having a fluorinated alkyl group.

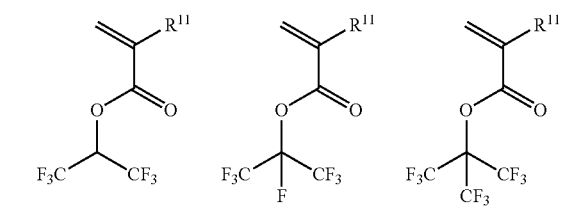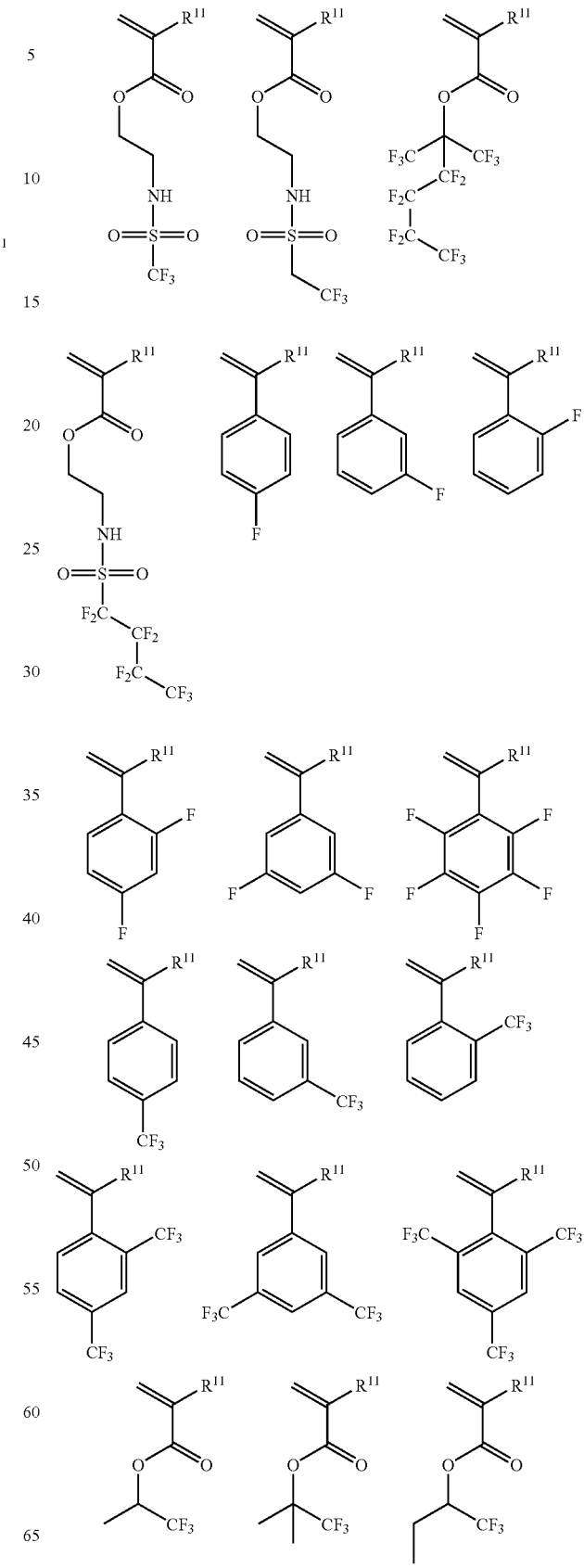

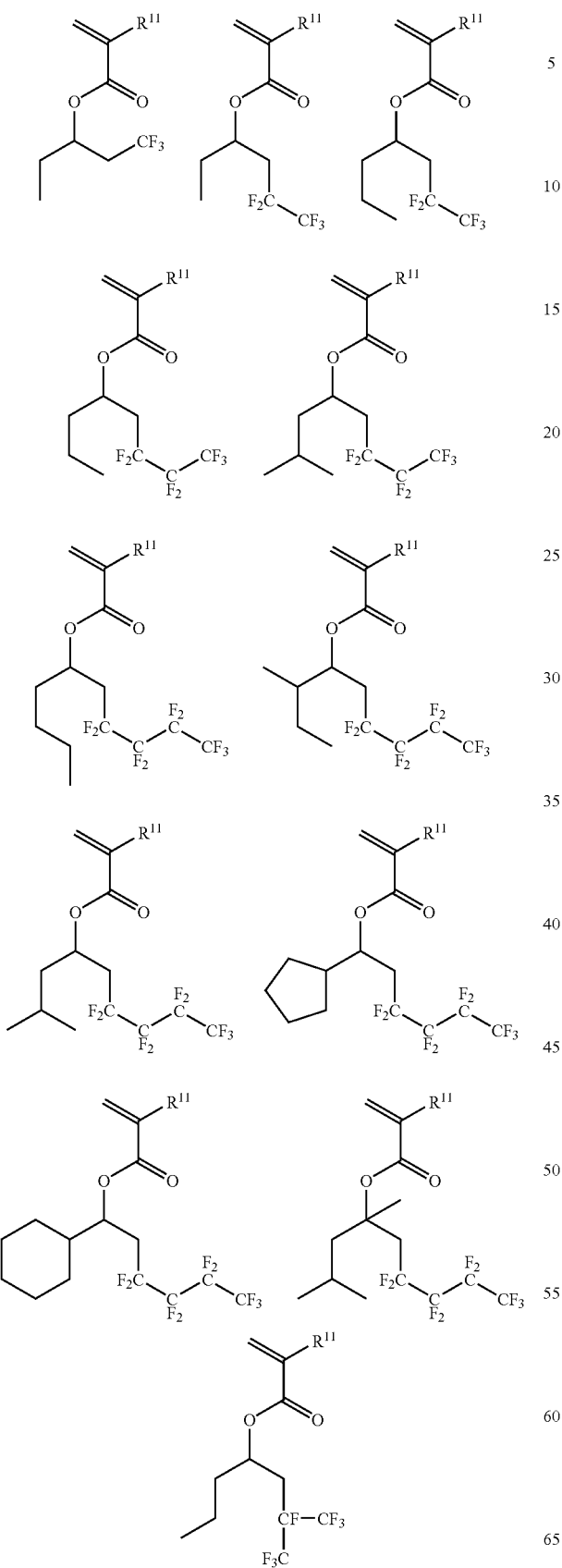
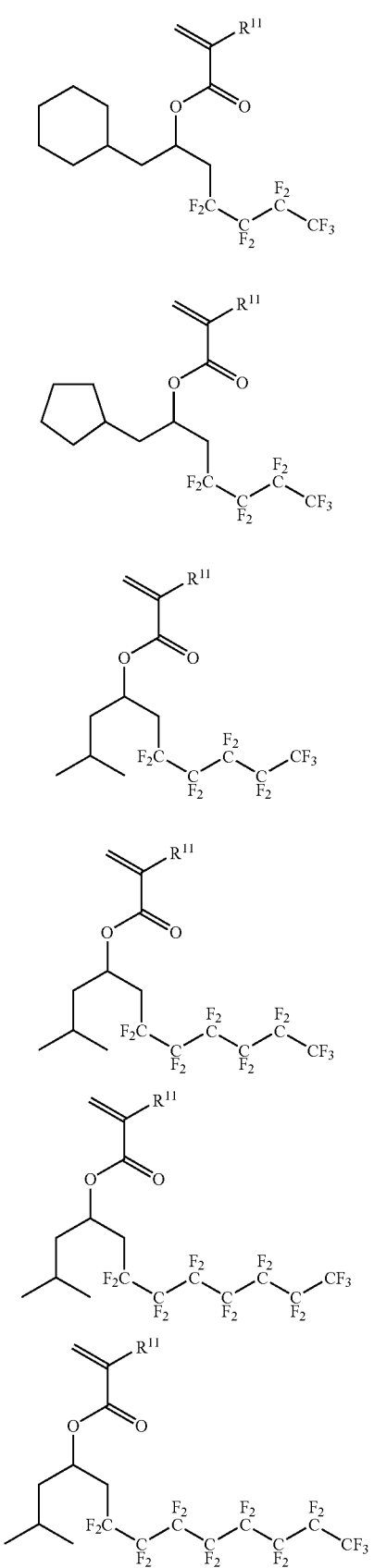

-continued

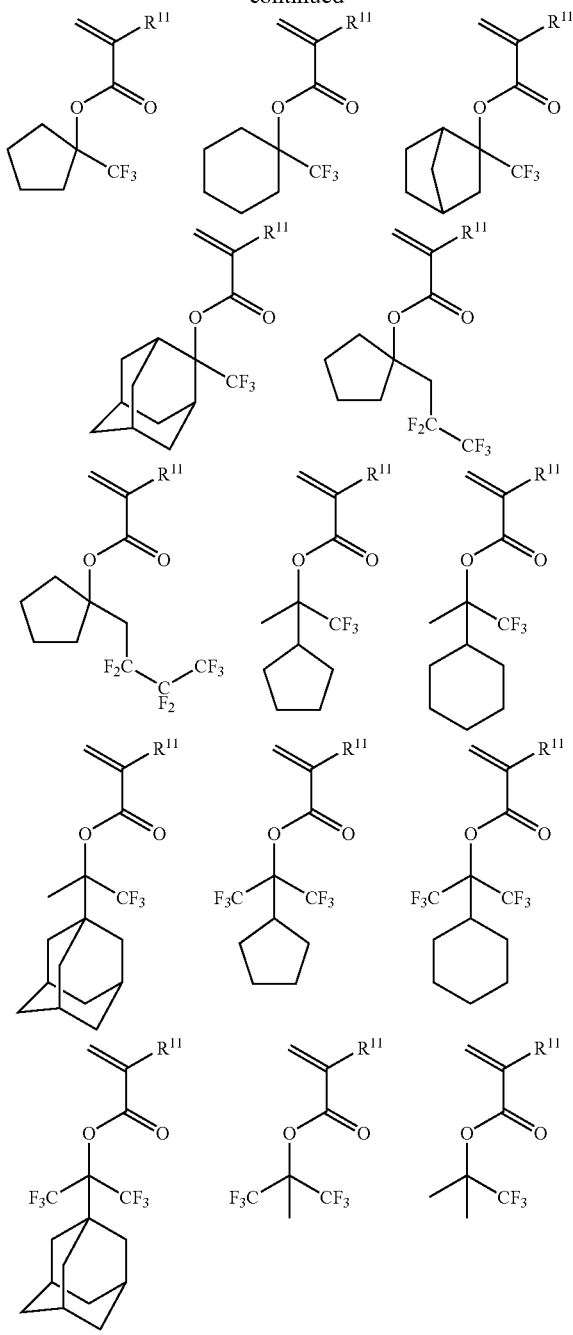

Herein $R^{11}$ is as defined above.

These recurring units (s-1) and (s-2) may be copolymerized with the above-described alkali soluble recurring units having a phenol or carboxyl group or substantially alkali insoluble recurring units (s-3). In these copolymers, the proportion of recurring units (s-1) and (s-2) is $0 \leq (s-1) \leq 1$, $0 \leq (s-2) \leq 1$, and $0 < (s-1)+(s-2) \leq 1$, preferably $0.1 < (s-1)+(s-2) \leq 1$, and more preferably $0.2 < (s-1)+(s-2) \leq 1$. Understandably, in the case of $(s-1)+(s-2)<1$, the balance consists of recurring units (s-3) described just above.

This alkali soluble surfactant should preferably have a weight average molecular weight (Mw) of 1,000 to 100,000 and more preferably 2,000 to 50,000.

The alkali soluble surfactant is preferably added in an amount of 0 to 50 parts, and more preferably 0 to 20 parts by weight per 100 parts by weight of the base polymer. Too much amounts of the surfactant may cause excessive thickness decrease or detract from etching resistance. When added, at least 1 phr of the surfactant is preferred.

The basic quencher used herein may be any of the same basic compounds as described in conjunction with the positive resist composition. Specifically, a basic compound may be added to the pattern reversal film used in the pattern forming process of the invention for preventing acid diffusion from the resist pattern as developed. Particularly when an acid labile group-substituted phenolic compound or carboxyl-containing compound is used as the component of the pattern reversal film, there arises the problem that the alkali dissolution rate increases due to diffusion of acid from the resist pattern and deprotection reaction, leading to the reversal pattern of an increased size or substantially reduced thickness. This problem is effectively overcome by adding a basic compound. Understandably the basic compounds added to the resist composition and the pattern reversal film composition may be the same or different.

The basic compound or basic quencher is preferably added in an amount of 0 to 10 parts, and more preferably 0 to 5 parts by weight per 100 parts by weight of the base polymer. When added, at least 0.1 phr of the quencher is preferred.

To the reversal film-forming composition, an onium salt acid generator may be added. When an onium salt is added to a reversal film-forming composition comprising a phenol base material as the base polymer, the composition has a reduced alkali dissolution rate due to the dissolution-inhibiting effect of the onium salt. The addition of an onium salt is effective for tailoring the alkali dissolution rate.

In the pattern reversal film-forming composition used in the pattern forming process of the invention, the organic solvent used may be selected from those used in the positive resist composition, and from alcohols of 3 to 10 carbon atoms and ethers of 8 to 12 carbon atoms which are favorable in preventing mixing with the positive resist coating (i.e., resist pattern). Illustrative examples of the $C_3$-$C_{10}$ alcohols include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the $C_8$-$C_{12}$ ethers include di-n-butyl ether, diisobutyl ether, di-sec-butyl ether, di-n-pentyl ether, diisopentyl ether, di-sec-pentyl ether, di-t-amyl ether, and di-n-hexyl ether.

These solvents may be used alone or in admixture of two or more. An aromatic solvent such as toluene, xylene or anisole may be mixed with the foregoing solvent.

The amount of the organic solvent used is preferably 200 to 3,000 parts, and more preferably 400 to 2,000 parts by weight per 100 parts by weight of the base polymer.

Process

Figure 4A:
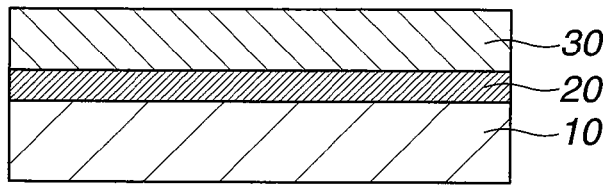
FIG. 4A shows that a processable substrate and a resist film are disposed on a substrate.

Now referring to the drawings, the pattern forming process of the invention is illustrated. First, the positive resist composition is coated on a substrate to form a resist film thereon. As shown in FIG. 4A, a resist film 30 of a positive resist composition is formed on a processable substrate 20 disposed on a substrate 10 directly or via an intermediate intervening layer (not shown). The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer includes hard masks of $SiO_2$, SiN, SiON or p-Si, an undercoat in the form of carbon film, a silicon-containing intermediate film, and an organic antireflective coating.

Suitable spin-on carbon films include nortricyclene copolymers described in JP-A 2004-205658, hydrogenated naphthol novolac resins described in JP-A 2004-205676, naphthol dicyclopentadiene copolymers described in JP-A 2004-205685, phenol dicyclopentadiene copolymers described in JP-A 2004-354554 and JP-A 2005-010431, fluorene bisphenol novolac described in JP-A 2005-128509, acenaphthylene copolymers described in JP-A 2005-250434, indene copolymers described in JP-A 2006-053543, phenol group-containing fullerene described in JP-A 2006-227391, bisphenol compounds and novolac resins thereof described in JP-A 2006-259249, JP-A 2006-293298, and JP-A 2007-316282, bisphenol compounds and novolac resins thereof described in JP-A 2006-259482, novolac resins of adamantane phenol compounds described in JP-A 2006-285095, hydroxyvinylnaphthalene copolymers described in JP-A 2007-171895, bisnaphthol compounds and novolac resins thereof described in JP-A 2007-199653, ROMP polymers described in JP-A 2008-26600, and tricyclopentadiene copolymers described in JP-A 2008-96684, and other resinous compounds.

The spin-on silicon-containing intermediate layers are preferably those layers comprising silsesquioxane-based silicon compounds and having an antireflection function as described in JP-A 2004-310019, JP-A 2005-15779, JP-A 2005-18054, JP-A 2005-352104, JP-A 2007-65161, JP-A 2007-163846, JP-A 2007-226170, and JP-A 2007-226204.

Where the reversal film is formed of a hydrocarbon base material, a carbon film having a carbon content of at least 75% by weight on the processable substrate and a silicon-containing intermediate layer thereon are preferably disposed between the processable substrate and the photoresist film for positive/negative reversal to construct a film stack suited for the three-layer resist process. The carbon film may be formed by spin coating or an amorphous carbon film formed by CVD. The silicon-containing intermediate layer may be a SOG film formed by spin coating or a film selected from $SiO_2$, SiN, SiON and TiN films formed by CVD or ALD, and has both functions of a hard mask for the carbon film and an antireflection film.

Also, an organic antireflective coating may be formed between the silicon-containing film and the photoresist film for the purposes of preventing footing on the substrate and pattern collapse and further reducing substrate reflection.

Where the reversal film is formed of a silicon-containing material, a carbon film having a carbon content of at least 75% by weight is formed between the processable substrate and the photoresist film for positive/negative reversal, and a photoresist film is formed thereon. An organic antireflective coating may be formed between the carbon film and the photoresist film. In this embodiment, the silicon-containing reversal film functions as a hard mask during processing of the carbon film.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective coating composition used herein may comprise a base resin comprising predominant recurring units (P-1) such as recurring units having 1,1,1,3,3,3-hexafluoro-2-propanol residues or a base resin comprising the predominant recurring units (P-1) and recurring units (P-2) having a fluoroalkyl group copolymerized therewith. Examples of recurring units (P-1) include those derived from the monomers exemplified above for units (s-1), and examples of recurring units (P-2) include those derived from the monomers exemplified above for units (s-2). The proportion of these recurring units (P-1) and (P-2) is $0<(P-1)\leq1.0$, $0\leq(P-2)<1.0$, and $0.3\leq(P-1)+(P-2)\leq1.0$. The base resin has a weight average molecular weight (Mw) of 1,000 to 100,000, and preferably 2,000 to 50,000. When a base resin free of recurring units (P-2) is used, it is preferred to incorporate an amine compound in the protective coating composition. The amine compound used herein may be selected from those described above in conjunction with the basic compound. The amine compound is preferably used in an amount of 0.01 to 10 parts, and more preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Figure 4B:
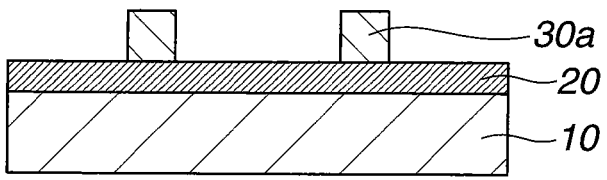
FIG. 4B shows that the resist film is exposed and developed.

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle or spray techniques. In this way, a desired resist pattern 30a is formed on the substrate as shown in FIG. 4B.

As to the pattern, a dot pattern having a half-pitch size of 38×38 nm to 100×100 nm, and especially 40×40 nm to 80×80 nm may be formed using a lattice-like pattern mask. Since the size of a dot pattern depends on the lens NA of an exposure tool, use of an NA 1.35 exposure tool enables formation of dots having a half-pitch of 38 nm as the minimum size. The dot pattern may have longitudinal and transverse axes of equal or different length. The method of forming a dot pattern is not particularly limited. A typical method of forming a dot pattern is by exposing the resist film to high-energy radiation through a lattice-like pattern phase shift mask and developing to form a dot pattern. With this method, holes having the finest half-pitch can be formed.

In the prior art, an attempt to form a dot pattern having such a fine pitch required two exposures through two masks by double dipole lithography. Specifically, the method includes a first exposure of X direction lines by dipole illumination, exchange of a mask, and a second exposure of Y direction lines by dipole illumination. In this case, throughput drops due to mask exchange and alignment associated therewith. Also, any misalignment between the two exposures leads to a positional shift of finally formed holes. If the position of a hole differs from the position of a line to be connected thereto, this causes a failure of interconnection. Thus the double dipole illumination method requires a very high accuracy of alignment.

In contrast to the fact that the pattern formed by two exposures by double dipole illumination suffers from misalignment of the second exposure, the pattern forming process of the invention is devoid of misalignment because only a single exposure is necessary. Because of no mask exchange and the only one exposure, there is an advantage of high throughput.

When a random pattern including dense and isolated pattern regions is formed, a dense pattern is exposed and then exposure is carried out for erasing an unnecessary region of the dense pattern. Exposure of the erase pattern may be carried out subsequent to or prior to the dense pattern exposure. The erase pattern exposure may be a single exposure or a plurality of exposures. The erase pattern exposure does not need a high resolution or a very high accuracy of alignment. Thus the immersion lithography is not necessarily requisite.

To meet both the alignment accuracy between the dense pattern exposure and the erase pattern exposure and the throughput, continuous exposure is preferably carried out without detachment of the wafer from the chuck. To this end, the exposure tool must have a mechanism capable of exposure while exchanging a plurality of masks. For improved throughput, the exposure tool must be equipped with a plurality of mask stages, which are aligned relative to the respective stages before exposure, so that continuous exposure may be carried out while exchanging mask stages. Where the dense pattern exposure is by the immersion lithography and the erase pattern exposure is by dry lithography, different exposure tools are used, leading to a substantial amount of misalignment. This exposure process is applicable if the amount of misalignment falls within the practically acceptable range.

Next, PEB and development are carried out to form a dot pattern. A random pitch dot pattern may be formed through a single development (see FIG. 4B).

Figure 4C:
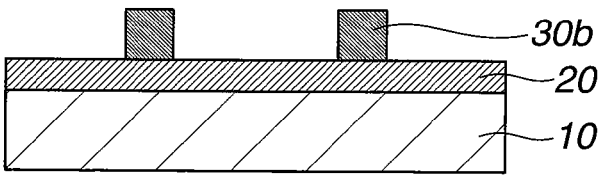
FIG. 4C shows that the resist pattern is deprotected and crosslinked under the action of acid and heat.

Next, the resist pattern is treated to eliminate acid labile groups in the polymer (base resin) in the pattern and to crosslink the polymer, forming a crosslinked pattern 30b (FIG. 4C). To induce elimination of acid labile groups and crosslinking on the polymer in the resist pattern, acid and heat are necessary. In practice, once an acid is generated, heat is applied to effect elimination of acid labile groups and crosslinking at the same time. The acid may be generated by a suitable method such as flood exposure of the wafer (pattern) as developed for decomposing the photoacid generator. The flood exposure uses an illumination wavelength of 180 to 400 nm and an exposure dose of 10 mJ/cm$^2$ to 1 J/cm$^2$.

Radiation with a wavelength of less than 180 nm, specifically irradiation of excimer lasers or excimer lamps of 172 nm, 146 nm and 122 nm is undesirable because not only the generation of acid from photoacid generator, but also photo-induced crosslinking reaction are accelerated, leading to a decrease of alkaline dissolution rate due to exaggerated crosslinking. For the flood exposure, use is preferably made of an ArF excimer laser with a wavelength of 193 nm or longer, a KrCl excimer lamp of 222 nm, a KrF excimer laser of 248 nm, a low-pressure mercury lamp centering at 254 nm, a XeCl excimer lamp of 308 nm, and i-line of 365 nm. In an alternative embodiment wherein a thermal acid generator in the form of an ammonium salt is added to the positive resist composition, the acid can be generated by heating. In this embodiment, acid generation and crosslinking reaction take place simultaneously. Preferred heating conditions include a temperature of 150 to 400° C., especially 160 to 300° C. and a time of 10 to 300 seconds. As a result, a crosslinked resist pattern which is insoluble in the solvent of the reversal film-forming composition is yielded. Since an additional illumination system is necessary to generate the acid by illumination, the latter embodiment is more advantageous that uses a resist composition having a thermal acid generator added thereto so that deprotection and crosslinking reaction may be driven only by heating.

Figure 4D:
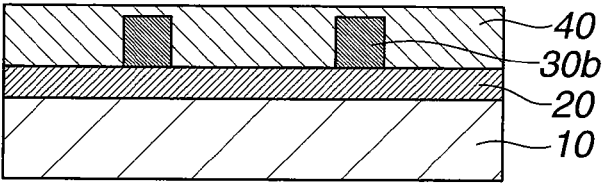
FIG. 4D shows that a pattern reversal film is coated.

Next, as shown in FIG. 4D, the reversal film-forming composition is built up until it covers the crosslinked resist pattern 30b, forming a reversal film 40. Preferably the thickness of the reversal film 40 is equal to the height of the resist pattern 30b or ±30 nm.

Figure 4E:
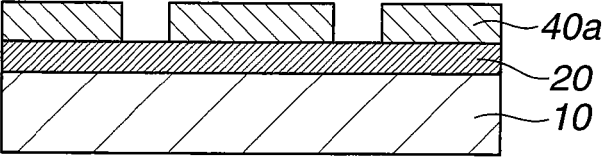
FIG. 4E shows that the pattern reversal film is developed for positive/negative reversal.

Next, the liquid alkaline developer is applied to dissolve a surface layer of the reversal film 40 until the crosslinked resist pattern 30b is exposed. From this point of time downward, the crosslinked resist pattern 30b is selectively dissolved since the dissolution rate in the alkaline developer of the crosslinked resist pattern 30b is substantially higher than that of the reversal film 40. Eventually, the crosslinked resist pattern 30b is dissolved away, yielding the reversal film 40 provided with a reversal pattern 40a which is a negative of the crosslinked resist pattern 30b as shown in FIG. 4E. If the resist pattern is a dot pattern, the resulting reversal pattern is a hole pattern.

Figure 4F:
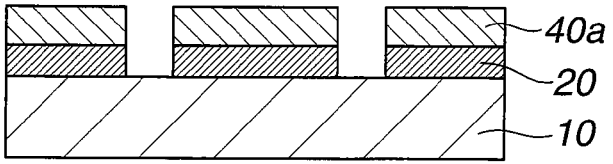
FIG. 4F shows that the processable substrate is etched using the positive/negative reversal pattern.
Figure 5:
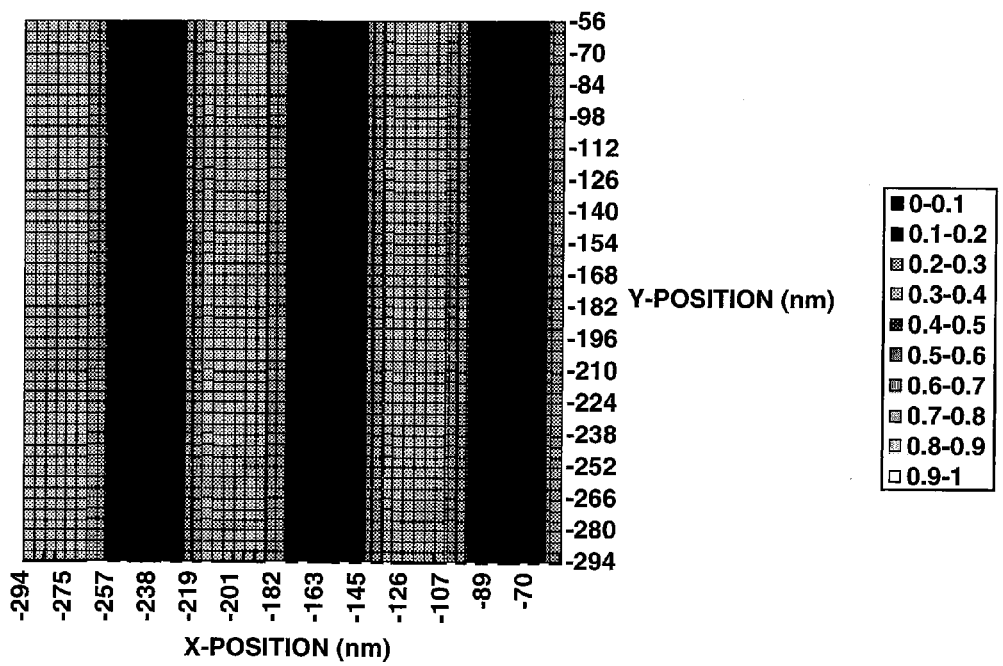
FIG. 5 illustrates an optical image of Y-direction lines printed using ArF excimer laser, NA 1.3 lens, dipole illumination, s-polarized illumination, and 6% halftone phase shift mask, wherein a darker inked area indicates a weaker light intensity.
Figure 6:
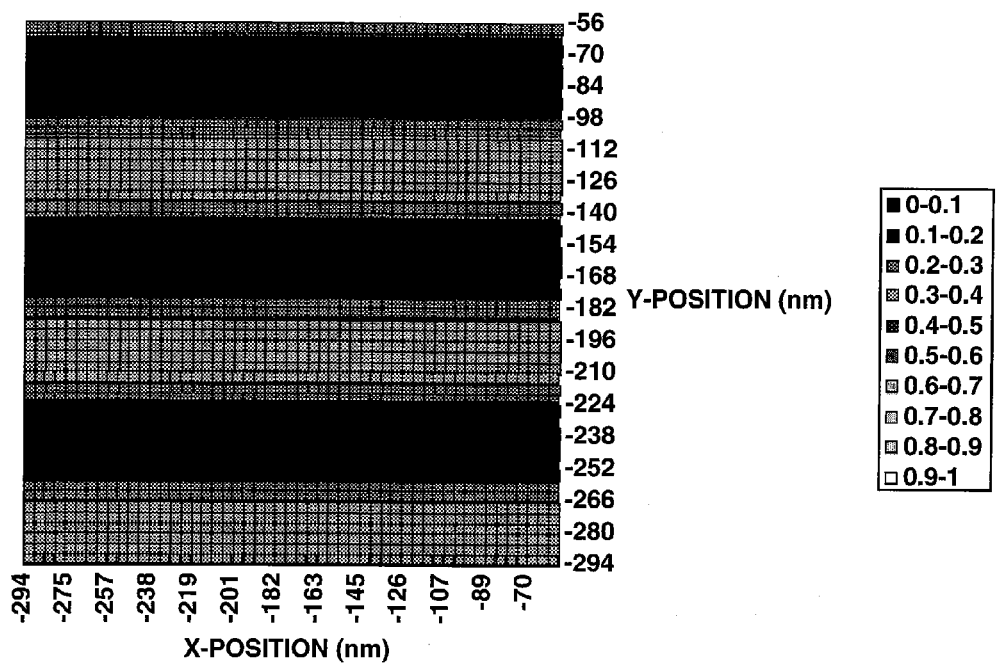
FIG. 6 illustrates an optical image of X-direction lines printed using ArF excimer laser, NA 1.3 lens, dipole illumination, s-polarized illumination, and 6% halftone phase shift mask, wherein a darker inked area indicates a weaker light intensity.
Figure 7:
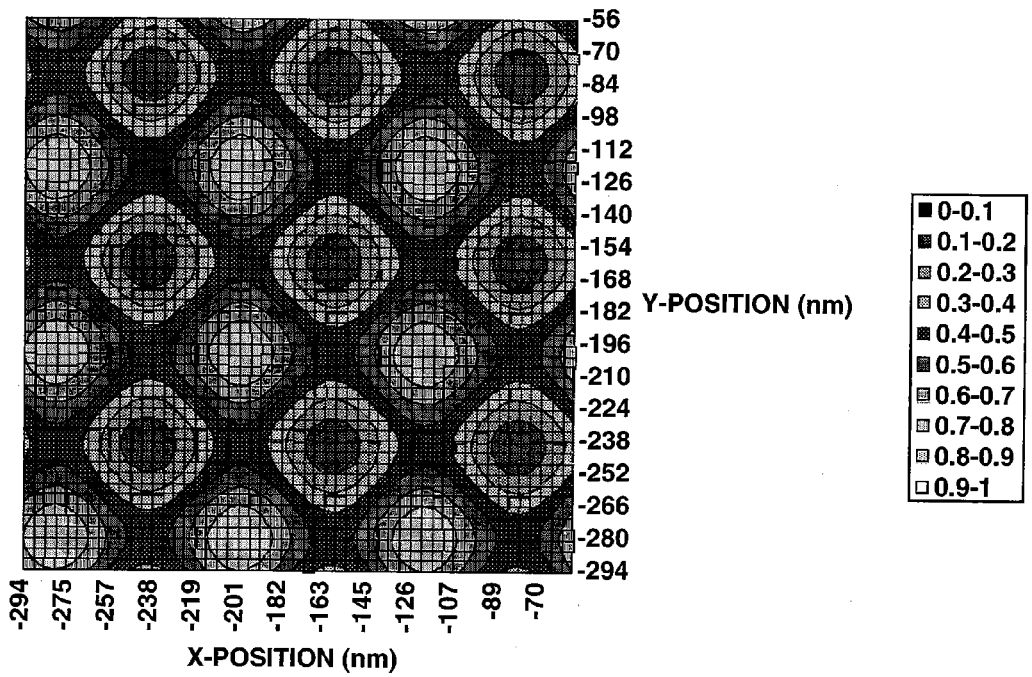
FIG. 7 is a contrast image indicating the light intensity of double dipole lithography with NA 1.3 lens, obtained by overlaying X-direction lines of FIG. 6 on Y-direction lines of FIG. 5.
Figure 8:
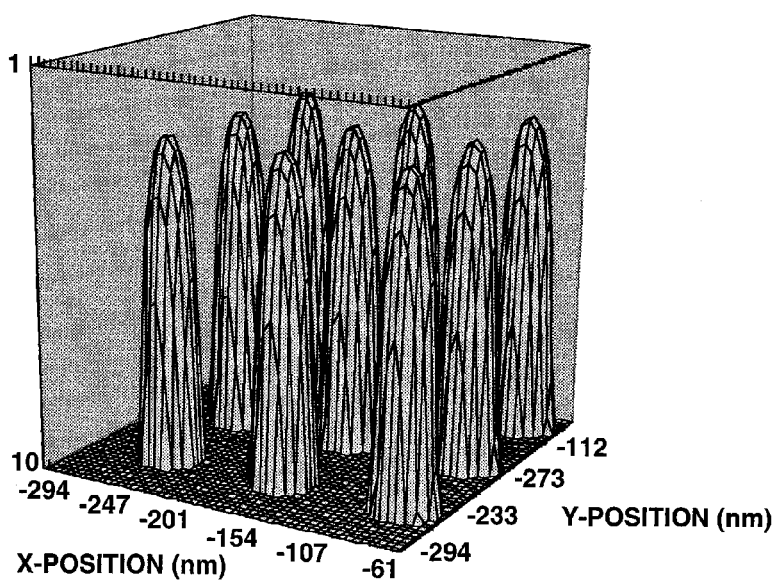
FIG. 8 illustrates a simulation of a resist profile of double dipole illumination lithography with NA 1.3 lens wherein Z direction is the negative of logarithm of a dissolution rate of the resist, reflecting the resist profile of dot pattern, and the exposure dose is 20 mJ/cm$^2$.
Figure 9:
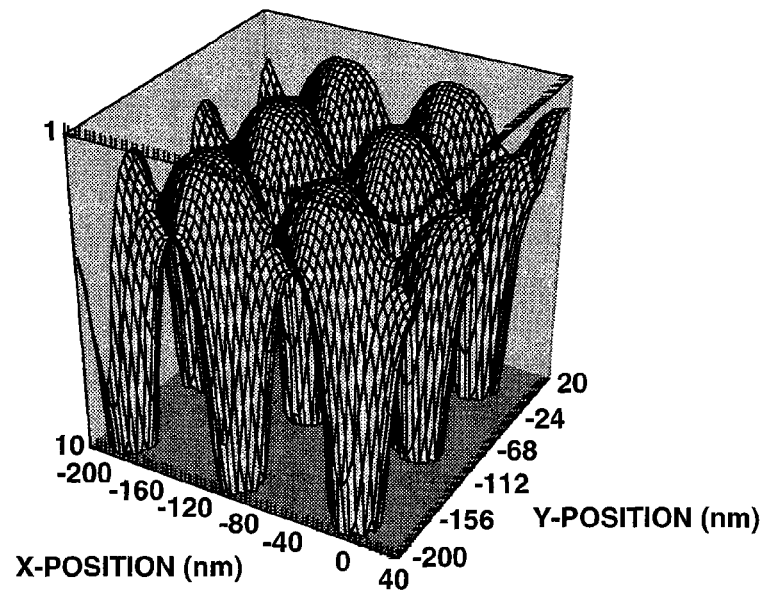
FIG. 9 illustrates a simulation of a hole resist profile in an optical image of 45-nm half-pitch holes (gratings with 90 nm pitch and 25 nm width) printed using ArF excimer laser, NA 1.3 lens, cross-pole illumination, 6% halftone phase shift mask, and azimuthally polarized illumination, wherein the exposure dose is 40 mJ/cm$^2$.
Figure 10:
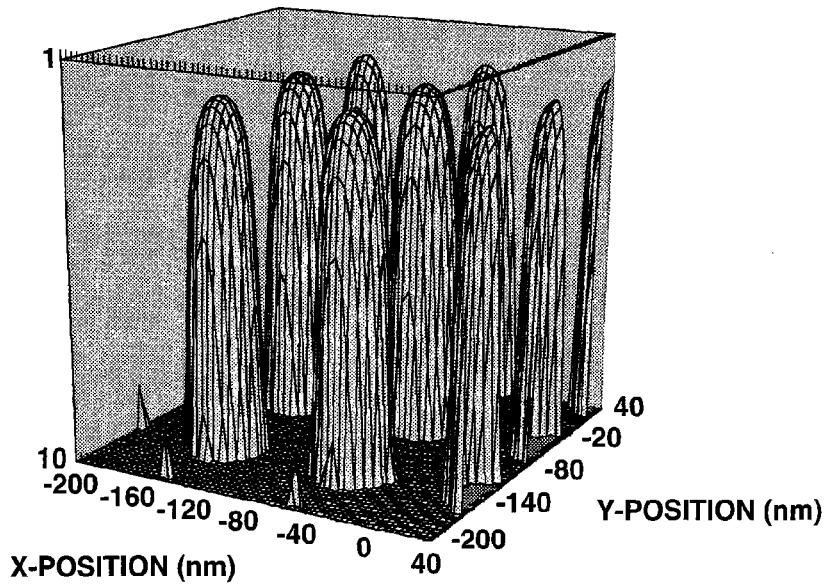
FIG. 10 illustrates a simulation of resist profile under the same optical conditions and mask as in FIG. 9, the exposure dose being 100 mJ/cm$^2$.
Figure 11:
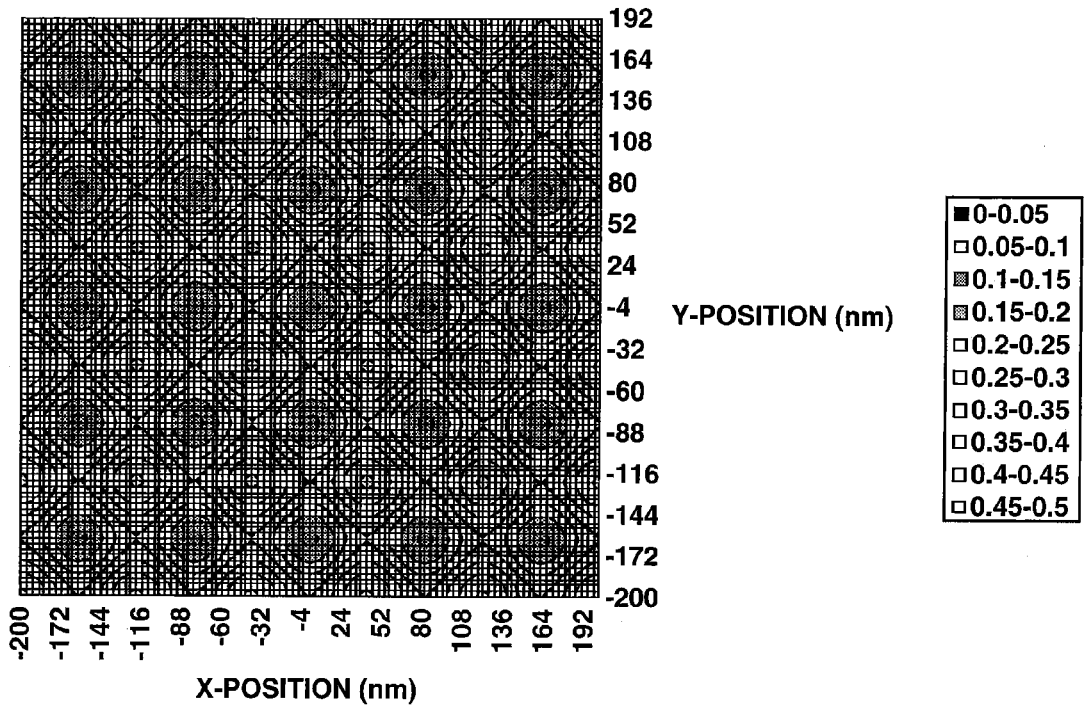
FIG. 11 illustrates an optical image of a dot pattern with 80 nm pitch and 50 nm size printed using NA 1.3 lens, cross-pole illumination, azimuthally polarized illumination, and 6% halftone phase shift mask.
Figure 12:
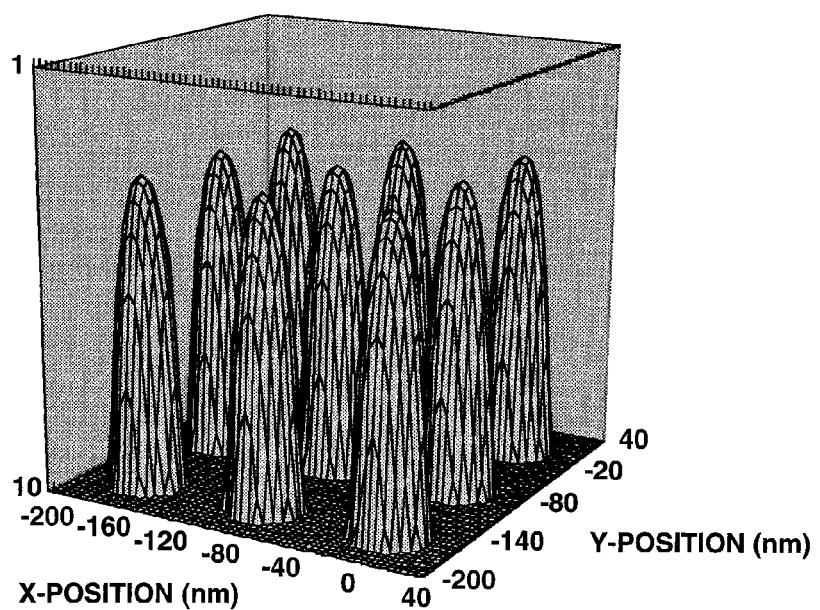
FIG. 12 illustrates a simulation of resist profile in the optical image of FIG. 11.
Figure 13:
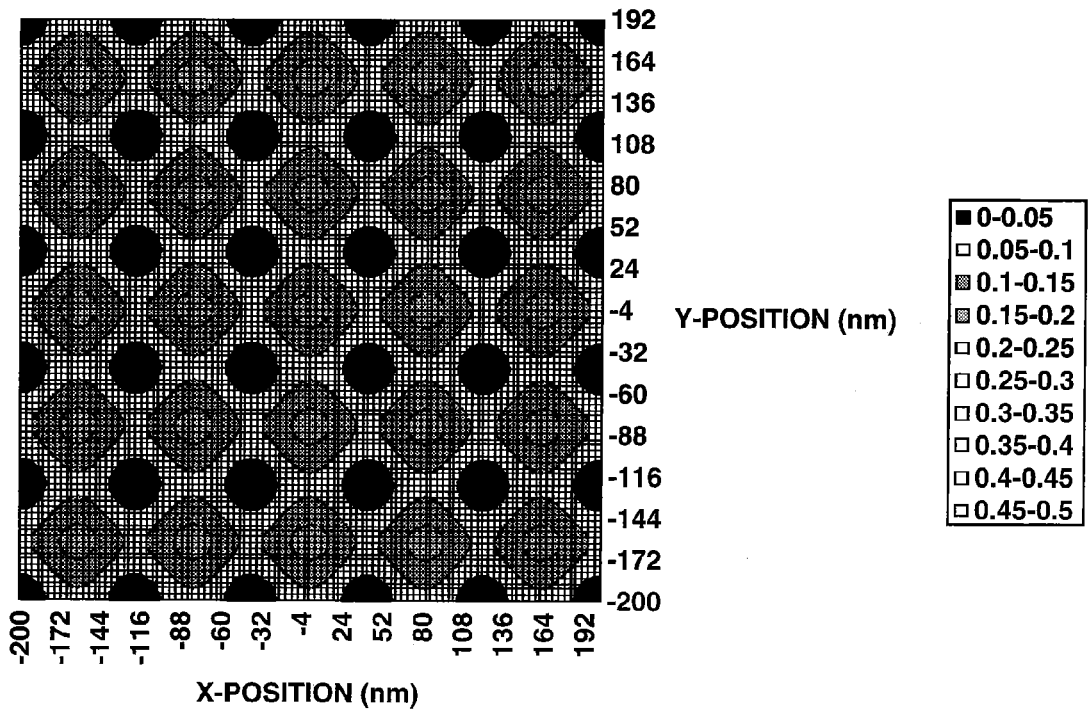
FIG. 13 illustrates an optical image of a lattice-like line pattern with 80 nm pitch and 30 nm width printed using NA 1.3 lens, cross-pole illumination, azimuthally polarized illumination, and 6% halftone phase shift mask.
Figure 14:
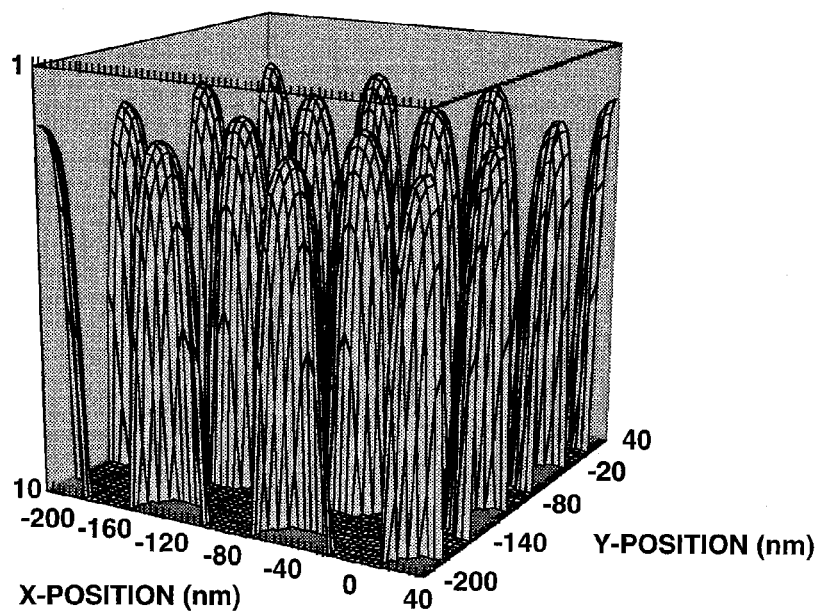
FIG. 14 illustrates a simulation of resist profile in the optical image of FIG. 13.
Figure 15:
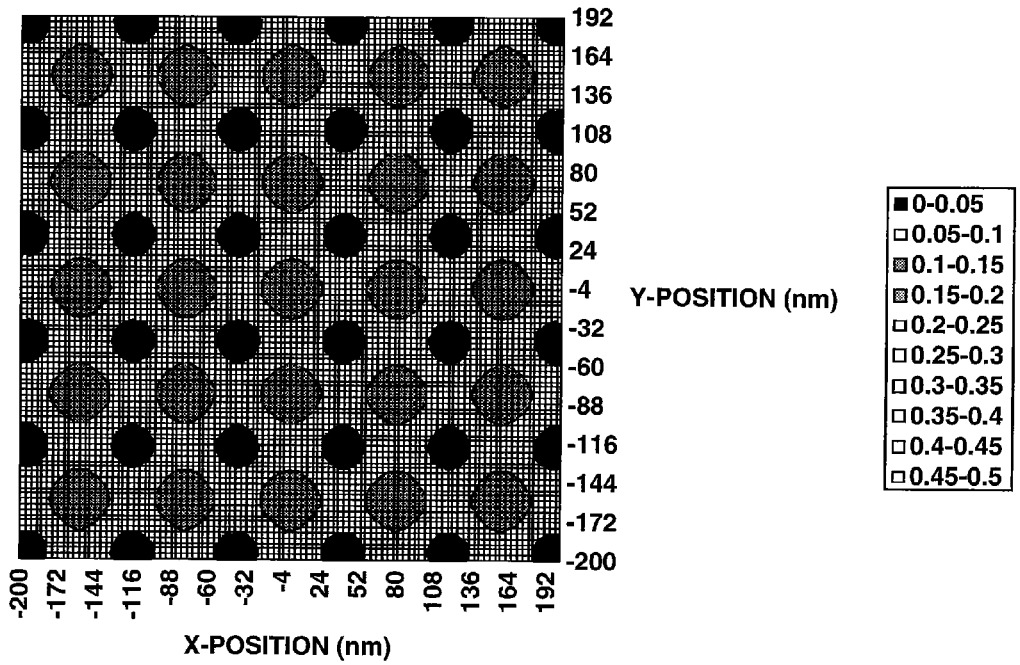
FIG. 15 illustrates an optical image of a lattice-like line pattern with 78 nm pitch and 29 nm width printed using NA 1.3 lens, cross-pole illumination, azimuthally polarized illumination, and 6% halftone phase shift mask.

Furthermore, as shown in FIG. 4F, using the reversal pattern 40a as a mask, the intermediate intervening layer of hard mask or the like (if any) is etched, and the processable substrate 20 further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film is removed. Removal of the film may be carried out after etching of the intermediate intervening layer of hard mask or the like. It is noted that removal of the crosslinked resist film may be achieved by dry etching with oxygen or radicals.

EXAMPLE

Examples of the invention are given below by way of illustration and not by way of limitation. The abbreviation "pbw" is parts by weight. For all polymers, Mw and Mn are determined by GPC versus polystyrene standards.

Synthesis Examples

A polymer for use in a reversal film-forming composition was prepared by combining monomers, effecting copolymerization reaction in tetrahydrofuran medium, crystallization in methanol, repeatedly washing with hexane, isolation, and drying. The resulting polymer (Polymer 1) had the composition shown below. Notably, a phenol group on a monomer was substituted by an acetoxy group, which was converted back to a phenol group by alkaline hydrolysis after polymerization. The composition of the polymer was analyzed by $^1$H-NMR, and the Mw and Mw/Mn determined by GPC.

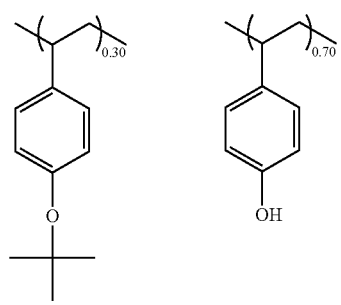

Polymer 1

Mw = 9,300
Mw/Mn = 1.88

A reversal film-forming composition was prepared by combining Polymer 1, a basic quencher, and a solvent in accordance with the formulation of Table 1. To the solvent, 100 ppm of a fluorochemical surfactant FC-4430 (3M-Sumitomo Co., Ltd.) was added. The reversal film-forming composition was coated onto a HMDS-primed 8-inch silicon substrate and baked at 110° C. for 60 seconds to form a pattern reversal film of 60 nm thick. The film was developed with a developer in the form of a 2.38 wt % TMAH aqueous solution for 30 seconds. A film thickness reduction by development was determined, from which a dissolution rate (in nm/s) was computed.

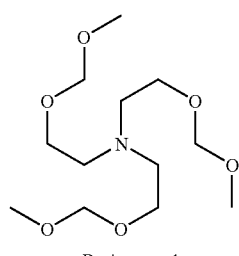

Basic quencher

TABLE 1

| Pattern reversal film-forming composition | | | | |
|---|---|---|---|---|
| Reversal film | Polymer (pbw) | Additive (pbw) | Organic solvent (pbw) | Dissolution rate (nm/s) |
| IROC-1 | Polymer 1 (100) | Basic quencher (2.0) | PGMEA (3,000) | 0.2 |

Examples 1 to 3 and Comparative Examples 1 to 3

Preparation of Positive Resist Composition and Alkali-Soluble Protective Coating Composition A resist solution and a protective coating solution were prepared by dissolving polymers (Resist polymer and Protective film polymer) and components in solvents in accordance with the formulation of Tables 2 and 4, and filtering through a filter with a pore size of 0.2 μm. The components in Tables 2 and 4 are identified below.

Photoacid generator: PAG1 of the following structural formula

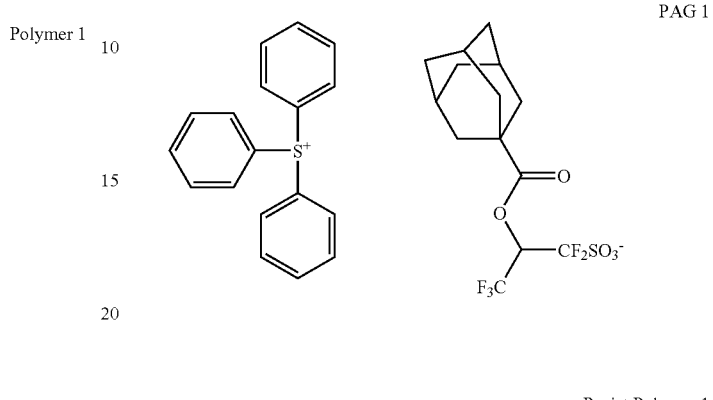

PAG 1

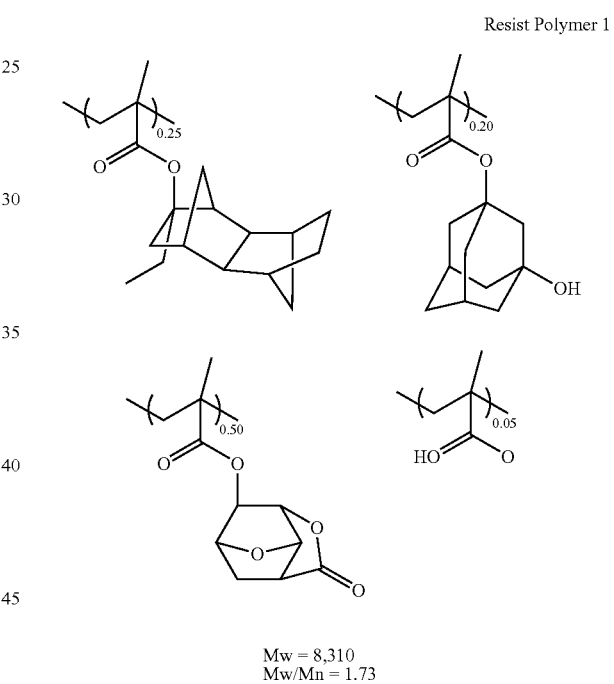

Resist Polymer 1

Mw = 8,310
Mw/Mn = 1.73

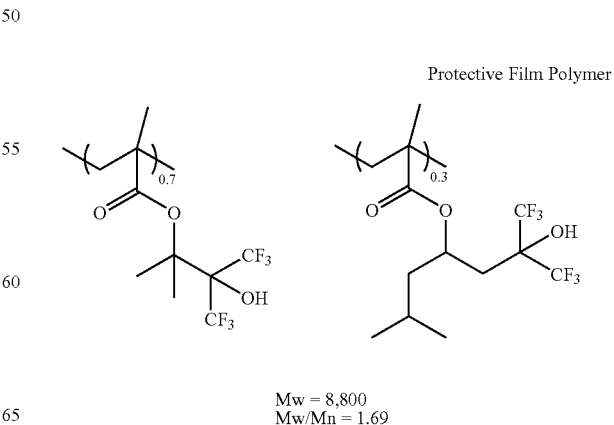

Protective Film Polymer

Mw = 8,800
Mw/Mn = 1.69

Basic compound: Quencher 1 of the following structural formula

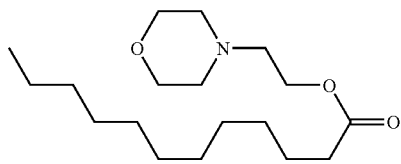

Quencher 1

Thermal Acid Generator:
TAG1 of the following structural formula

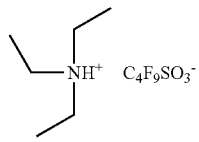

TAG 1

Organic solvent: PGMEA (propylene glycol monomethyl ether acetate)

Film Thickness Change in Solvent and Alkali Dissolution Rate After High-Temperature Baking On a substrate (silicon wafer), the resist composition prepared in accordance with the formulation of Table 2 was spin coated and baked on a hot plate at 190° C. for 60 seconds to form a resist film of 150 nm thick.

A solvent was statically dispensed on the resist film for 30 seconds. Thereafter, the sample was rotated at 2000 rpm for 30 seconds for spinning off the solvent and baked at 100° C. for 60 seconds for drying off the solvent. A film thickness was measured using a film thickness gauge, and a change of film thickness from the film as baked at 190° C. was computed.

Separately, the resist film as baked at 190° C. was examined for alkaline dissolution rate. Using a resist development analyzer RDA-790 (Lithotec Japan Co., Ltd.), an alkaline dissolution rate of the film in 2.38 wt % TMAH aqueous solution was measured. The results are shown in Table 3.

TABLE 2

| | Polymer (pbw) | Acid generator (pbw) | Basic compound (pbw) | Organic solvent (pbw) |
|---|---|---|---|---|
| Resist 1 | Resist Polymer 1 (100) | PAG1 (12.0) TAG1 (0.5) | Quencher 1 (1.20) | PGMEA (2,000) |

TABLE 3

| | Organic solvent | Film slimming by solvent (nm) | Alkali dissolution rate (nm/s) |
|---|---|---|---|
| Resist 1 | PGMEA | 0.5 | 170 |

TABLE 4

| | Polymer (pbw) | Additive (pbw) | Organic solvent (pbw) |
|---|---|---|---|
| TC-1 | Protective Film Polymer (100) | tri-n-octylamine (0.3) | diisoamyl ether (2,700) 2-methyl-1-butanol (270) |

ArF Lithography Patterning I

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective coating composition TC-1 shown in Table 4 was spin coated on the resist film and baked at 90° C. for 60 seconds to form a protective film of 50 nm thick.

Figure 24A:
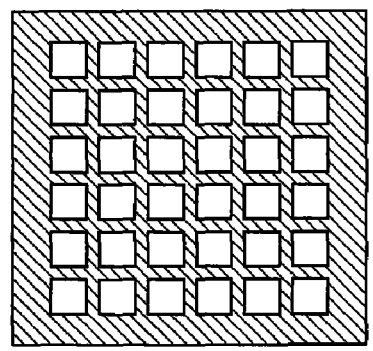
FIG. 24A shows a dense 1:1 dot forming mask.

Using an ArF excimer laser immersion lithography scanner NSR-610C (Nikon Corp., NA 1.30, σ0.98/0.78, cross pole opening 20 deg., azimuthally polarized illumination, 6% halftone phase shift mask, lattice-like mask of the layout of FIG. 24A having pitch 90 nm and line width 30 nm as on-wafer size), exposure was performed at a varying exposure dose. After the exposure, the sample was baked (PEB) at 100° C. for 60 seconds and developed with a 2.38 wt % TMAH aqueous solution for 30 seconds.

Figure 24B:
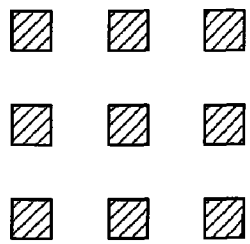
FIG. 24B shows an unnecessary dot erasing mask.
Figure 24C:
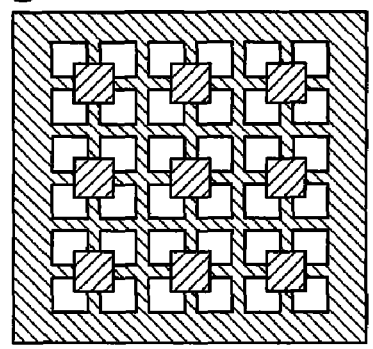
FIG. 24C is an overlay of FIGS. 24A and 24B.
Figure 24D:
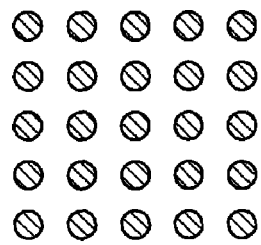
FIG. 24D shows a 1:1 dot pattern after development.

In Example 1, as the exposure dose was increased, a dense dot pattern as shown in FIG. 24D was formed at an exposure dose of 50 mJ/cm$^2$, in which dots having a size of 30 nm and a pitch of 90 nm were positioned at the intersections between gratings of the lattice-like mask. The size of 100 dots was measured, finding a size variation standard deviation of 1.8 nm.

The dot pattern as developed was baked at 190° C. for 60 seconds to effect deprotection of acid labile groups and crosslinking. The pattern reversal film-forming composition shown in Table 1 was coated on the dot pattern and baked at 100° C. for 60 seconds to form a reversal film of 60 nm thick. This was followed by development with a 2.38 wt % TMAH aqueous solution for 30 seconds, achieving image reversal from the dot pattern to a hole pattern.

In Comparative Example 1, a hole pattern was formed at an exposure dose of 20 mJ/cm$^2$, in which holes having a size of 50 nm and a pitch of 90 nm were positioned at openings of the lattice-like mask. As the exposure dose was decreased, the size of the hole pattern was reduced. For holes having a size of up to 50 nm, however, there was found a hole size variation as large as about 10 nm.

By observation under TDSEM S-9380 (Hitachi Hitechnologies Ltd.), the size of the dot pattern as developed, the dot pattern as heated, and the hole pattern as image reversed was measured. A size variation of 100 holes in Example 1 and Comparative Example 1 was also determined. The results are shown in Table 5.

ArF Lithography Patterning II

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective coating composition TC-1 shown in Table 4 was spin coated on the resist film and baked at 90° C. for 60 seconds to form a protective film of 50 nm thick.

Using an ArF excimer laser immersion lithography scanner NSR-610C (Nikon Corp., NA 1.30, σ0.98/0.78, cross pole opening 20 deg., azimuthally polarized illumination, 6% halftone phase shift mask, lattice-like mask of the layout of FIG. 24A having pitch 80 nm and line width 30 nm as on-wafer size), exposure was performed at a varying exposure dose. After the exposure, the sample was baked (PEB) at 100° C.

for 60 seconds and developed with a 2.38 wt % TMAH aqueous solution for 30 seconds.

In Example 2, at an exposure dose of 40 mJ/cm², a dense dot pattern having a dot size of 30 nm and a pitch of 80 nm as shown in FIG. 24D was formed. The size of 100 dots was measured, finding a size variation standard deviation of 2.5 nm.

Figure 17:
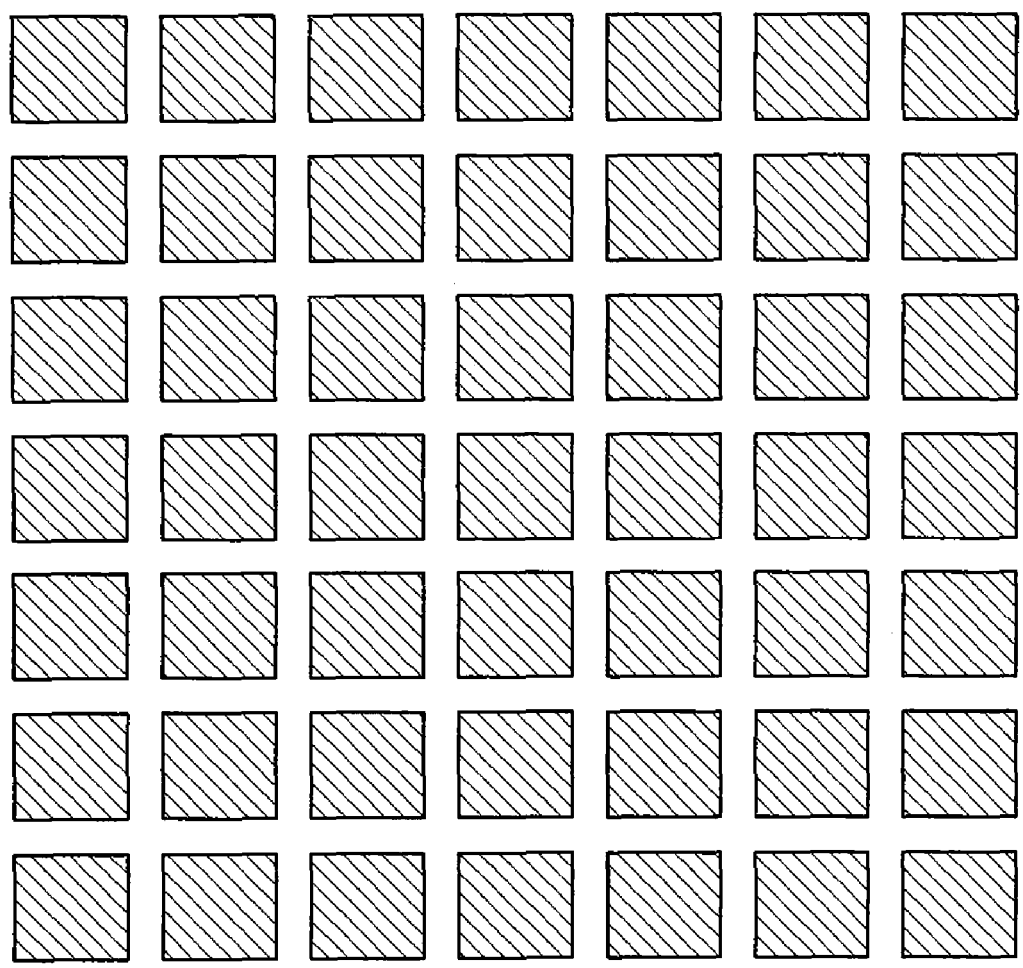
FIG. 17 illustrates a mask pattern of the layout having dots distributed.

In Comparative Example 2, the composition and thickness of the carbon film, silicon-containing hard mask, photoresist film and protective film were the same as in Example 1. Using an ArF excimer laser immersion lithography scanner NSR-610C (Nikon Corp., NA 1.30, σ0.98/0.78, cross pole opening 20 deg., azimuthally polarized illumination, 6% halftone phase shift mask, dot array mask of the layout of FIG. 17 having pitch 80 nm and size 50 nm as on-wafer size), exposure was performed at a varying exposure dose. After the exposure, the sample was baked (PEB) at 100° C. for 60 seconds and developed with a 2.38 wt % TMAH aqueous solution for 30 seconds. At an exposure dose of 15 mJ/cm², a dot pattern having a size of 40 nm and a pitch of 80 nm was formed in the dot-like light-shielded area of the mask. The size of 100 dots was measured, finding a size variation standard deviation of about 8 nm. Film slimming was also found.

The dot pattern as developed was baked at 190° C. for 60 seconds to effect deprotection of acid labile groups and crosslinking. The pattern reversal film-forming composition shown in Table 1 was coated on the dot pattern and baked at 100° C. for 60 seconds to form a reversal film of 60 nm thick. This was followed by development with a 2.38 wt % TMAH aqueous solution for 30 seconds, achieving image reversal from the dot pattern to a hole pattern.

In Comparative Example 3, an attempt to form a hole pattern was made using the same mask, resist composition, intermediate layer, underlayer film, and substrate as in Example 2. A hole pattern having a pitch of 80 nm could not be formed at any varying exposure dose.

By observation under TDSEM S-9380 (Hitachi Hitechnologies Ltd.), the size of the dot pattern as developed, the dot pattern as heated, and the hole pattern as image reversed was measured. The results are shown in Table 6.

ArF Lithography Patterning III

On a substrate (silicon wafer), a spin-on carbon film ODL-50 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective coating composition TC-1 shown in Table 4 was spin coated on the resist film and baked at 90° C. for 60 seconds to form a protective film of 50 nm thick.

Like patterning test II, first exposure was performed using an ArF excimer laser immersion lithography scanner NSR-610C (Nikon Corp., NA 1.30, σ0.98/0.78, cross pole opening 20 deg., azimuthally polarized illumination, 6% halftone phase shift mask, lattice-like mask of the layout of FIG. 24A having pitch 80 nm and line width 30 nm as on-wafer size). Second exposure was performed on a selected portion of the first exposed region using an ArF excimer laser immersion lithography scanner NSR-610C (Nikon Corp., NA 1.30, σ0.98/0.78, annular illumination, 6% halftone phase shift mask, mask of the layout of FIG. 24B having pitch 160 nm and dot size 80 nm as on-wafer size). After the exposure, the sample was baked (PEB) at 100° C. for 60 seconds and developed with a 2.38 wt % TMAH aqueous solution for 30 seconds.

Figure 24E:
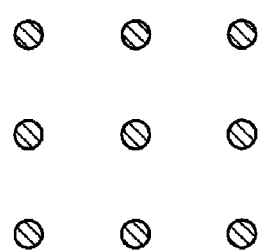
FIG. 24E shows a 1:3 dot pattern after development.

There were obtained both a 1:1 dot pattern of FIG. 24D having a size of 30 nm and a pitch of 80 nm as developed and a 1:3 dot pattern of FIG. 24E having a size of 30 nm and a pitch of 160 nm as developed. FIG. 24C represents an overlap of the mask layouts of FIGS. 24A and 24B. The pattern reversal film-forming composition shown in Table 1 was coated on the dot patterns and baked at 100° C. for 60 seconds to form a reversal film of 60 nm thick. This was followed by development with a 2.38 wt % TMAH aqueous solution for 30 seconds, achieving image reversal from the 1:1 and 1:3 dot patterns to hole patterns.

By observation under TDSEM S-9380 (Hitachi Hitechnologies Ltd.), the size of the hole patterns as image reversed was measured. The results are shown in Table 7.

TABLE 5

Conversion of dot pattern to hole pattern

|  | Size of dot pattern as developed | Size of dot pattern as heated | Size of hole pattern | Hole pattern size variation |
|---|---|---|---|---|
| Example 1 | 31 nm | 32 nm | 30 nm | 2.1 nm |
| Comparative Example 1 | — | — | 50 nm | 10 nm |

TABLE 6

Conversion of dot pattern to hole pattern

|  | Size of dot pattern as developed | Size of dot pattern as heated | Size of hole pattern |
|---|---|---|---|
| Example 2 | 28 nm | 29 nm | 27 nm |
| Comparative Example 2 | 33 nm | 33 nm | not opened |

TABLE 7

Conversion of dot pattern to hole pattern

|  | 1:1 dot pattern as developed | 1:3 dot pattern as developed | 1:1 dot pattern as heated | 1:3 dot pattern as heated | 1:1 hole pattern as reversed | 1:3 hole pattern as reversed |
|---|---|---|---|---|---|---|
| Example 3 | 30 nm | 30 nm | 31 nm | 31 nm | 29 nm | 29 nm |

Comparative Examples 1 and 3 intended to form holes in openings of the lattice-like mask through exposure and development. In Comparative Example 1 using the 90-nm pitch pattern, a hole pattern was barely formed. In Comparative Example 3 using the 80-nm pitch pattern, a hole pattern could not be formed. Comparative Example 2 intended to form dots in light-shielded zones of the dot mask through exposure and development and effect reversal of dots to holes, but failed to form a 80-nm pitch hole pattern. In contrast, the process of the invention including forming dots at intersections between gratings of a lattice-like mask, and effect reversal of dots to holes succeeded in forming a fully fine size hole pattern.

More particularly, it is evident from the results in Table 5 that the pattern forming process of Example 1 succeeded in opening a 30-nm hole pattern at a pitch of 90 nm through a single exposure, whereas the conventional process of Comparative Example 1 failed to open a hole pattern with a size of up to 50 nm. It is evident from the results in Table 6 that the pattern forming process of Example 2 using the lattice-like mask succeeded in opening a 30-nm hole pattern at a pitch of 80 nm, whereas the conventional process of Comparative Example 2 using a dot pattern mask failed to open a hole pattern at a pitch of 80 nm because of significant film slimming of the dot pattern. It is evident from the results in Table 7 that a hole pattern consisting of dense and isolated hole regions is formed by two exposures, specifically by first exposure of a dense dot pattern, second exposure for erasing an unnecessary portion of the dot pattern to form a dot pattern consisting of dense and isolated dot regions, and effecting image reversal.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-006574 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern by way of positive/negative reversal, comprising the steps of:
coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the solvent and to form a resist film,
exposing the resist film to high-energy radiation through a phase shift mask having a lattice-like array of shifters, post-exposure baking so that the acid generated by the acid generator upon exposure acts on acid labile groups in the resin for thereby effecting elimination reaction of acid labile groups in the resin in exposed areas, developing the exposed resist film with an alkaline developer to form a positive pattern,
illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin does not lose solubility in an alkaline wet etchant, for thereby endowing the positive pattern with resistance to an organic solvent used in a reversal film-forming composition,
coating a reversal film-forming composition on the positive pattern-bearing substrate to form a reversal film, and
dissolving away the crosslinked positive pattern using an alkaline wet etchant.

2. The process of claim 1 wherein the step of developing the exposed resist film is to form a pattern of dots at intersections of the lattice-like shifter array.

3. The process of claim 1 wherein the phase shift mask having a lattice-like array of shifters is a halftone phase shift mask having a transmittance of 3 to 15%.

4. The process of claim 1 wherein the step of exposing the resist film to high-energy radiation includes exposure of a dense pattern through a phase shift mask having a lattice-like array of shifters, and exposure for removing a portion of the dense pattern.

5. The process of claim 4 wherein the exposure of a dense pattern through a phase shift mask having a lattice-like array of shifters and the exposure for removing a portion of the dense pattern are continuously carried out on a common exposure stage without removing the substrate from the stage.

6. The process of claim 1 wherein in the step of illuminating or heating the positive pattern for increasing the alkaline solubility of the resin and for endowing the positive pattern with resistance to an organic solvent used in a reversal film-forming composition,
the dissolution rate of the crosslinked positive pattern in an alkaline wet etchant is such that the crosslinked positive pattern exhibits an etching rate in excess of 2 nm/sec when etched with 2.38 wt % TMAH aqueous solution,
the organic solvent used in the reversal film-forming composition is selected from the group consisting of propylene glycol monomethyl ether acetate, cyclohexanone, ethyl lactate, propylene glycol monomethyl ether, and heptanone, and mixtures of two or more of the foregoing,
the resistance to organic solvent of the crosslinked positive pattern is such that the crosslinked positive pattern experiences a film slimming of up to 10 nm when contacted with the organic solvent for 30 seconds.

7. The process of claim 1 wherein said reversal film-forming composition comprises a resin comprising monomeric units of aromatic or alicyclic structure.

8. The process of claim 1, further comprising, between the step of coating a reversal film-forming composition on the positive pattern-bearing substrate to form a reversal film and the step of dissolving away the crosslinked positive pattern using an alkaline wet etchant, the step of removing the reversal film deposited on the crosslinked positive pattern until the positive pattern is exposed.

9. The process of claim 8 wherein the step of removing the reversal film deposited on the crosslinked positive pattern includes wet etching.

10. The process of claim 9 wherein
the reversal film is soluble in an alkaline wet etchant, but has a dissolution rate which is slower than that of the crosslinked positive pattern after the step of endowing the positive pattern with resistance to organic solvent,
the wet etching uses an alkaline wet etchant, and
the step of removing the reversal film deposited on the crosslinked positive pattern and the step of dissolving away the crosslinked positive pattern are concurrently carried out.

11. The process of claim 10 wherein the reversal film has a dissolution rate of 0.02 nm/sec to 2 nm/sec when etched with 2.38 wt % TMAH aqueous solution.

12. The process of claim 1 wherein said chemically amplified positive resist composition comprises a component capable of generating an acid in the step of heating for endowing the positive pattern with organic solvent resistance.

13. The process of claim 12 wherein the component capable of generating an acid is a thermal acid generator which is added to the resist composition in addition to the photoacid generator.

14. The process of claim 13 wherein the thermal acid generator has the general formula (P1a-2):

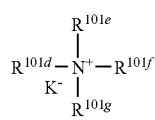
(P1a-2)

wherein K⁻ is a sulfonate having at least one α-position fluorinated, perfluoroalkylimidate or perfluoroalkylmethidate; $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

15. The process of claim 1 wherein in said chemically amplified positive resist composition, the resin comprises recurring units having a lactone ring and recurring units having an acid labile group which is eliminatable with acid.

16. The process of claim 1 wherein in said chemically amplified positive resist composition, the resin comprises an electrophilic partial structure which will form crosslinks in the resin of the positive resist pattern.

17. The process of claim 16 wherein in said chemically amplified positive resist composition, the resin comprises recurring units having a 7-oxanorbornane ring and recurring units having an acid labile group which is eliminatable with acid, and heat is applied in the step of illuminating the positive pattern to generate an acid whereby elimination of acid labile groups and crosslinking of the resin take place simultaneously in the positive pattern.

18. The process of claim 17 wherein the recurring units having a 7-oxanorbornane ring are recurring units (a) having the general formula (1):

(a)

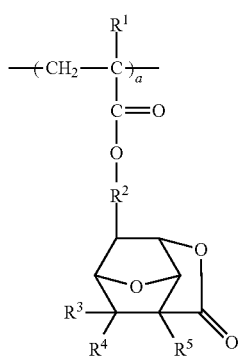
(1)

wherein $R^1$ is hydrogen or methyl, $R^2$ is a single bond or a straight, branched or cyclic $C_1$-$C_6$ alkylene group which may have an ether or ester radical, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: 0<a<1.0.

19. The process of claim 15 wherein the recurring units having an acid labile group which is eliminatable with acid are recurring units (b) having the general formula (2):

(b)

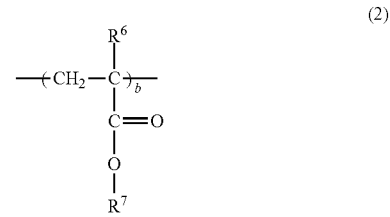
(2)

wherein $R^6$ is hydrogen or methyl, $R^7$ is an acid labile group, and b is a number in the range: 0<b≦0.8.

20. The process of claim 19 wherein the acid labile group of $R^7$ is an acid labile group of alicyclic structure which is eliminatable with acid.

21. The process of any one of claim 1 to 20 wherein the positive pattern comprises a dot pattern, and the pattern resulting from positive/negative reversal comprises a hole pattern.

22. The process of any one of claim 1 to 20 wherein the positive pattern comprises both a dense dot pattern and an isolated dot pattern, and the pattern resulting from positive/negative reversal comprises both a dense hole pattern and an isolated hole pattern.

23. The process of claim 22 wherein a dense dot pattern and an isolated dot pattern are formed as the positive pattern by exposure to a dense dot pattern and subsequent exposure to an unnecessary portion of the dot pattern, and a dense hole pattern and an isolated hole pattern are formed by positive/negative reversal therefrom.

24. A process for forming a pattern by way of positive/negative reversal, comprising the steps of:
coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, heating to remove the solvent to form a resist film,
coating a protective film-forming composition onto the resist film and drying to form a protective film,
exposing the resist film to high-energy radiation in a repeating dense pattern from a projection lens, by immersion lithography with water or a transparent liquid having a refractive index of at least 1 intervening between the resist film and the projection lens, further exposing a region of the dense pattern or unexposed area by immersion lithography, post-exposure baking for causing the acid generated by the acid generator upon exposure to act on the acid labile groups on the resin whereby the acid labile groups on the resin in the exposed area undergo elimination reaction, and developing the exposed resist film with an alkaline developer to form a positive pattern,
treating the positive pattern so as to eliminate the acid labile groups on the resin in the positive pattern resulting from the previous step, and to induce crosslinking in the resin to such an extent that the resin does not lose solubility in an alkaline wet etchant, for thereby endowing the positive pattern with resistance to an organic solvent to be used in a reversal film-forming composition, coating a reversal film-forming composition thereon to form a reversal film, and dissolving away the positive pattern using an alkaline wet etchant.

25. The process of claim 24 wherein said protective film-forming composition is based on a copolymer comprising amino-containing recurring units.

26. The process of claim 24 wherein said protective film-forming composition further comprises an amine compound.

27. The process of claim 1 or 24, further comprising the steps of forming a carbon film having a carbon content of at least 75% by weight on the processable substrate, forming a silicon-containing intermediate film thereon, and coating a resist composition for positive/negative reversal thereon, the reversal film being formed of a hydrocarbon-based material.

28. The process of claim 1 or 24, further comprising the steps of forming a carbon film having a carbon content of at least 75% by weight on the processable substrate, and coating a resist composition for positive/negative reversal thereon, the reversal film being formed of a silicon-containing material.

29. The process of claim 1 or 24, further comprising the steps of forming a carbon film having a carbon content of at least 75% by weight on the processable substrate, forming an organic antireflection film thereon, and coating a resist composition for positive/negative reversal thereon, the reversal film being formed of a silicon-containing material.

* * * * *